US006940885B1

(12) United States Patent
Cheng et al.

(10) Patent No.: US 6,940,885 B1
(45) Date of Patent: *Sep. 6, 2005

(54) SYSTEMS, METHODS, AND APPARATUSES FOR OPTICALLY PUMPED VERTICAL CAVITY SURFACE EMITTING LASER DEVICES

(75) Inventors: Julian Cheng, San Jose, CA (US); Chan-Long Shieh, Paradise Valley, AZ (US); M. V. Ramana Murty, Woodland Hills, CA (US); Hsing-Chung Lee, Calabasas, CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/231,592

(22) Filed: Aug. 30, 2002

Related U.S. Application Data

(60) Continuation-in-part of application No. 10/175,338, filed on Jun. 18, 2002, now Pat. No. 6,580,741, which is a division of application No. 09/430,570, filed on Oct. 29, 1999, now Pat. No. 6,424,669.

(51) Int. Cl.[7] .......................... H01S 5/00; H01S 3/094
(52) U.S. Cl. ........................................ 372/50; 372/75
(58) Field of Search ............................ 372/43–50, 96, 372/75, 26, 99

(56) References Cited

U.S. PATENT DOCUMENTS

| 3,949,320 A | 4/1976 | Castleberry et al. |
|---|---|---|
| 4,633,476 A | 12/1986 | Scifres et al. |
| 4,878,104 A | 10/1989 | Reed et al. |
| 4,901,330 A | 2/1990 | Wolfram et al. |
| 5,008,717 A | 4/1991 | Bar-Joseph et al. |
| 5,023,879 A | 6/1991 | Wang et al. |
| 5,163,058 A | 11/1992 | Farries et al. |
| 5,165,065 A | 11/1992 | Reed et al. |
| 5,216,687 A | 6/1993 | Fujino et al. |
| 5,231,642 A | 7/1993 | Scifres et al. |
| 5,291,502 A | 3/1994 | Pezeshki et al. |
| 5,351,256 A | 9/1994 | Schneider et al. |
| 5,414,726 A | 5/1995 | Raj et al. |
| 5,461,637 A | 10/1995 | Mooradian et al. |
| 5,485,014 A | 1/1996 | Jain et al. |

(Continued)

FOREIGN PATENT DOCUMENTS

DE     4444 470 A1     11/1994

OTHER PUBLICATIONS

Joseph T. Verdeyen; Laser Electronics, Third Edition; pp. 347–351, 517–534; 1981; Prentice–Hall, Inc. New Jersey.

Eli Kapon; Semiconductor Laser II, Materials and Structures; pp. 164–179; Institure of Micro and Optoelectronics Department of Physics Swiss Federal Institute of Technology, Lausanne; Academic Press; 1999.

(Continued)

*Primary Examiner*—Minsun Oh Harvey
*Assistant Examiner*—James Menefee
(74) *Attorney, Agent, or Firm*—Allen, Dyer, Doppelt, Milbrath & Gilchrist, P.A.

(57) ABSTRACT

Monolithic integrated vertical-cavity surface-emitting laser devices are disclosed including an edge-emitting semiconductor pump laser (PL), an optically-pumped vertical-cavity surface-emitting laser (VCSEL), and a means for deflecting and shaping the output beam of the pump laser to optically excite the VCSEL. The optically-pumped VCSEL structure may be adapted to include a resonant cavity with multiple fixed wavelengths, or a resonance cavity whose wavelength is continuously tunable. Wafer level manufacturing techniques are also disclosed.

30 Claims, 36 Drawing Sheets

U.S. PATENT DOCUMENTS

| | | |
|---|---|---|
| 5,504,772 A | 4/1996 | Deacon et al. |
| 5,513,204 A | 4/1996 | Jayaraman |
| 5,536,085 A | 7/1996 | Li et al. |
| 5,623,359 A | 4/1997 | Giles et al. |
| 5,625,635 A | 4/1997 | Kurtz et al. |
| 5,627,853 A | 5/1997 | Mooradian et al. |
| 5,671,243 A | 9/1997 | Yap |
| 5,680,411 A | 10/1997 | Ramdane et al. |
| 5,754,578 A | 5/1998 | Jayaraman |
| 5,778,015 A | 7/1998 | Gunning et al. |
| 5,793,787 A | 8/1998 | Meyer et al. |
| 5,796,771 A | 8/1998 | DenBaars et al. |
| 5,835,517 A | 11/1998 | Jayaraman et al. |
| 5,841,799 A | 11/1998 | Hiroki |
| 5,914,976 A | 6/1999 | Jayaraman et al. |
| 5,963,576 A | 10/1999 | Claisse et al. |
| 5,966,234 A | 10/1999 | Ford et al. |
| 5,976,905 A | 11/1999 | Cockerill et al. |
| 5,985,686 A | 11/1999 | Jayaraman |
| 6,026,108 A | 2/2000 | Lim et al. |
| 6,054,335 A | 4/2000 | Sun et al. |
| 6,066,859 A | 5/2000 | Stegmueller |
| 6,097,742 A | 8/2000 | Caprara et al. |
| 6,104,739 A | 8/2000 | Hong et al. |
| 6,127,200 A | 10/2000 | Ohiso et al. |
| 6,167,068 A | 12/2000 | Caprara et al. |
| 6,195,381 B1 | 2/2001 | Botez et al. |
| 6,252,896 B1 | 6/2001 | Tan et al. |
| 6,285,704 B1 | 9/2001 | Kullander-Sjoberg |
| 6,339,607 B1 | 1/2002 | Jiang et al. |
| 6,347,108 B2 | 2/2002 | Jiang et al. |
| 6,424,669 B1 | 7/2002 | Jiang et al. |
| 6,553,048 B2 * | 4/2003 | Jiang et al. ............ 372/50 |
| 6,556,610 B1 * | 4/2003 | Jiang et al. ............ 372/75 |
| 6,580,741 B2 * | 6/2003 | Jiang et al. ............ 372/50 |

OTHER PUBLICATIONS

Semiconductor Lasers II, Material & Structures, Surface Emitting Lasers, Academic Press San Diego, CA, 1999, Eli Kapon, Optics & Photonics, Basics Of Vertical Cavity Surface–Emitting Lasers, Chapter 5, pp. 328–329.

Surface–emitting GaAs/AlGaAs multi–quantum well lasers with optical bistability, Yusa et al, W06, Conference on Lasers & Electro–Optics, Anaheim, CA, Apr. 27, 1988, pp. 258–259.

Surface–emitting lase diode with bent double heterostructure, Wu et al, WG4, Conference on Lasers & Electro–Optics, Anaheim CA, Apr. 28, 1988, pp. 134–136.

High Power cw Monolithic 2–D arrays of surface–emitting lasers, Nam et al, CWN8, Conference on Lasers & Electro–Optics, Anaheim, CA, May 13, 1992, pp. 346–347.

Introduction to Lasers and their application, Addison–Wesley Series in Physics, Donald C. O'Shea, Dec. 1998, pp. 62–69 & 217–241.

Millimeter–wave asymmetric fabry–perot modulators, Barron et al, IEEE Journal of quantum Electronics, vol. 31, No. 8, Aug. 1995, pp. 155–164.

Understanding fiber optics, Jeff Hecht, Fiberoptic Product News, Lasers & Applications, Howard W. Sams & Company, pp. 116–123.

The Electical Engineering Handbook, R. Dorf, University of CA, Davis, CRC Press, 1993, pp. 1417–1427.

* cited by examiner

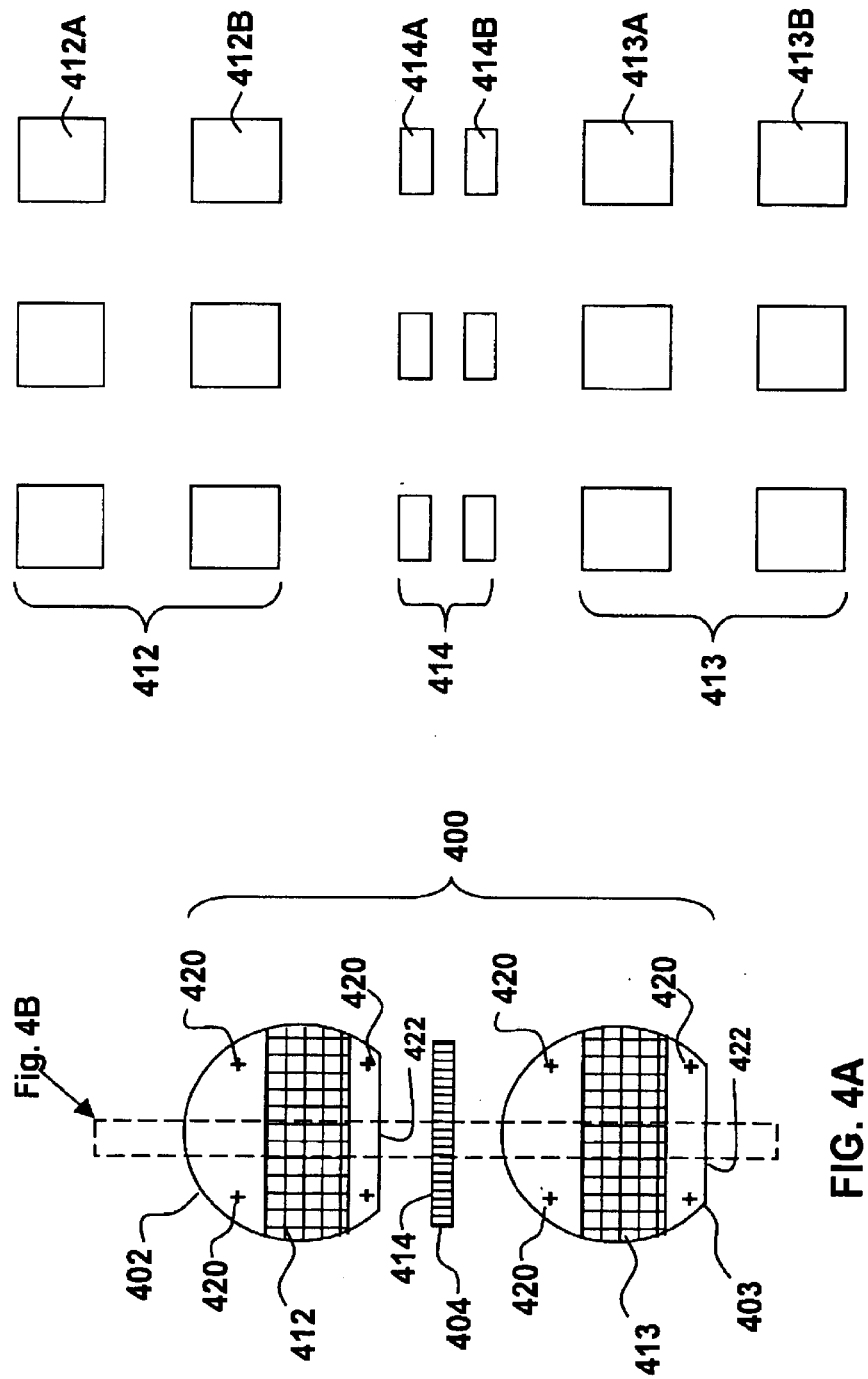
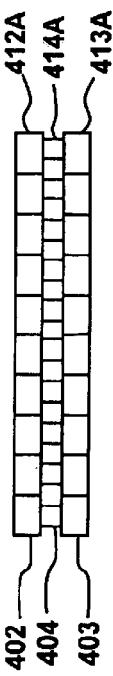

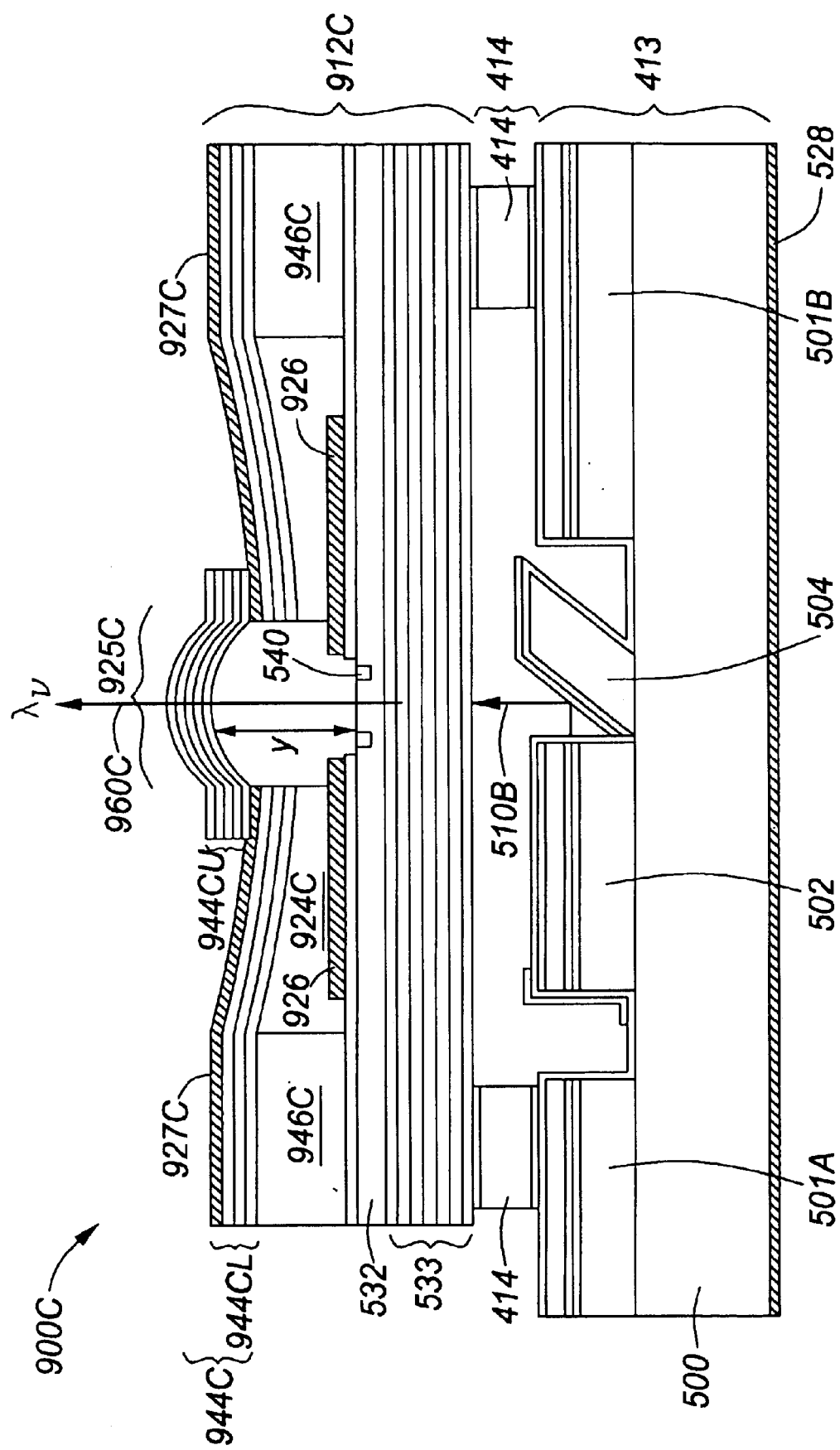

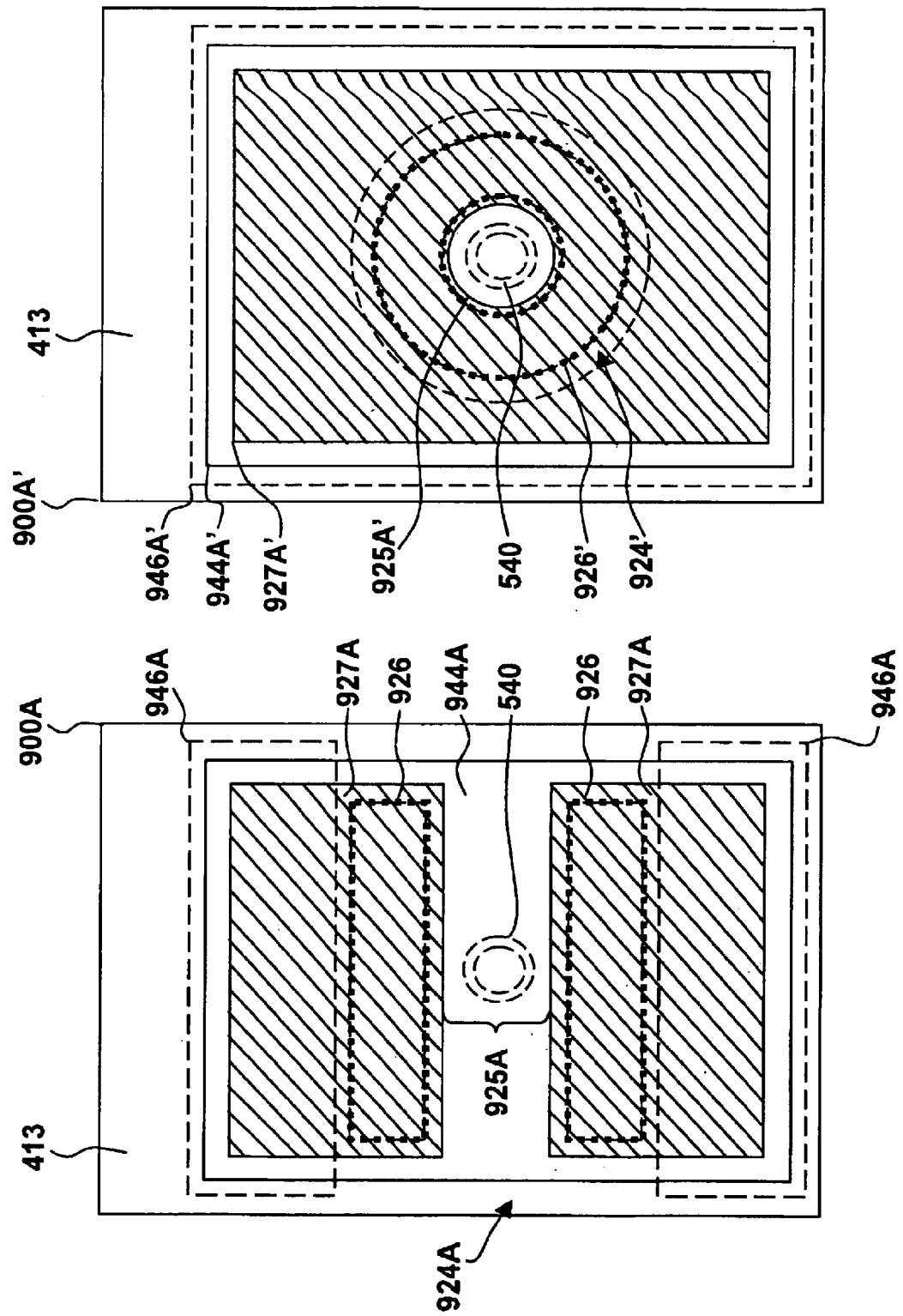

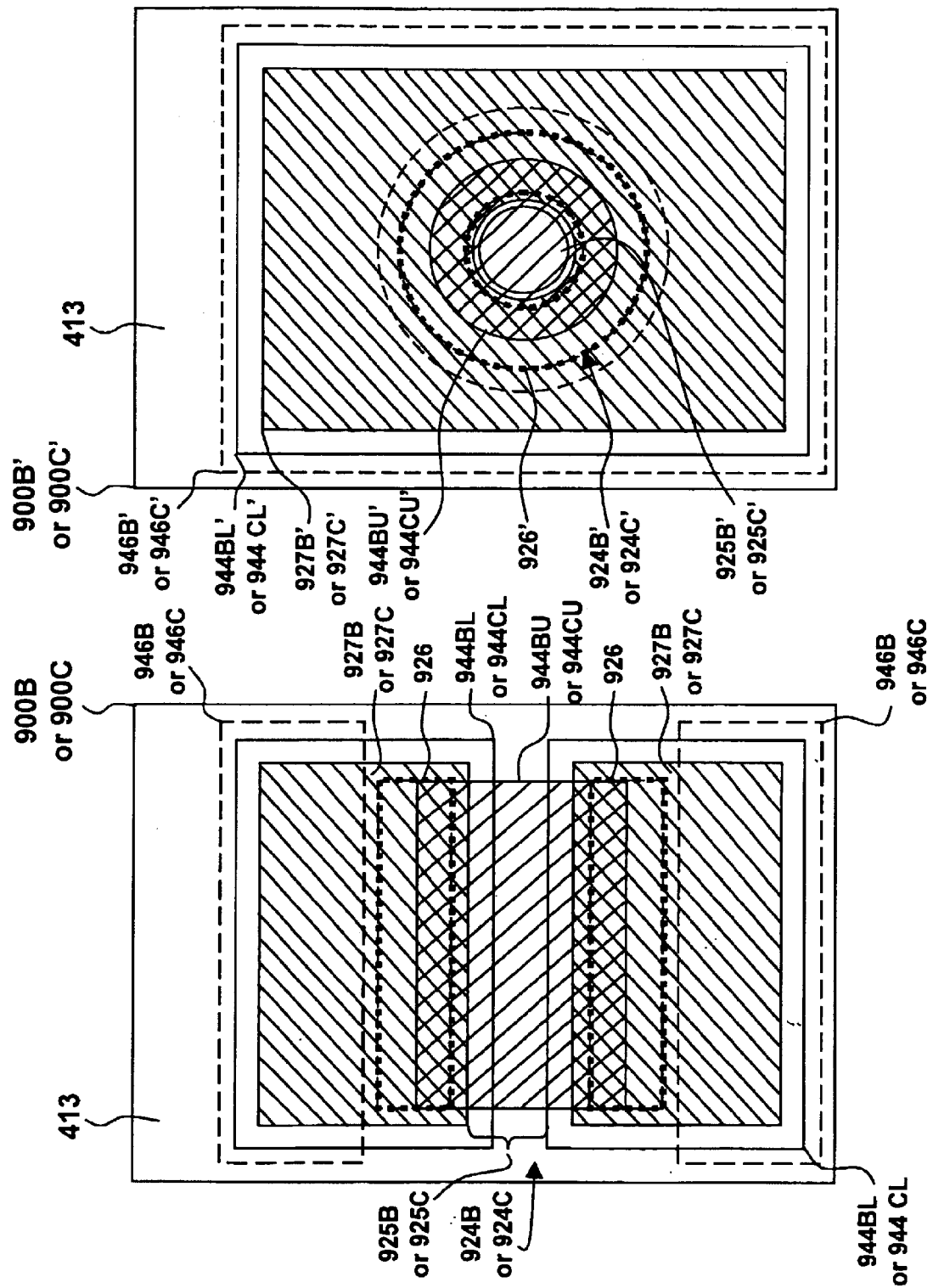

SYSTEMS, METHODS, AND APPARATUSES FOR OPTICALLY PUMPED VERTICAL CAVITY SURFACE EMITTING LASER DEVICES

CROSS REFERENCE TO RELATED APPLICATIONS

This application is a continuation-in-part application and claims the benefit of U.S. application Ser. No. 10/175,338, filed Jun. 18, 2002 by inventors Wenbin Jiang et al, now U.S. Pat. No. 6,580,741, which is a divisional of U.S. application Ser. No. 09/430,570, filed Oct. 29, 1999 by inventors Wenbin Jiang et al, now issued as U.S. Pat. No. 6,424,669, all of which are to be assigned to E20 Communications, Inc.

FIELD OF THE INVENTION

The invention relates generally to semiconductor lasers. More particularly, the invention relates to vertical cavity surface emitting lasers.

BACKGROUND OF THE INVENTION

Semiconductor lasers have become more important. One of the most important applications of semiconductor lasers is in communication systems where fiber optic communication media is employed. With growth in electronic communication, communication speed has become more important in order to increase data bandwidth in electronic communication systems. Improved semiconductor lasers can play a vital roll in increasing data bandwidth in communication systems using fiber optic communication media such as local area networks (LANs), metropolitan area networks (MANs) and wide area networks (WANs). A preferred for optical interconnection of electronic components and systems via optical fibers is a semiconductor laser.

One type of well known semiconductor laser is a vertical cavity surface emitting laser (VCSEL). The current state of design and operation of VCSELs is well known. Due to optical properties of optical fibers, photons emitted at longer wavelengths from a laser tend to propagate longer distances and are less disturbed by optical noise sources. Thus, forming a VCSEL that can operate at longer wavelengths, such as a wavelength greater than 1.25 $\mu$m, is desirable.

Lasers can be excited or pumped in a number of ways. Typically, VCSELs have been electrically excited (i.e. electrically pumped) by a power supply in order to stimulate photon emission. However, achieving photon emission at long wavelengths using electrical pumping has not been commercially successful due to a number of disadvantages. More recently it has been shown that a VCSEL can be optically excited (i.e. optically pumped) to stimulate photon emission.

BRIEF SUMMARY OF THE INVENTION

Briefly, the invention includes methods, apparatus and systems as described in the claims.

BRIEF DESCRIPTIONS OF THE DRAWINGS

FIGS. 4A–4C illustrate the manufacture and assembly of a pair of semiconductor wafers to form a plurality of monolithic integrated optically pumped LW-VCSELs.

Figure 7A:
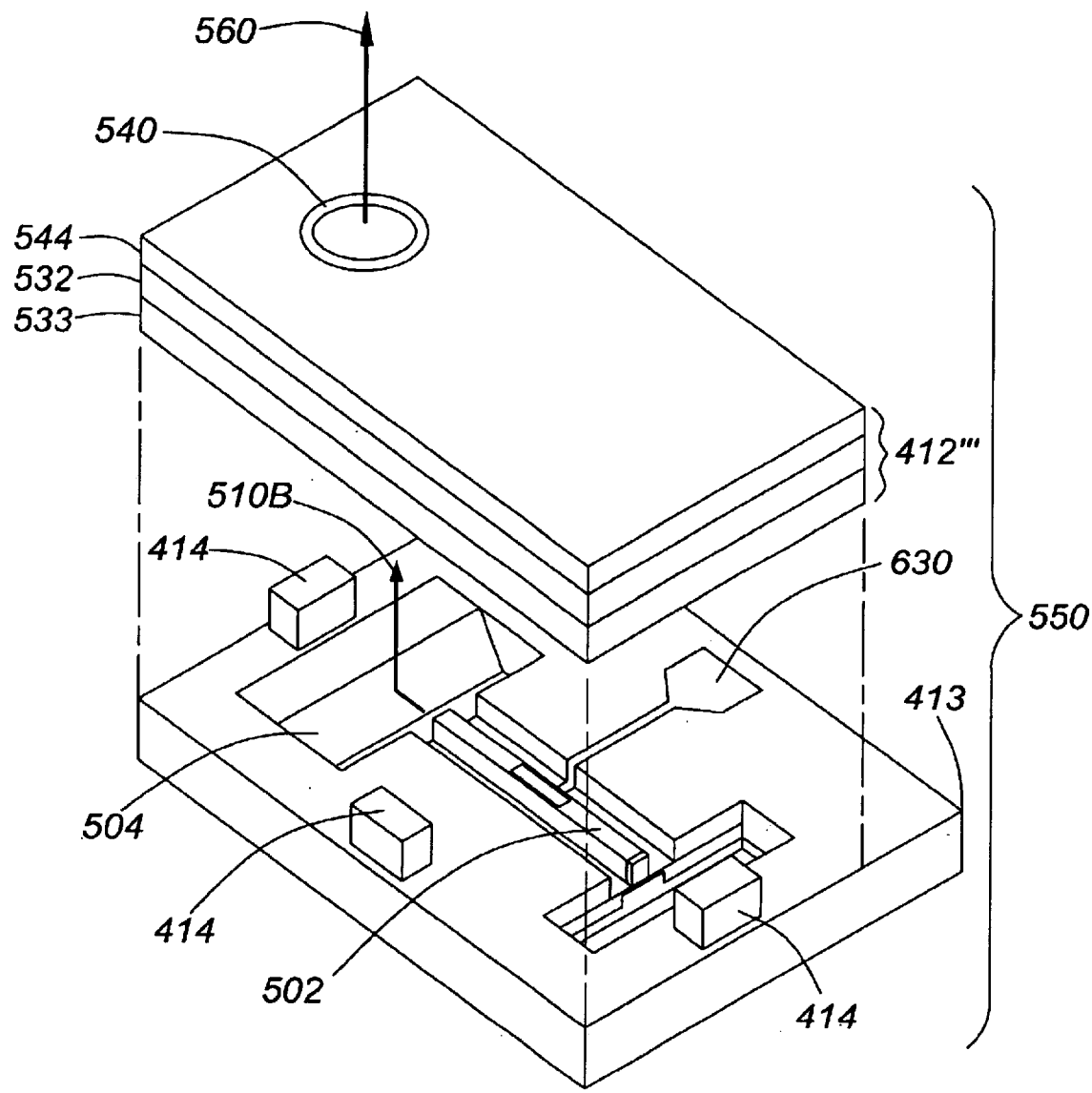
Figure 7B:
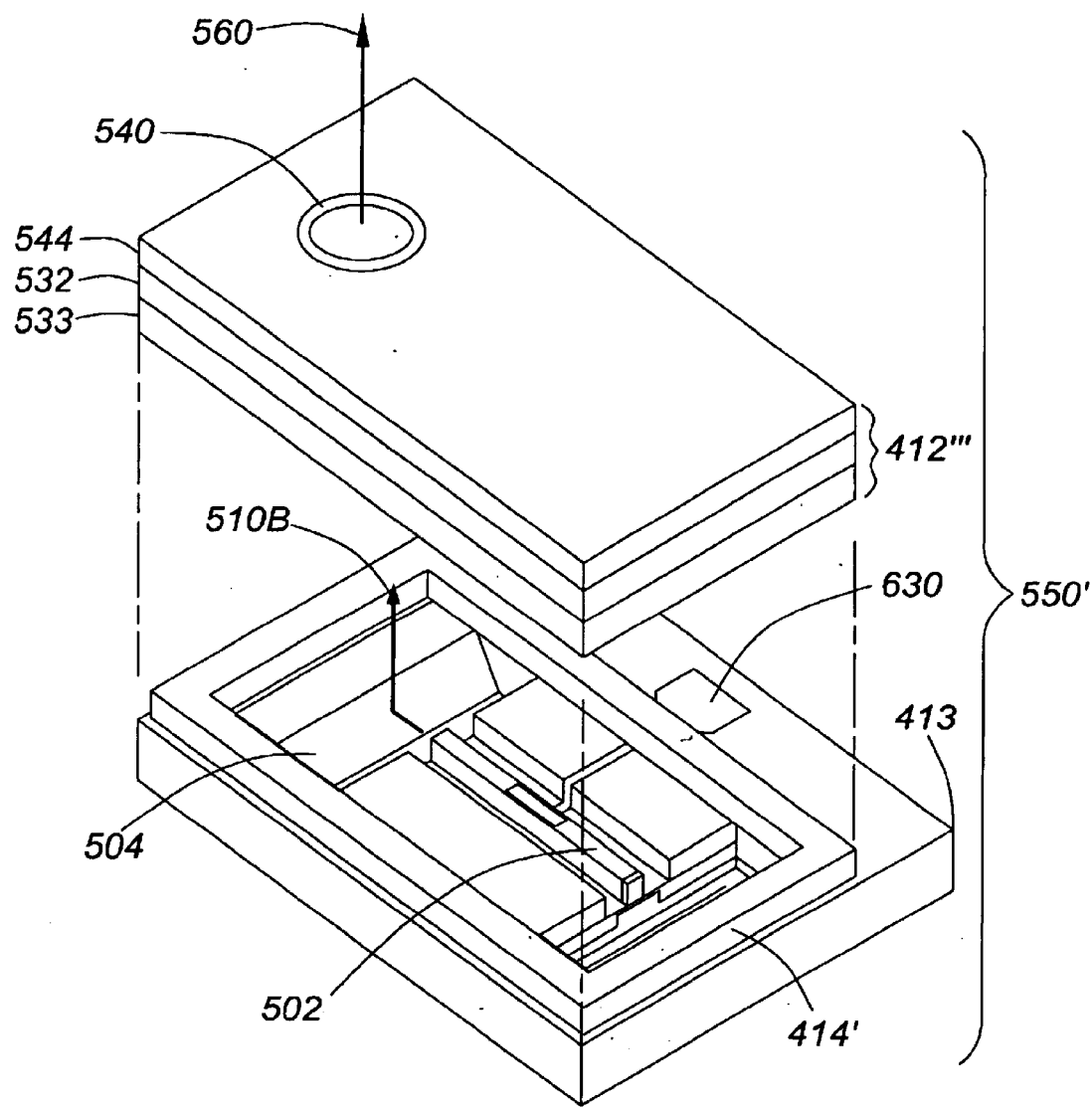

FIGS. 7A–7B illustrated alternate embodiments of the interconnect layer for the assembly of the pair of semiconductor wafers to form the plurality of monolithic integrated optically pumped LW-VCSELs.

Figure 8A:
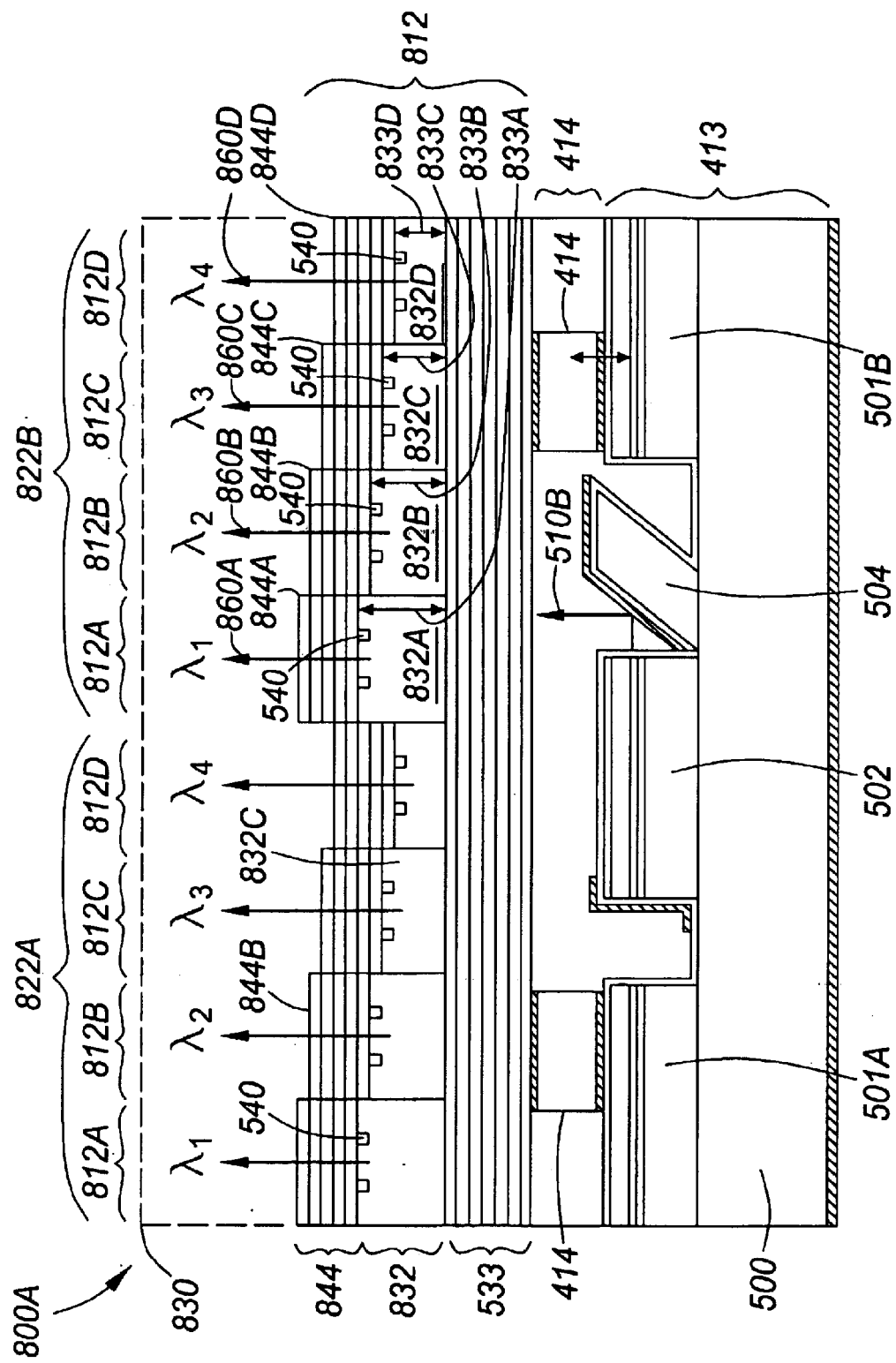

FIG. 8A is magnified cross sectional view of an embodiment of a multiple wavelength optically pumped VCSEL array.

Figure 8B:
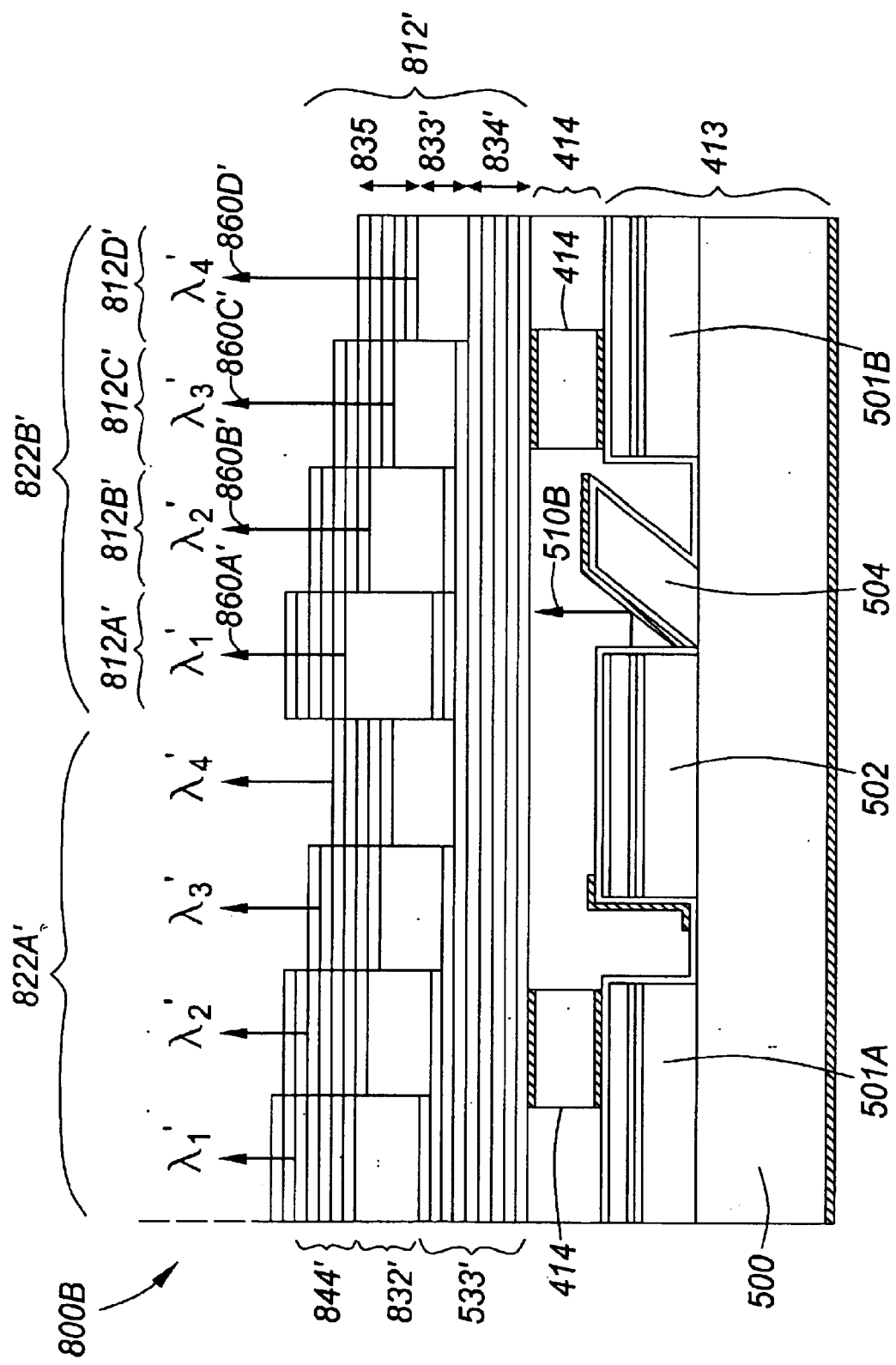

FIG. 8B is magnified cross sectional view of another embodiment of a multiple wavelength optically pumped VCSEL array.

Figure 9A:
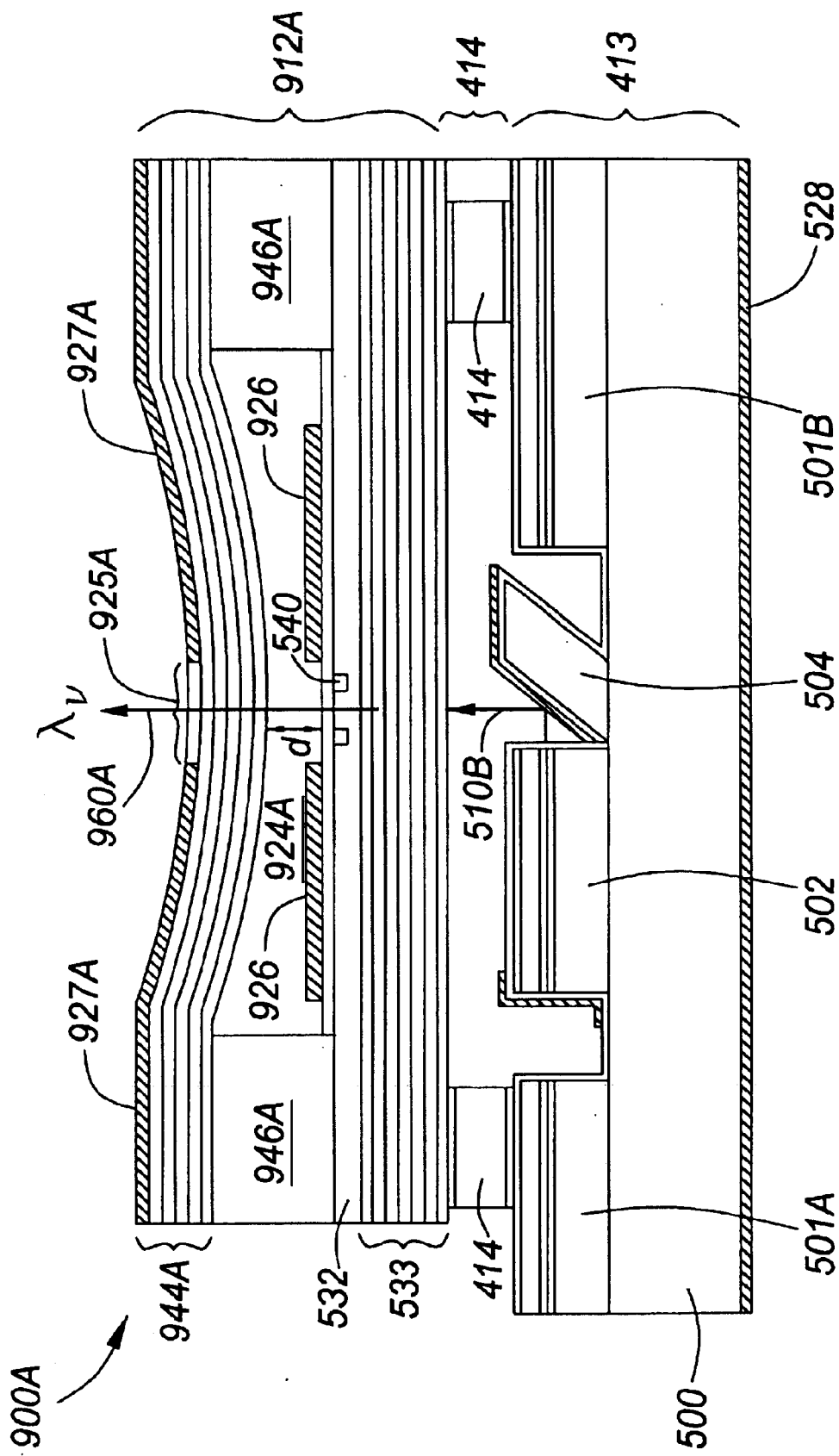
Figure 9B:
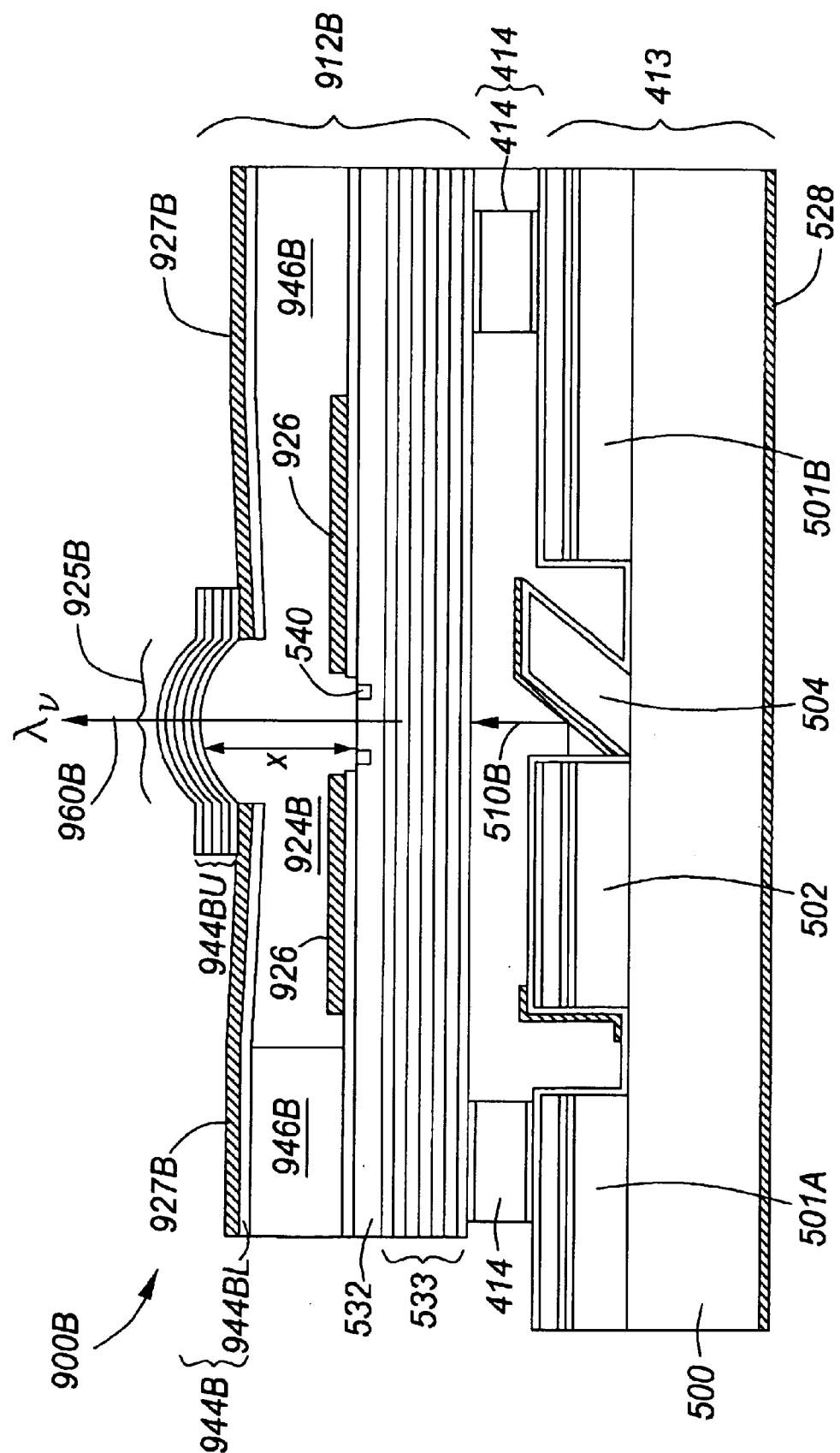

FIGS. 9A–9C are alternate embodiments of wavelength tunable monolithic optically pumped long wavelength VCSELs using an edge emitting laser as a pump laser.

FIGS. 9D and 9E are top views of alternate embodiments of the wavelength tunable monolithic optically pumped long wavelength VCSEL of FIG. 9A.

Figure 9F:
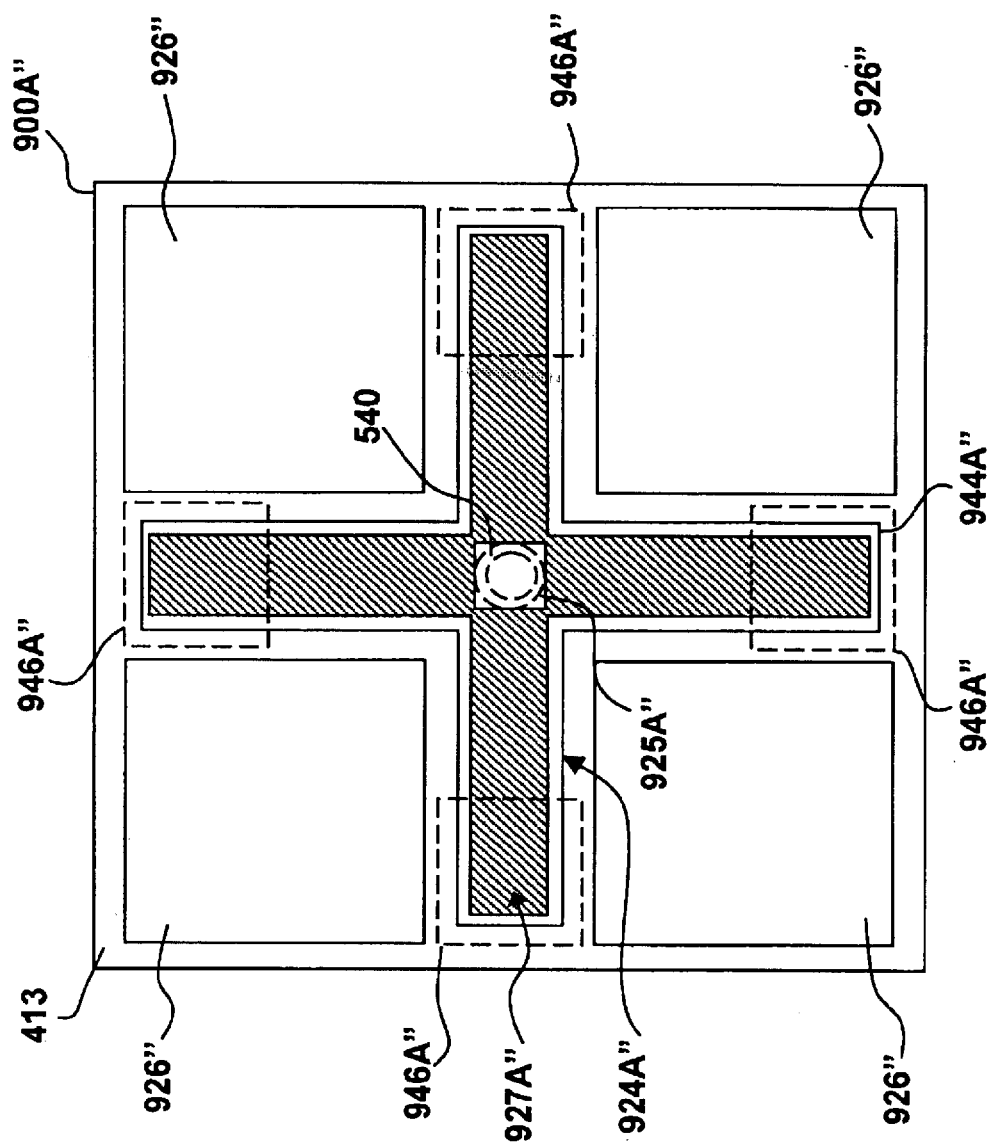

FIGS. 9F and 9G are top views of alternate embodiments of the wavelength tunable monolithic optically pumped long wavelength VCSELs of FIGS. 9B and 9C.

Figure 10:
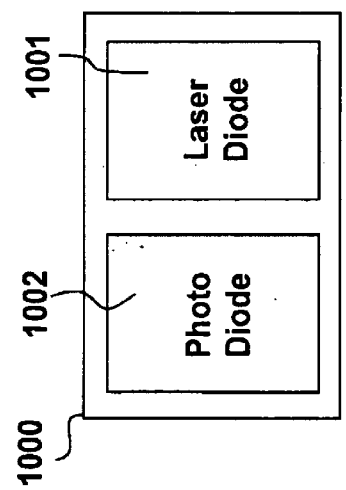

FIG. 10 illustrates a substrate including a laser diode of the invention and a photo diode as another embodiment of the invention.

Figure 11A:
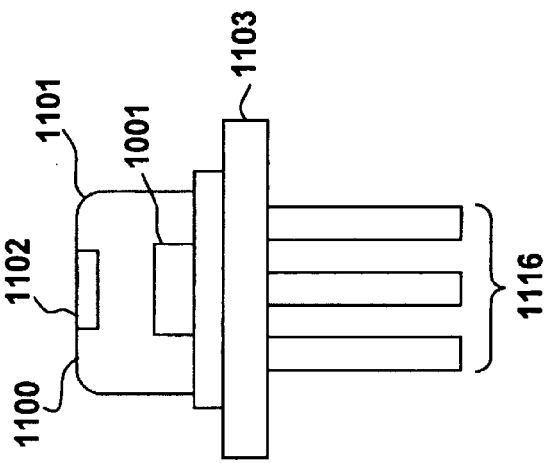

FIG. 11A illustrates a cross sectional view of a packaged laser diode transmitter including the laser diode of the invention as another embodiment of the invention.

Figure 11B:
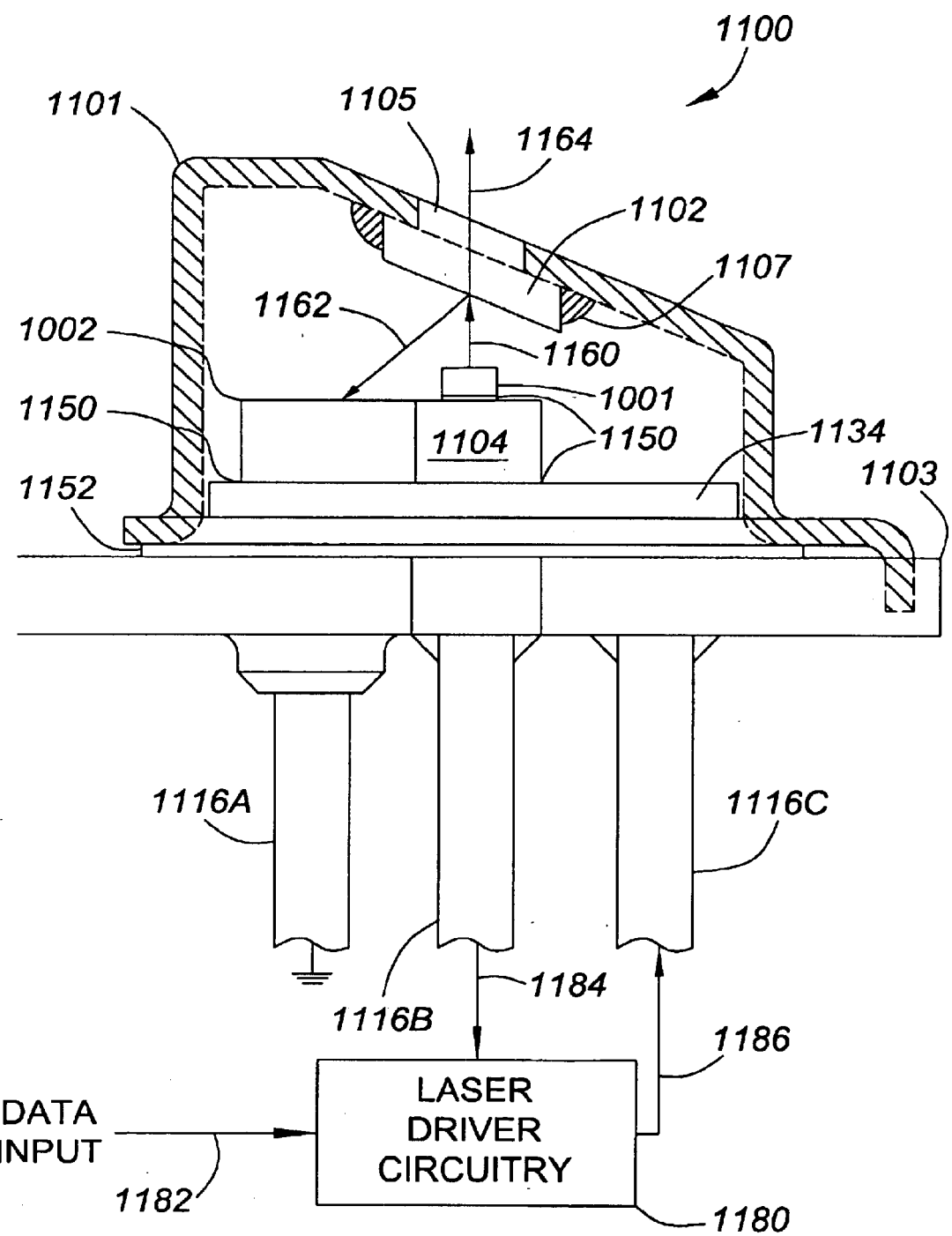

FIG. 11B is a magnified cross-sectional view and ray diagram illustration of automatic power control of a surface emitting semiconductor laser in response to power monitoring by a photodiode.

Figure 11C:
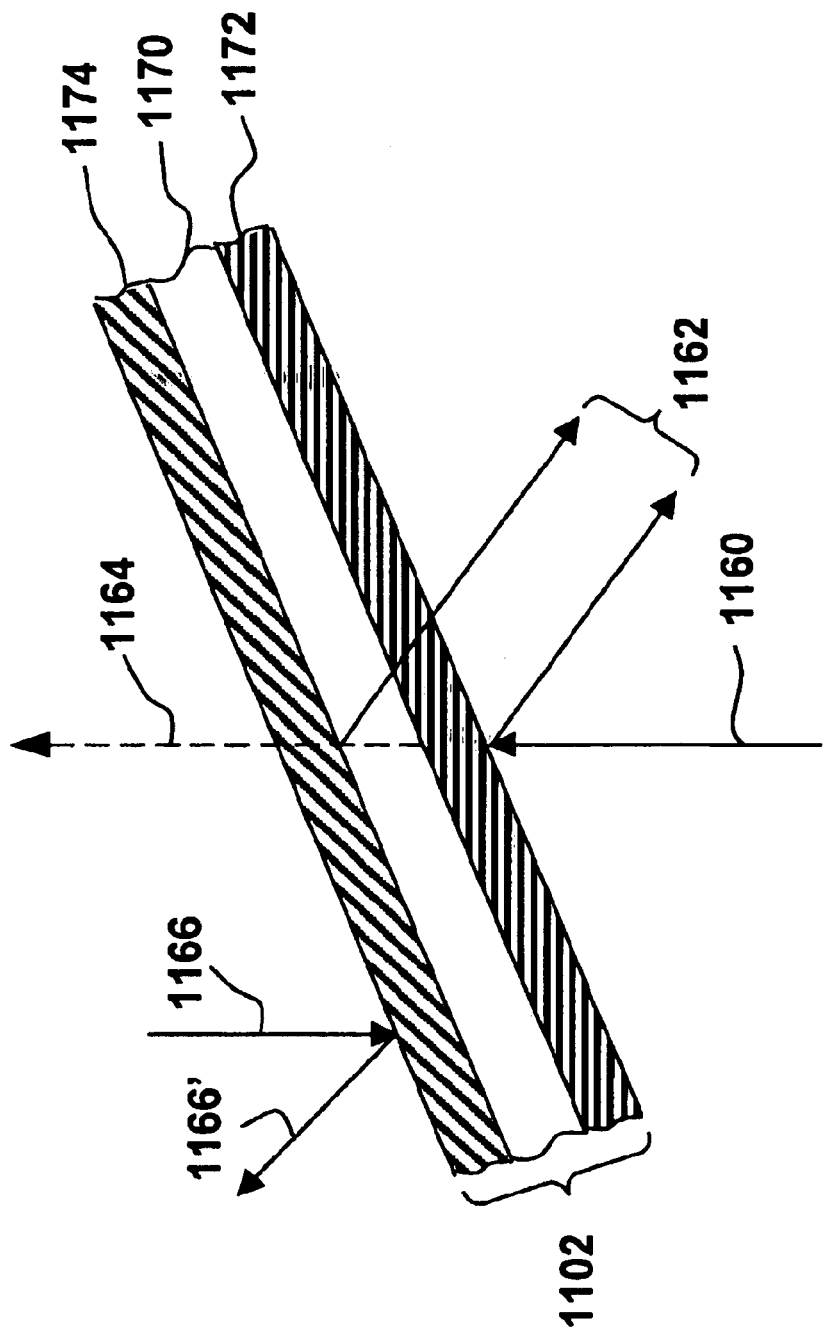
Figure 11D:
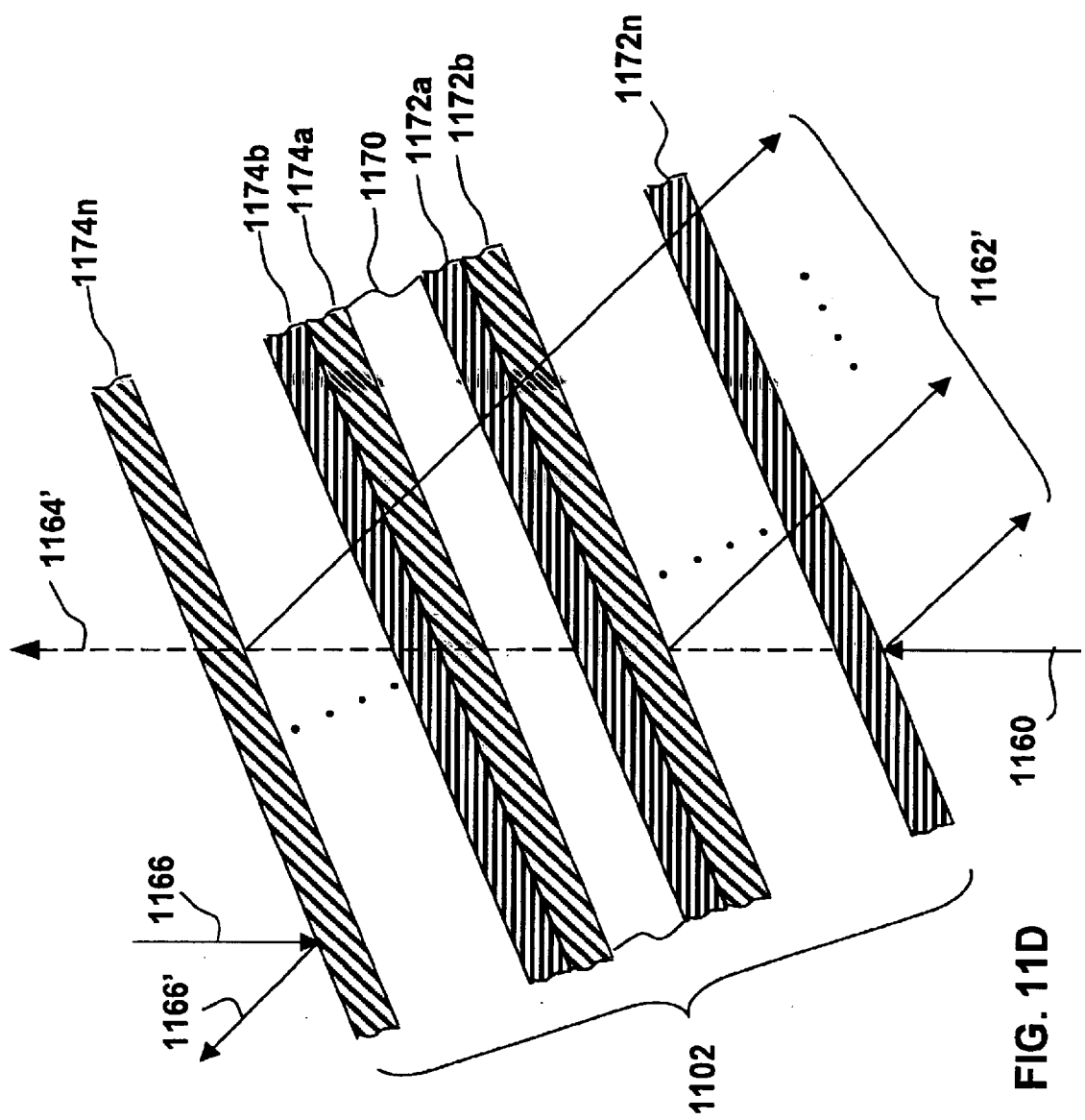

FIGS. 11C–11D illustrate alternate embodiments of the material layers of the window of the slanted can or cap.

Figure 12:
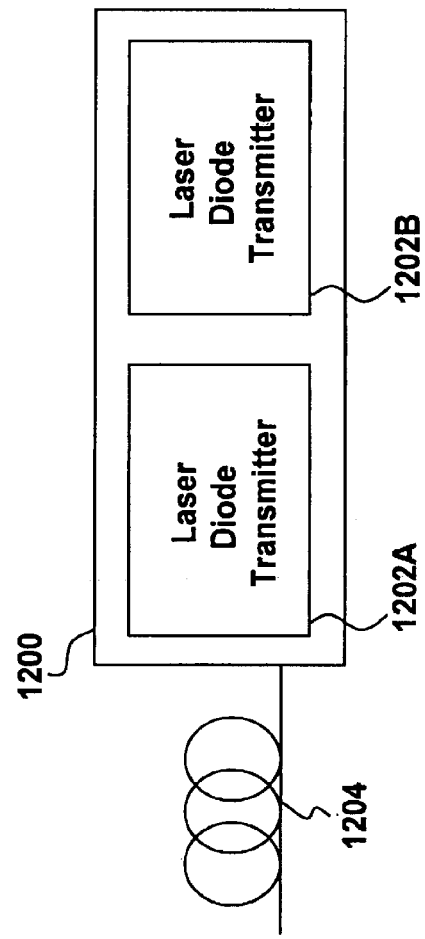

FIG. 12 illustrates an optoelectronic module incorporating the laser diode as another embodiment of the invention.

Figure 13:
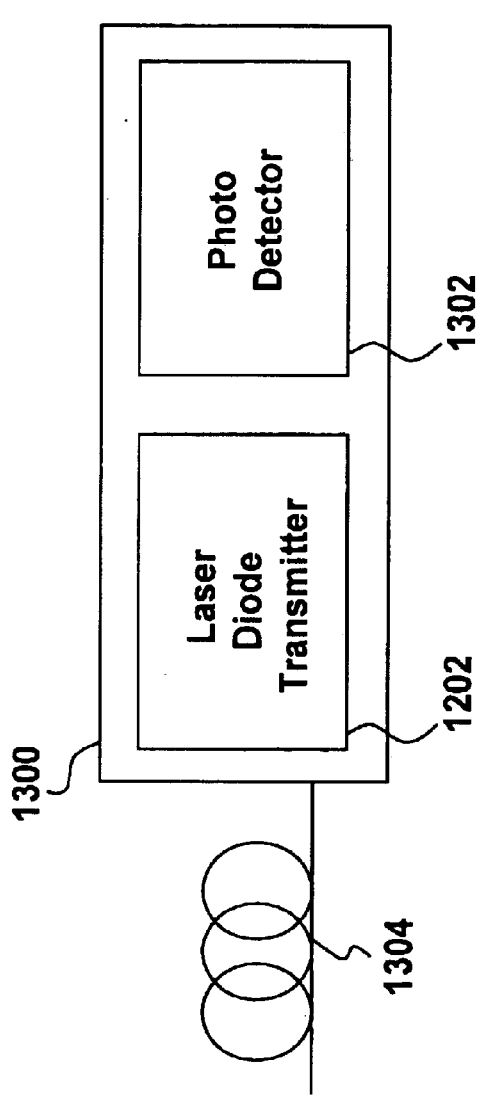

FIG. 13 illustrates another optoelectronic module incorporating the laser diode as another embodiment of the invention.

Figure 14:
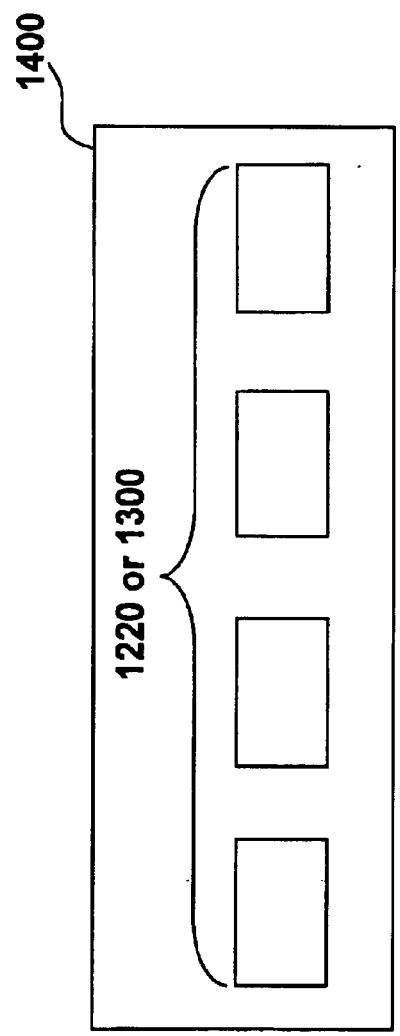

FIG. 14 illustrates a block diagram of an optoelectronic system employing the laser diode as another embodiment of the invention.

Figure 15A:
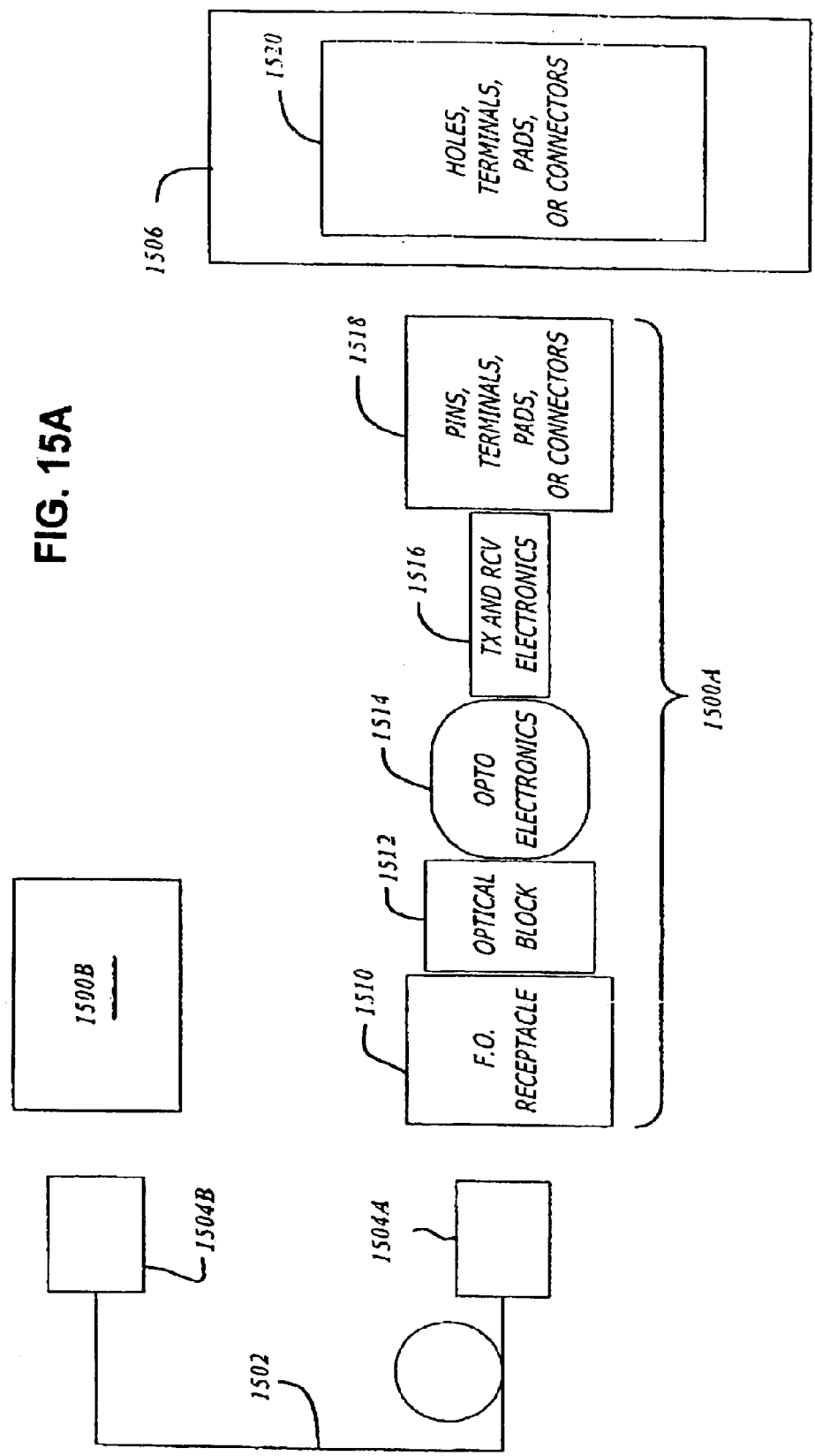

FIG. 15A is a block diagram of a typical optical data link.

Figure 15B:
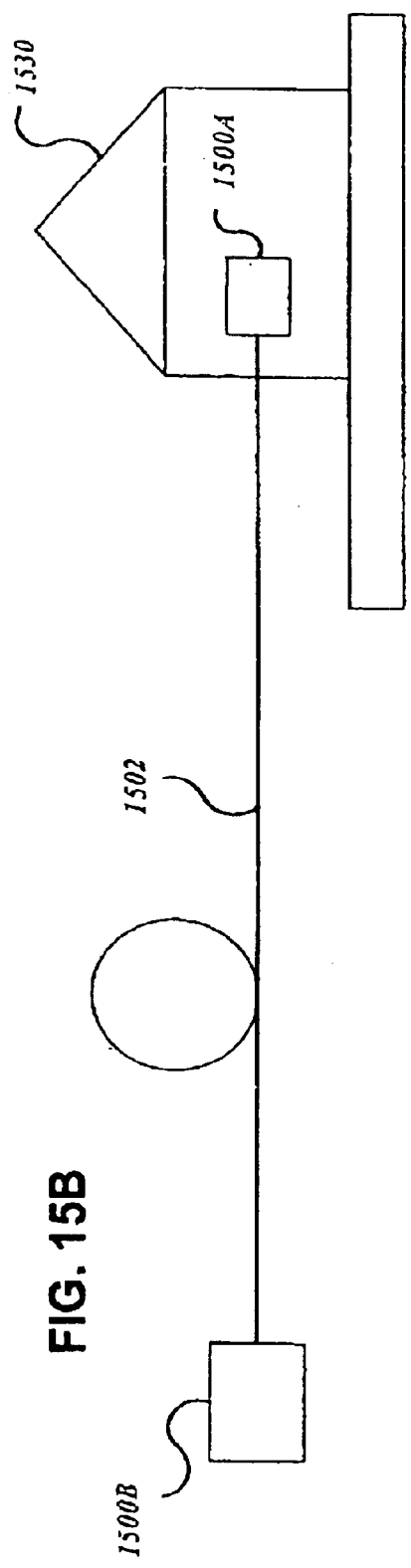

FIG. 15B is a diagram of a typical fiber to the home system.

Figure 15C:
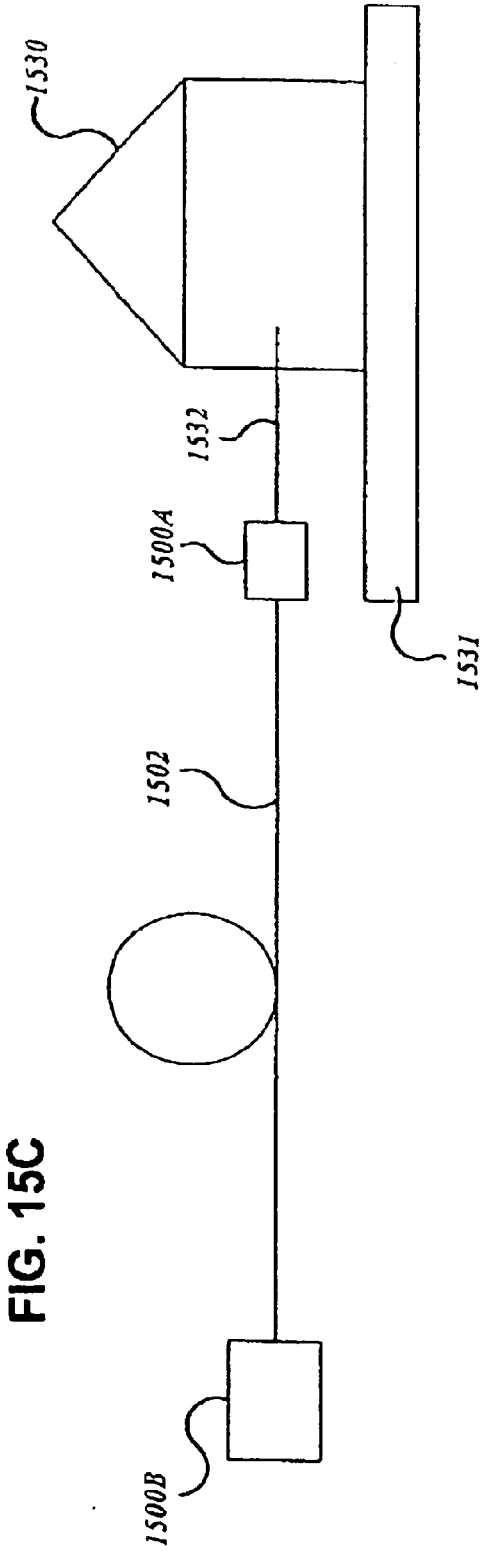

FIG. 15C is a diagram of a typical fiber to the curb system.

DETAILED DESCRIPTION OF THE PREFERRED EMBODIMENT

In the following detailed description of the invention, numerous specific details are set forth in order to provide a thorough understanding of the invention. However, it will be obvious to one skilled in the art that the invention may be practiced without these specific details. In other instances well known methods, procedures, components, and circuits have not been described in detail so as not to unnecessarily obscure aspects of the invention.

For operation at high frequencies, an optically pumped long wavelength vertical cavity surface emitting laser (VCSEL) seems to be the preferable type of semiconductor laser. A VCSEL that is optically pumped need not be doped to lase. Therefore an optically pumped VCSEL need not have its high frequency operation limited by parasitic capacitance and inductance caused by dopants and metal contact pads that would otherwise have been added. The only high frequency limits of an optically pumped VCSEL would be as a result of its intrinsic carrier dynamics, including the transport time and thermionic emission. The high frequency limits due to intrinsic carrier transport time and thermionic emission do not usually take effect until modulation frequencies of twenty giga-Hertz (20 GHz) or more are reached. Furthermore, VCSEL emission frequency is strongly confined by its high cavity-Q and cavity resonance, and thus laser modulation chirping is not as pronounced as an electrically pumped conventional in-plane semiconductor laser. Therefore, an optically pumped VCSEL has greater commercial potential for operation at high frequencies of modulation.

VCSELs have become the dominant light source for optical transmitters used in short-reach local area network (LAN) and storage area network (SAN) applications, in which a multi-mode optical fiber is used for data transmission. VCSELs are low-cost micro-cavity devices with high speed, low drive current and low power dissipation, with desirable beam properties that significantly simplify their optical packaging and testing. In order to extend the application of VCSELs to optical networks with a longer reach, e.g., in Metropolitan Area Networks (MAN) that are based on single-mode fibers, a long wavelength (LW) VCSEL is needed that can emit sufficiently high single-mode output power in the 1.3 micro-meter ($\mu$m) to 1.5 $\mu$m wavelength range.

The simultaneous requirement of high power and single-mode lasing operation creates an inherent contradiction in the VCSEL design. Whereas high power requires a large effective gain volume, single mode operation mandates a smaller active area that is typically less than 5 $\mu$m in cross section. This contradiction may be resolved by increasing the longitudinal extent of the gain volume while restricting its lateral area. However, in practice this approach is limited by the diffusion lengths of the injected electrical carriers, which limit the thickness of the gain volume. This, along with the stronger temperature dependence of the lasing mode and the gain peak at longer wavelengths, has effectively limited the maximum single-mode output power of a long wavelength vertical cavity surface emitting laser (LW-VCSEL) to 1 milliwatts (mW) or less before the onset of thermal roll-over.

Optically pumping the VCSEL removes the carrier diffusion limit of electrical injection, allowing a larger number of quantum wells to be optically excited, thereby affording a larger gain volume and a higher net gain (resonant periodic gain) that results in a larger single-mode output power. The output of the optically-pumped VCSEL thus increases with the optical power that is available from the pump beam (the injection level), which is substantially increased by the use of an edge-emitting pump laser instead of another VCSEL pump). Moreover the optical output of the optically pumped VCSEL can be further improved by increasing the lateral cross-section of the gain region while preserving single-mode lasing operation by means of mode selection measures (mode control) that preferentially select the gain of one mode, or alternatively suppress the gain of the others.

Disclosed is a semiconductor laser, a long-wavelength VCSEL, which monolithically integrates an optically pumped long-wavelength VCSEL with an efficient pump laser. The efficient pump laser emits at a shorter wavelength in a stable and compact manner. The resultant semiconductor laser may also be referred to as a monolithic optically pumped VCSEL.

A simple integration means is disclosed in which a pump laser wafer and a long wavelength VCSEL wafer, each processed completely at the wafer-scale, are bonded together by solder. Additional optical means may be integrated to provide mode selection and beam deflection. The integration means can also be expanded to provide VCSELs operating at different wavelengths, including but not limited to the popular 1.31 $\mu$m to 1.55 $\mu$m regime. Disclosed is also how the integration means can be modified to achieve a multiple wavelength VCSEL array and a wavelength tunable VCSEL. Also disclosed is a means for achieving mode selection and mode control in the monolithic optically pumped VCSEL and a monolithic means to achieve beam routing.

An electrically pumped folded-cavity surface emitting laser may also be used as a pump laser. The FCSEL is preferably designed to operate at relatively short wavelengths (from 770 nanometers (nm) to 1100 nanometers (nm)) with an optically pumped long-wavelength VCSEL designed to operate preferably at relatively long wavelengths (from 1250 nm to 1700 nm). The optically pumped VCSEL operates without the use of electric power by being optically pumped by the electrically pumped FCSEL. Integration of the lasers depends upon the type of semiconductor materials utilized in forming the two lasers. The two lasers are integrated into one unit through semiconductor processing methods such as monolithic epitaxial growth or by joining outer layers of the two lasers together through atomic bonding, wafer bonding, metal bonding, epoxy glue or other well known semiconductor bonding techniques. Additionally, the optically pumped VCSEL can be bonded to the FCSEL at an angle in order to avoid reflected light from the long wavelength VCSEL being directly returned to the in-plane laser to thereby avoiding optical noise being fed back into the FCSEL. A third laser can also be used to generate a small spot pump beam to couple to the optically pumped VCSEL in order to gain guide photons to emit at a single mode transversely. Although the electrically pumped FCSEL, also referred to as the pump laser, can be multimode either longitudinally or transversely, the output from the optically pumped VCSEL is single mode longitudinally. The output from the optically pumped VCSEL can be single mode transversely depending upon the geometric integration scheme and patterning. It is preferred that the optically pumped VCSEL operate in a single transverse mode to optimally couple with a single mode fiber. Modulation of the optically pumped VCSEL can be achieved through direct electrical modulation of the pump laser or an electric-absorption modulator.

Figure 1:
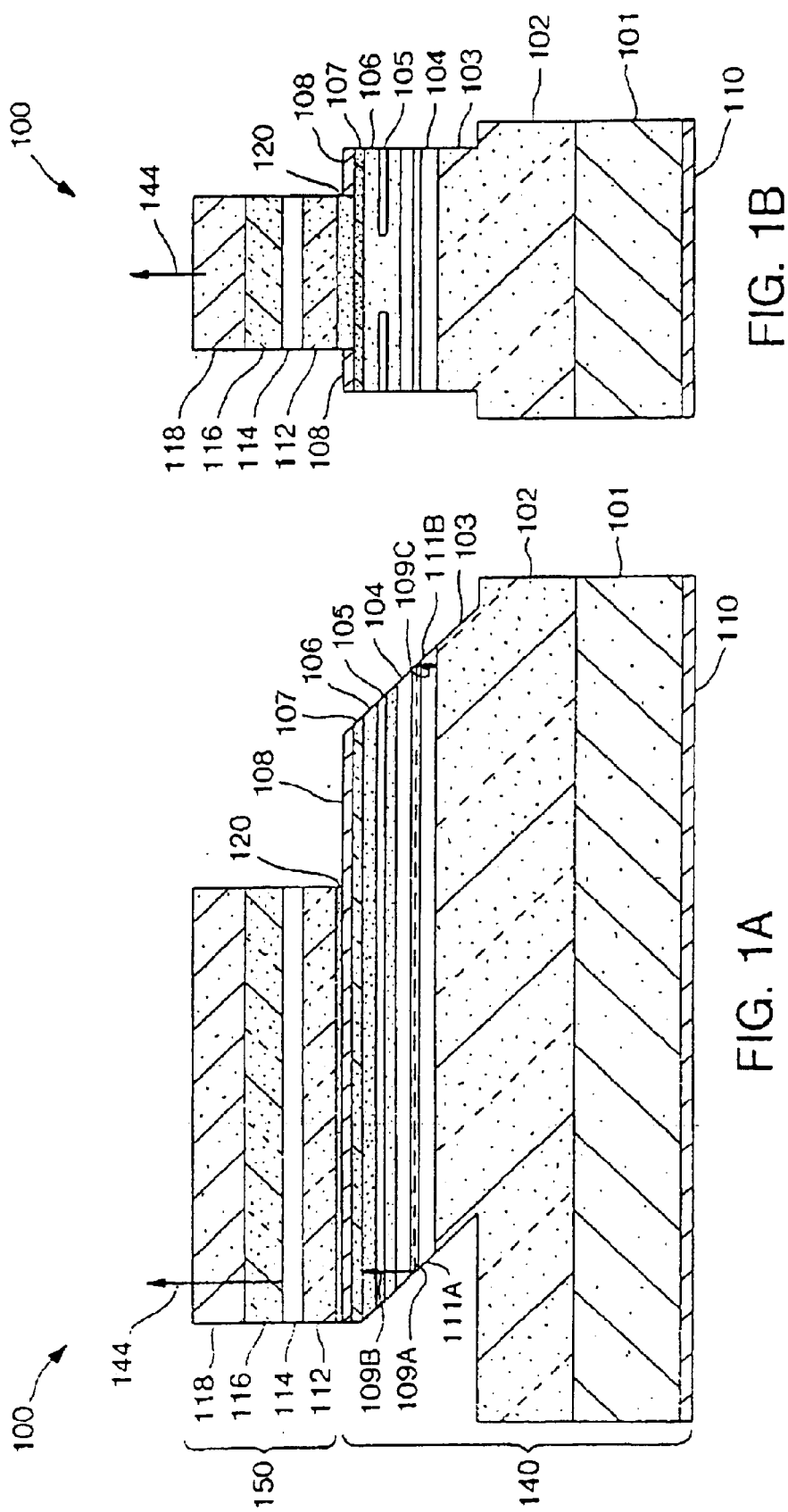
FIG. 1A is a magnified side view of an integrated optically pumped vertical cavity surface emitting laser using a FCSEL as a pump laser.
FIG. 1B is a magnified cross-sectional front view of the integrated optically pumped vertical cavity surface emitting laser of FIG. 1A.

Referring now to FIG. 1A, an integrated optically pumped VCSEL 100 is illustrated. The integrated optically pumped VCSEL 100 includes a folded cavity surface emitting laser (FCSEL) 140 integrated with an optically pumped VCSEL 150. The folded cavity surface emitting laser 140 includes a substrate 101, a distributed Bragg reflector (DBR) 102, an active area 104, a confinement layer 105, a cladding layer 106, a semiconductor contact layer 107, a first metal layer as a top contact terminal 108, a second metal layer as a base terminal 110, and the facets or beam steering elements 111A and 111B.

Substrate 101 of the FCSEL 104 is preferably an n-type doped Gallium-Arsenide (GaAs) layer. Alternatively, the substrate 101 can be a layer of an n-type doped Indium-Phosphide (InP) or other semiconductor materials.

The DBR 102 is preferably doped to match the substrate 101. For example, in the case that the substrate 101 is an n-type doped Indium-Phosphide (InP) or Gallium-Arsenide (GaAs) substrate, the DBR 102 is n-type doped as well. The layers of the DBR 102 are preferably formed from n-type $Al_xGa_{1-x}As/Al_yGa_{1-y}As$ pairs of material with x ranging from 0 and 0.5, and y ranging from 0.5 and 1 for a GaAs substrate. The number of pairs may range from as few as five to as many as forty with the typical number of pairs being about twenty pairs of layers. Alternatively, an Indium-Aluminum-Gallium-Arsenide/Indium-Phosphide (InAlGaAs/InP) distributed Bragg reflector (DBR), an Indium-Gallium-Arsenide-Phosphide/Indium-Phosphide (InGaAsP/InP) DBR, or other monolithic grown DBR mirror can be grown onto the substrate 101 if it is an InP substrate. If wafer bonding techniques are used, a Gallium-Arsenide/Aluminum-Gallium-Arsenide (GaAs/AlGaAs) distributed Bragg reflector (DBR) or a dielectric DBR can be bonded to the substrate 101 and the active area 104. In the case of wafer bonding, the substrate 101 is preferably GaAs. Exemplary dielectric materials for a dielectric DBR include titanium di-oxide ($TiO_2$), silicon di-oxide ($SiO_2$), and silicon nitrogen di-oxide ($SiNO_2$).

The active area 104 can be a Gallium-Arsenide (GaAs), an Aluminum-Gallium-Arsenide (AlGaAs), or an Indium-Gallium-Arsenide (InGaAs) quantum well structure. The active area 104 of the FCSEL 140 in the preferred embodiment is a GaAs quantum well structure. The quantum well structure can be formed of a single quantum well or multiple quantum wells but in the preferred embodiment one to three quantum wells are utilized.

The cladding layer 106 of the FCSEL 140 is a p-type GaAs and can alternately be a p-type AlGaAs layer.

The confinement layer 105 of the FCSEL 140 is preferably an Aluminum-Gallium-Arsenide (AlGaAs) layer with aluminum content at larger than 90% and preferably larger than 95%. The Aluminum-Gallium-Arsenide (AlGaAs) layer 105 is formed within a part of the cladding 106 to allow lateral oxidation during device fabrication. Alternately, the confinement layer 105 is formed by oxidizing a portion of an Aluminum-Arsenide (AlAs) layer into an Aluminum-Oxide ($Al_2O_3$) region. The confinement layer 105 provides both current confinement and optical confinement for the FCSEL 140. Referring momentarily to FIG. 1B, the confinement layer 105 is oxidized to form a narrow conductive region above the active region 104 as illustrated.

The semiconductor contact layer 107 is provided so as to make an ohmic contact to the metal layer of the top contact terminal 108 deposited on its top surface. The semiconductor contact layer 107 is preferably a Gallium-Arsenide (GaAs) layer highly doped to be p-type semiconductor so as to provide an ohmic contact.

The first metal layer of the top contact terminal 108 forms a first terminal of the integrated optically pumped VCSEL 100. Referring momentarily to FIG. 1B, the metal layer for the top contact terminal 108 is only deposited in certain areas of the semiconductor contact layer 107 so as not to block areas where photons are emitted or interfere with the coupling to the optically pumped VCSEL 150.

The second metal layer for the base terminal 110 is deposited on the bottom surface of the substrate 101 in order to form the second terminal of the integrated optically pumped VCSEL 100.

The FCSEL 100 is an electrically pumped semiconductor laser which has a folded laser cavity provided by a pair of facets (also referred to as reflectors or beam steering elements) 111A and 111B at opposite ends. Preferably the external-angled beam steering element 111B and the internal-angled beam steering element 111A are approximately forty five degree angles with the incident light to form the folded cavity of the folded cavity surface emitting laser 140. The beam steering elements 111A and 111B are preferably parallel to each other and formed by cleaving, etching, ion milling or other well known semiconductor process. The active area 104 of the FCSEL has the external-angled beam steering element 111B and the internal-angled beam steering element 111A formed from processing its material layers. The external-angled beam steering element 111B and the internal-angled beam steering element 111A may continue and be formed into the cladding 106, the contact layer 107, and a portion 103 of the DBR 102 as illustrated in the Figures. A dielectric coating (not shown) may be added to the facets 111A and 111B to act as a mirror coating to increase the reflectivity efficiency or as a surface passivation layer.

To manufacture the FCSEL 140, the layers of materials are first deposited or grown from the beginning layer of the substrate 101. After forming a monolithic structure consisting of the substrate 101, the DBR 102, the active region 104, the cladding layer 106 with the confinement layer 105, and the contact layer 107, the facets 101A and 101B can be formed. The facets 101A and 101B are formed by cleaving, etching, ion milling or other semiconductor process to remove material.

The optically pumped VCSEL 150 includes a first distributed Bragg reflector (DBR) 112, a quantum well active area 114, a second distributed Bragg reflector (DBR) 116, and a substrate 118. The first DBR 112 can be an $Al_xGa_{1-x}As/Al_yGa_{1-y}As$ DBR, an InP/InGaAsP DBR, or a dielectric DBR, and is preferably a dielectric DBR. The active area 114 can be InGaAsP, InAlGaAs, InGaAs, InGaAsN, or GaAsSb quantum well structure having multiple quantum wells. The second DBR 116 can be an $Al_xGa_{1-x}As/Al_yGa_{1-y}As$ DBR, an InGaAsP/InP DBR or a dielectric DBR, and is preferably made of pairs of InGaAsP/InP. The substrate 118 of the optically pumped VCSEL 150 can be a layer of GaAs or of Indium-Phosphide (InP), and is preferably an InP substrate. DBRs 112 and 116 are preferably made of thicknesses to provide substantial (preferably 99% or more) reflection of long wavelengths at 1.3 μm or 1.55 μm to amplify and stimulate emission. In FIGS. 1A and 1B, the folded cavity surface emitting laser 140 and the optically pumped VCSEL 150 are integrated together at the interface 120 by either fusing, gluing, metal bonding, epoxy bonding or other well-known semiconductor bonding methods. In this case, interface 120 represents the joining of the surfaces and a layer of material, if any, to join the surfaces. The interface 120 can alternately be an air gap in the case where the FCSEL 140 and the optically pumped VCSEL 150 are held mechanically aligned together.

In operation, the folded cavity surface emitting laser 140 generates a short wavelength laser beam 109 which is reflected between the beam steering element 11A, beam steering element 111B, DBR 102, and the contact layer 107 as the laser beam elements 109A, 109B and 109C. The in-plane laser beam 109A is reflected by beam steering element 111A into the substantially perpendicular beam 109B for coupling into the VCSEL 150 to optically pump it. After becoming sufficiently pumped to reach lasing threshold, the optically pumped VCSEL 150 emits photons 144 preferably of a relatively long wavelength as a laser beam.

Figure 2:
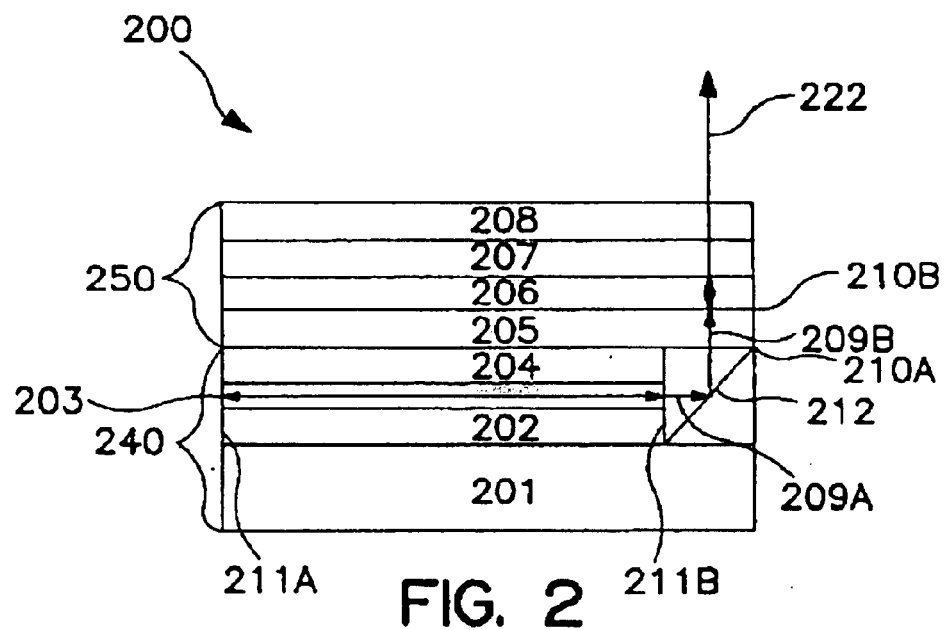
FIG. 2 is a magnified cross sectional view of an integrated optically pumped long wavelength VCSEL using an edge emitting laser as a pump laser.

Referring now to FIG. 2, an integrated optically pumped VCSEL 200 as a first embodiment of the invention is illustrated. The integrated optically pumped VCSEL 200 includes a short wavelength in-plane semiconductor laser, the edge-emitting laser 240, integrated with a long wavelength VCSEL 250. The edge emitting (EE) laser 240 can emit a laser beam (i.e. photons) at a wavelength over a range from 600 nm to 1110 nm. The edge emitting laser 240 will typically emit photons having wavelengths of 780 nm, 850 nm, or 980 nm. The laser beam 209A is steered by a beam steering element 212 towards the long wavelength VCSEL 250 to optically pump it. In response to the optical pumping, the long wavelength VCSEL 250 emits a laser beam at a wavelength over a range from 1250 nm to 1650 nm. The long wavelength VCSEL 250 typically emits a laser bean having a wavelength of 1300 nm or 1550 nm. The beam steering element 212 can be a mirror, an optical grating or other reflecting surface. The beam steering element 212 in the preferred embodiment steers photons at an angle substantially perpendicular with the beam 209A to form laser beam 209B. In this case the incident and refractive angles are substantially forty-five degrees.

The edge emitting laser 240 includes a substrate 201, a cladding layer 202, an active area 203, and a cladding and contact layer 204. The substrate 201 is preferably Gallium-Arsenide (GaAs) which may be removed after the formation of the integrated optically pumped VCSEL structure 200 is completed. The cladding 202 is preferably Gallium-Arsenide (GaAs) or Aluminum-Gallium-Arsenide (AlGaAs). The substrate 201 or cladding layer 202 may act as the contact layer for making one of the electrical contacts for the electrically pumped in-plane semiconductor laser. The active layer 203 has its materials selected depending upon the desired wavelength of photons output. In the case that 980 nanometers (nm) wavelength is desired, active layer 203 is InGaAs quantum wells (QWs). In the case that 850 nm is desired, the active layer 203 is Gallium-Arsenide (GaAs) QWs. In the case that the desired wavelength is 780 nm, the active layer may be Gallium-Aluminum-Arsenide (GaAlAs) or Gallium-Indium-Arsenide-Phosphide (GaInAsP) QWs. In the preferred embodiment the cladding and contact layer 204 is a P-type GaAs material.

To stimulate emission, the straight facets 211A and 211B act as mirrors for the laser cavity. The facets 211A and 211B are parallel to each other and formed by cleaving, etching, ion milling or other well known semiconductor process. A dielectric coating may be added to the facets 211A and 211B to act as a mirror coating to increase the reflectivity efficiency. The photons emitted from the edge-emitting laser 240 are reflected or deflected by the beam steering element 212 into the long wavelength VCSEL 250. The beam steering element 212 is set an angle of approximately forty five degrees with the incident photons to reflect them towards the long wavelength VCSEL 250. The beam steering element 212 is formed by dry etching or ion milling processes or other well known semiconductor process for removing materials. The facets 211A and 211B are coupled to the laser cavity of the in-plane semiconductor laser while the beam steering element 212 is formed exterior to the cavity but integrated with the integrated optically pumped VCSEL 200.

The long wavelength VCSEL 250 is comprised of a distributed Bragg reflector (DBR) 205, a long wavelength active area 206, a second distributed Bragg reflector (DBR) 207 and a substrate 208. The distributed Bragg reflector DBR 205 is specifically designed for the desired long wavelength by forming the pairs of materials with a quarter wavelength in thickness for each layer. The DBR 205 may be a dielectric DBR, a GaAs/AlGaAs DBR, an InP/InGaAsP DBR, or an InP/InAlGaAs DBR. The dielectric DBR is formed by depositing silicon dioxide/titanium dioxide pairs of quarter wavelength thickness layers or other equivalent material layers. The active area 206 for the long wavelength VCSEL may be a single quantum well or a multiple number of quantum wells formed from materials such as InGaAsP or InAlGaAs. In the preferred embodiment, the active area 206 has 3 to 9 quantum wells formed of InGaAsP. DBR 207 is formed similarly to the DBR 205 for long wavelength VCSEL operation. Substrate 208, upon which the long wavelength VCSEL 250 has been formed, is preferably an InP substrate or a GaAs substrate which may be removed after the integrated optically pumped VCSEL structure is completed after bonding together.

The edge-emitting laser 240 may include a ridge-wave guide, a rib-wave guide, an oxide-confined or other well-known lasing enhancement structure. The long wavelength VCSEL 250 may be gain guided by pumping, index guided by oxide, or index guided by etching mesas. In operation, laser beam 209A is reflected back and forth between facets 211A and 211B before being emitted by the edge-emitting laser 240 as the short wavelength laser output. Laser beam 209A is steered by the beam steering element 212 substantial perpendicular in the direction of laser beam 209B. Laser beam 209B is coupled into the long wavelength VCSEL 250 to optically pump it into generating the laser beam 222 at long wavelengths.

In-plane semiconductor lasers such as edge-emitting lasers are relatively easy to manufacture with a relatively high power output. Edge-emitting lasers have the advantage of spreading out the heat generated by the active area 203 such that its thermal resistance is lower. Additionally, the edge-emitting laser has a larger surface area for making electrical contacts such that the electrical resistance is also reduced. Because the electrically pumped in-plane semiconductor lasers, including edge-emitting laser 240, can generate sufficiently high power, the output of the optically pumped VCSEL is also increased.

In the first embodiment of the integrated optically pumped VCSEL of FIG. 2, the edge emitting laser 240 is bonded to the long wavelength VCSEL 250 at either the bonding interface 210A or 210B depending upon whether the DBR 205 of the VCSEL 250 is grown with the edge emitting laser 240. If DBR 205 is made of pairs of GaAs/AlGaAs materials it is grown with the edge emitting laser 240 and the bonding interface between the lasers is 210B. If the DBR 205 is not made of pairs of GaAs/AlGaAs materials but of some other material such as a dielectric DBR, InP/InGaAsP DBR, or InP/InAlGaAsP DBR, then the bonding interface between the lasers is 210A. The two lasers are bonded together at either bonding interface 210A or 210B through atomic bonding, molecular bonding, metal bonding, epoxy bonding, or other well-known bonding methods for bonding semiconductor materials. The material used to bond at the bonding interface 210A or 210B is optically transparent for transmission of photons at the desired wavelength.

Figure 3A:
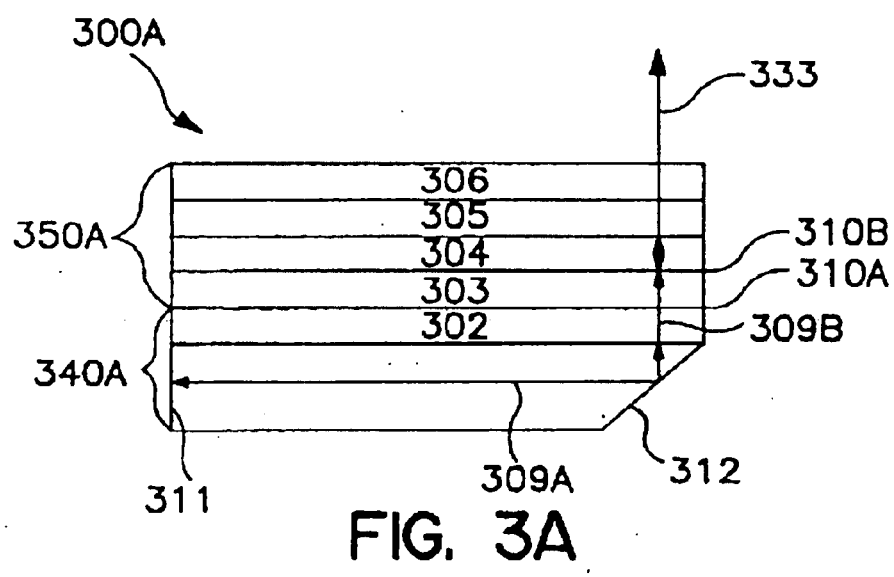
FIGS. 3A through 3F are alternate embodiments of an integrated optically pumped long wavelength VCSEL using an edge emitting laser as a pump laser.

Referring now to FIGS. 3A through 3F, integrated optically pumped VCSELs 300A through 300F are illustrated. In FIG. 3A, the integrated optically pumped VCSEL 300A comprises an in-plane semiconductor laser, an in-plane surface emitting laser 340A, and a long wavelength VCSEL 350A. The in-plane surface emitting laser 340A is coupled to the long wavelength VCSEL 350A at either the bonding interface 310A or bonding interface 310B depending upon whether the DBR 303 of the VCSEL 350A is grown with the in-plane surface emitting laser 340A or not.

If DBR 303 is made of pairs of GaAs/AlGaAs materials it is grown with the in-plane surface emitting laser 340A and the bonding interface between the lasers is 310B. If the DBR 303 is not made of pairs of GaAs/AlGaAs materials but of some other material such as a dielectric DBR, InP/InGaAsP DBR, or InP/InAlGaAsP DBR which is grown with the VCSEL 350A, then the bonding interface between the lasers is 310A. The in-plane surface emitting laser 340A may be bonded to the long wavelength VCSEL 350A by means of wafer bonding, metal bonding, epoxy bonding, or other well-known semiconductor bonding techniques.

The in-plane surface emitting laser 340A is composed of multiple layers of well-known materials similar to in-plane laser 240 in FIG. 2. The in-plane surface emitting laser 340A can include confinement structures including an etched mesa, rib or oxide carrier confinement structure forming a ridge waveguide in-plane semiconductor laser, a rib waveguide in-plane semiconductor laser, or an oxide confined in-plane semiconductor laser respectively. The in-plane surface emitting laser 340A includes a laser cavity mirror 302 coupled to a cladding layer to reflect photons within the laser cavity and allow photons of sufficient energy to pass through. In-plane surface emitting laser 340A is preferably manufactured and designed to lase at 780 nm, 850 nm, or 980 nm. The substrate of the in-plane surface emitting laser is preferably Gallium-Arsenide (GaAs), which is optionally removed from the integrated optically-pumped VCSEL 300A.

In contrast with the beam steering element 212 being outside the laser cavity, the in-plane surface emitting laser 340A includes the beam steering element 312 in the laser cavity of the in-plane surface emitting laser 340A for reflection. The beam steering element 312 is preferably at an angle of substantially forty five degrees and is formed by etching the semiconductor materials of the in-plane surface emitting laser 340A. The straight facet 311 is formed by cleaving or etching substantially perpendicular with the semiconductor materials of the laser 340A. The beam steering element 312 within the laser cavity provides a total reflection to the incoming light from either the in-plane laser cavity facet 311 or from the laser cavity mirror 302. The laser cavity mirror 302 is formed similarly to a DBR and includes layers of the pair of materials $Al_xGa_{1-x}As/Al_yGa_{1-y}As$ to reflect and transmit the short wavelength photons.

The laser cavity mirror 302 and the beam steering element 312 can be substituted for a grating surface forming an in-plane grating surface emitting laser. The grating surface can have its ridges formed (spacing, etching angles, etc.) such that it can act both as a mirror surface to reflect photons in the laser cavity and to steer short wavelength photons into the long wavelength VCSEL 350A.

The long wavelength VCSEL 350A comprises a distributed Bragg reflector (DBR) 303, active area 304, a second DBR 305, and a substrate 306. The short wavelength photons generated by the in-plane surface emitting laser 340A are preferably of wavelengths 780 nm, 850 nm, or 980 nm. DBR 303 and DBR 305 are designed specifically for the long wavelength VCSEL 350A and can be a dielectric DBR, an $Al_xGa_{1-x}As/Al_yGa_{1-y}As$ DBR, or a InP/InGaAsP DBR. The active area 304 is specifically designed for long wavelength VCSELs and may be a single or multiple quantum well structure formed from Indium-Gallium-Arsenide-Phosphide (InGaAsP), Indium-Gallium-Arsenide (InGaAs), Indium-Aluminum-Gallium-Arsenide (InAlGaAs), Gallium-Arsenide-Antimonide (GaAsSb), or Indium-Gallium-Arsenide-Nitride (InGaAsN). Substrate 306, depending on the other materials used in forming the VCSEL laser 350A, is an InP or a GaAs substrate.

In the operation of the integrated optically pumped VCSEL 300A, the photons 309A at short wavelengths are reflected between by the straight facet 311, the beam steering element 312 and the laser cavity mirror 302 of the in-plane surface emitting laser 340A. The laser beam 309B of short wavelength photons output from the in-plane surface emitting laser 340A are coupled into the long wavelength VCSEL 350A to optically pump it. Upon reaching the lasing threshold, the long wavelength VCSEL 350A emits the long wavelength photons 333.

Figure 3C:
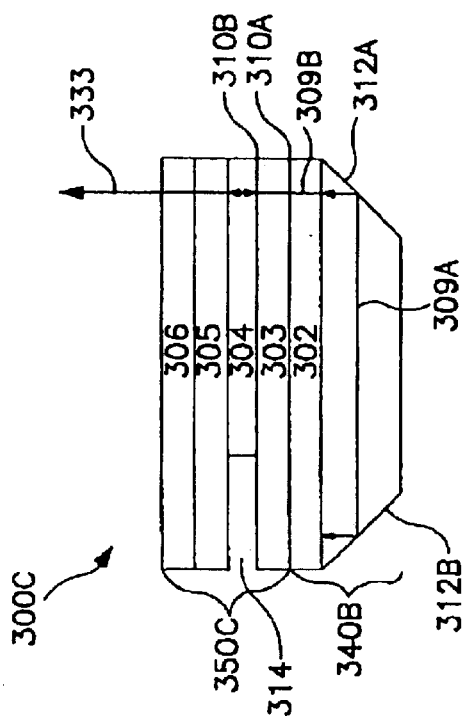
Figure 3E:
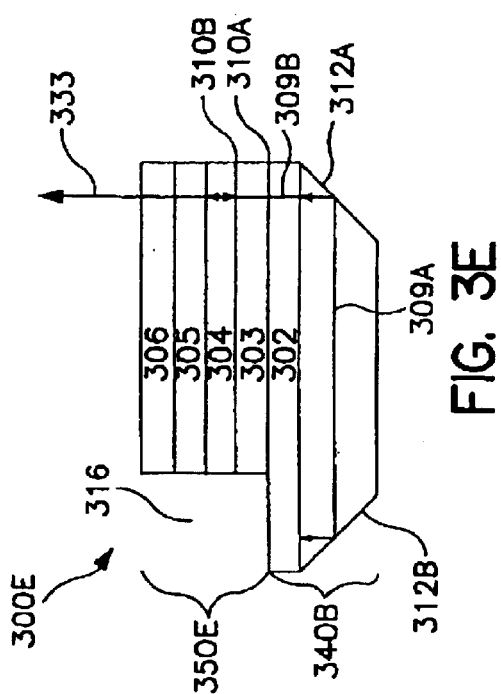
Figure 3B:
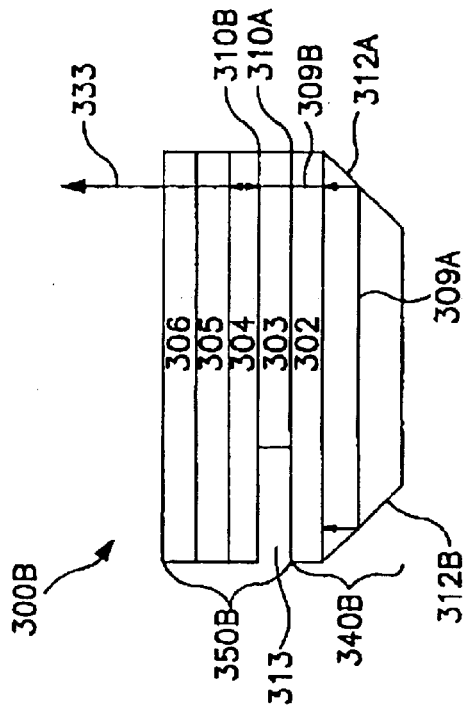

Referring now to FIG. 3B, the integrated long wavelength optically pumped VCSEL 300B having the in-plane surface emitting laser 340B and the long wavelength VCSEL 350B is illustrated. The integrated optically pumped VCSEL 300B is similar to the integrated optically pumped VCSEL 300A but has two beam steering elements 312A and 312B formed in the cavity of the in-plane surface emitting laser 340B. The beam steering element 312B is preferable over the straight edged facet 311 in that it is simpler to manufacture and provides a more efficient reflective surface which provides a higher output power. The beam steering element 312B is similar to the beam steering element 312A.

To avoid two laser beams being emitted from two locations of the surface of the VCSEL, a portion 313 of the DBR mirror 303 is removed where the laser beam would otherwise be reflected to eliminate one of the long wavelength VCSEL resonant cavity mirrors. Portion 313 is removed preferably by etching but other well known semiconductor processing techniques may be used such as ion milling.

The other elements of the in-plane surface emitting laser 340B and the long wavelength VCSEL 350B are similar to lasers 340A and 350A previously described with respect to the integrated long wavelength VCSEL 300A of FIG. 3A and are not repeated herein for reasons of brevity.

Referring now to FIG. 3C, the integrated long wavelength optically pumped VCSEL 300C with in-plane surface emitting laser 340B and long wavelength VCSEL 350C is illustrated. Integrated optically pumped VCSEL 300C has the same in-plane surface emitting laser 340B as does VCSEL 300B with the beam steering elements 312A and 312B. In the long wavelength VCSEL 350C, instead of portion 313 being removed from layer 303, portion 314 is removed from the active area 304 in order for the single laser beam 333 to be emitted from the surface of the long wavelength VCSEL 350C. Otherwise, similarly numbered elements of the in-plane surface emitting laser 340B and the VCSEL 350C are similar to those previously described with respect to FIG. 3B and the integrated optically pumped VCSEL 300B.

Figure 3D:
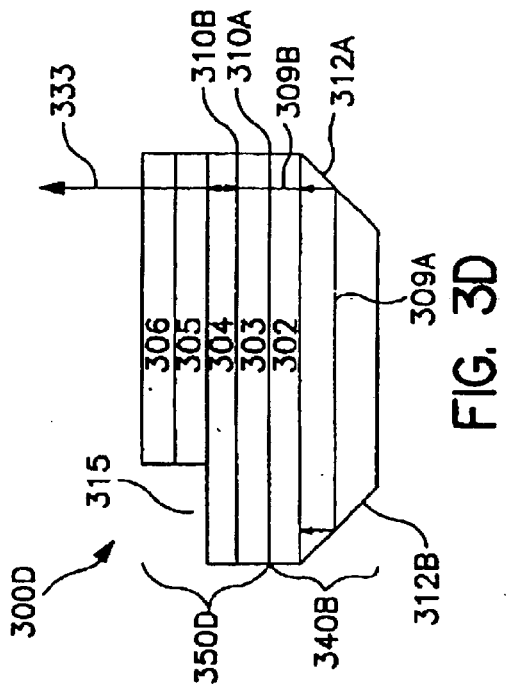

Referring now to FIG. 3D, a fifth embodiment, integrated optically pumped VCSEL 300D is illustrated. The integrated optically pumped VCSEL 300D includes the in-plane surface emitting laser 340B and the long wavelength VCSEL 350D. Integrated optically pumped VCSEL 300D has the same in-plane surface emitting laser 340B as does VCSEL 300B with the beam steering elements 312A and 312B.

Instead of portion 313 or 314, the long wavelength VCSEL 350D has portion 315 removed from the material of the distributed Bragg reflector (DBR) 305 and the substrate 306. This causes a single laser beam 333 to be emitted from the surface of the long wavelength VCSEL 350D. Otherwise, similarly numbered elements of the in-plane surface emitting laser 340B and the VCSEL 350D are similar to those previously described with respect to FIG. 3B and the integrated optically pumped VCSEL 300B.

Referring now to FIG. 3E, the integrated optically pumped VCSEL 300E is illustrated. The integrated optically pumped VCSEL 300E includes the in-plane surface emitting laser 340B and the long wavelength VCSEL 350E. Integrated optically pumped VCSEL 300E has the same in-plane surface emitting laser 340B as does VCSEL 300B with the beam steering elements 312A and 312B. Instead of portions 313, 314, or 315, the long wavelength VCSEL 350E now has a portion 316 removed from the distributed Bragg reflector DBR 303, the active area 304, DBR 305, and the substrate 306. In this manner a single laser beam 333 is emitted from the long wavelength VCSEL 350E. Otherwise, similarly numbered elements of the in-plane surface emitting laser 340B and the VCSEL 350E are similar to those previously described with respect to FIG. 3B and the integrated optically pumped VCSEL 300B.

Figure 3F:
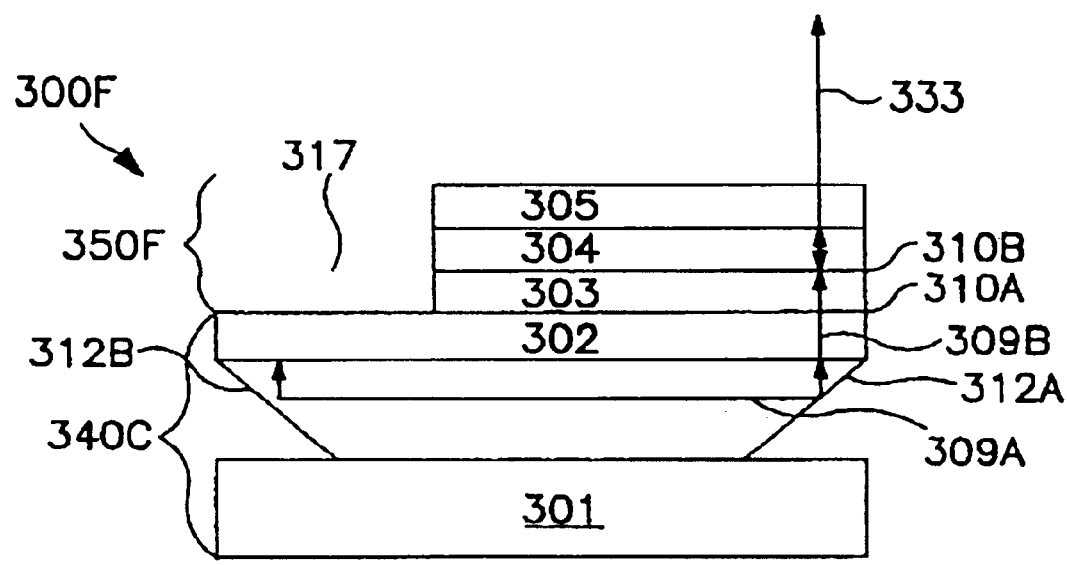

Referring now to FIG. 3F, a seventh embodiment of the integrated optically pumped VCSEL 300F is illustrated. The integrated optically pumped VCSEL 300F includes the in-plane surface emitting laser 340C and the long wavelength VCSEL 350F. The in-plane surface emitting laser 340C includes its own substrate 301 and the beam steering elements 312A and 312B. The long wavelength VCSEL 350F has its substrate 306 removed and instead of portions 313, 314, 315, or 316, a portion 317 is removed from the distributed Bragg reflector DBR 303, active area 304, and DBR 305. FIG. 3F illustrates how either one of the substrate for the in-plane surface emitting laser 340 or the substrate for the long wavelength VCSEL 350 can be removed.

An edge emitting pump laser may be monolithically formed out of a semiconductor wafer and coupled to a long-wavelength VCSEL formed out of another semiconductor wafer to generate a monolithic integrated optically pumped long wavelength VCSEL.

Referring now to FIG. 4A, an exploded view of a plurality of integrated optically pumped long wavelength VCSELs 400 under manufacture and assembly is illustrated. The integrated optically pumped long wavelength VCSELs 400 may be a work in process ("WIP") with further manufacturing steps to obtain a finished product.

The plurality of integrated optically pumped VCSELs 400 includes a first semiconductor wafer 402, a second semiconductor wafer 403, and an interconnect or bonding layer 404 there between. The first semiconductor wafer 402 includes a plurality of long wavelength VCSELs 412 in a partially manufactured state. The second wafer 403 includes a plurality of the monolithically formed pumped laser 413. The interconnect or bonding layer 404 includes a plurality of bonds 414 to couple each pumped laser 413 with a partially completed long wave length VCSEL 412. In order to align the first wafer 402 and second wafer 403 together alignment marks 420 and a wafer flat 422 maybe provided.

Referring now to FIG. 4B, a portion of the integrated optically pumped VCSELs 400 is magnified and illustrated from FIG. 4A. The long wavelength VCSELs 412 includes the long wavelength VCSEL 412A and the long wavelength VCSEL 412B. The interconnect layer 404 includes a bond 414A and a bond 414B. The bonds may be one or more solder bumps or a perimeter of a solder wall. The pump laser 413 includes a pump laser 413A and a pump laser 413B. The long wavelength VCSEL 412A and the pump laser 413A are coupled together by the bond 414A. The long wavelength VCSEL 412B and the pump laser 413B are coupled together by the bond 414B.

Referring now to FIG. 4C, a side view of the first wafer 402 and the second wafer 403 coupled together by the interconnect layer 404 is illustrated. In FIG. 4C, the long wavelength VCSEL 412A is coupled to the pump laser 413 by the bond 414A.

Figure 5A:
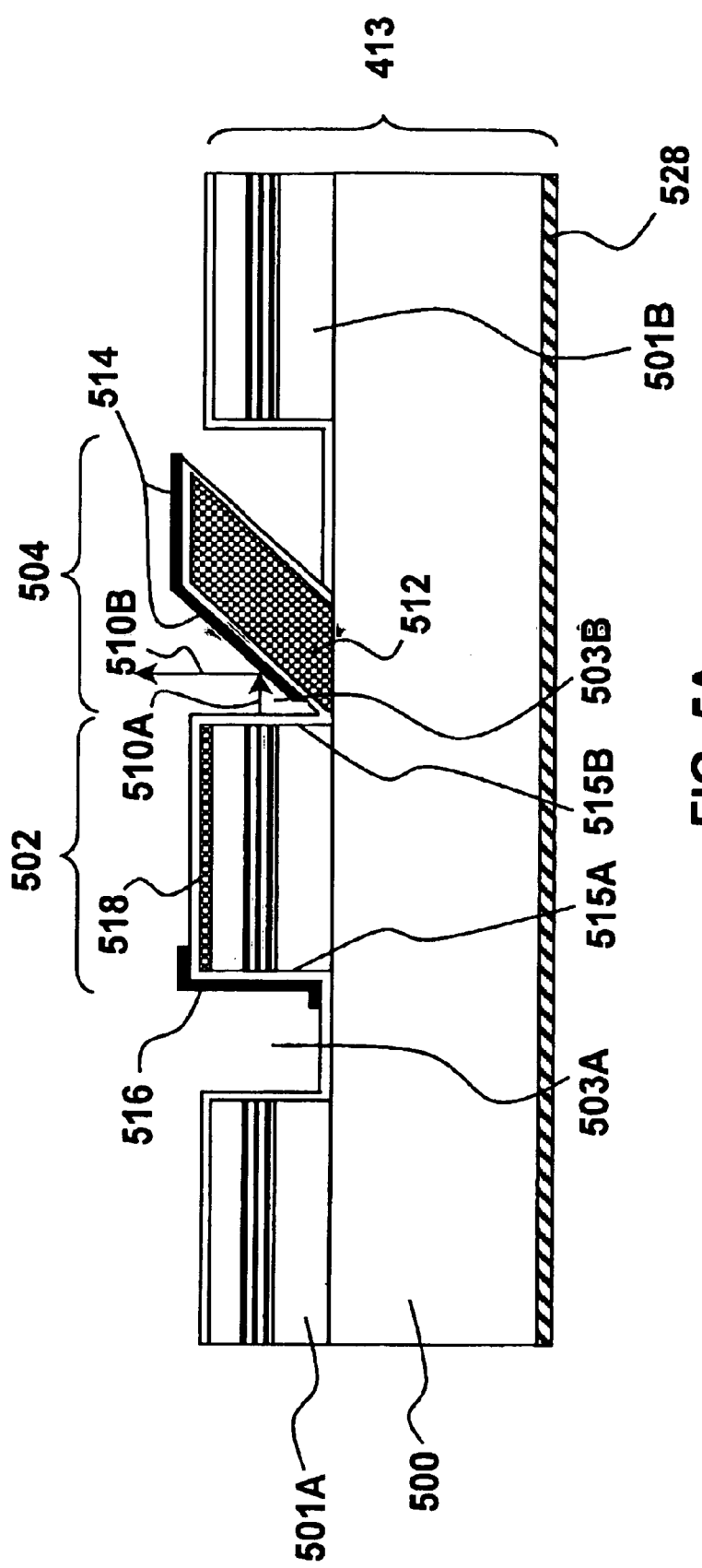
FIGS. 5A–5F illustrate the manufacture and assembly of one monolithic integrated optically pumped LW-VCSEL from the wafers of FIGS. 4A–4C.

Referring now to FIG. 5A, a monolithic pump laser 413 is illustrated. The monolithic pump laser 413 includes a high efficiency edge-emitting laser 502 and a beam deflection or light routing means 504 formed out of and/or on a substrate 500 of the wafer. In a preferred embodiment, the substrate 500 is a gallium-arsenide (GaAs) substrate. The edge emitting laser 502 is formed with a pair of open regions 503A and 503B around it. In a preferred embodiment the open regions 503A and 503B are etched away to respectively form a pair of etched facets 515A and 515B at opposite ends of the edge emitting laser 502. The light routing means 504 is formed in the open region 503B. A pair of support regions 501A and 501B are formed out of and/or on a substrate 500 of the wafer. In one embodiment, the pair of support regions 501A and 501B are formed using some of the same layers of the edge emitting laser 502 when the open regions 503A and 503B are made.

The monolithic pump laser 413 may be fabricated at the wafer scale as discussed previously by using dry-etching or micro-cleaving techniques to produce high quality laser mirrors throughout the wafer, as well as the in-situ deposition of alternately high reflectance and low reflectance coatings on said laser facets.

For simplicity, an exemplary embodiment of the edge emitting laser 502 is a ridge waveguide laser structure depicted in FIG. 5A. However, many other edge emitting laser structures can also be used to form the monolithic pump laser 413.

The edge emitting laser 502 includes electrical contacts 518 and 528 to electrically pump or stimulate the edge emitting laser 502 to generate light or photons of an optical output laser beam 510A emitted at an edge thereof. The edge emitting laser can be directly modulated through the electrical contacts 518 and 528 in order to turn on and off the generation of light or photons by the pump laser 413.

The edge emitting laser 502, and the monolithic pump laser 413 as well, are characterized as having an emission spectrum or range of wavelengths of light or photons which are generated. The emission spectrum or wavelengths of photons generated by the pump laser, lie substantially outside (below) the high reflectance stop-band of the DBR mirrors of the LW-VCSEL which it is going to pump. The emission spectrum or wavelengths of photons generated by the pump laser preferably lie below the absorption band edge of the LW-VCSEL's quantum well active region, with the incident light or photons preferably absorbed entirely by the quantum wells alone rather than by any spacer layers, although absorption by the latter may also be included.

The light routing means 504 is a beam steering or beam deflecting element, a reflecting mirror or a deflecting mirror, that redirects, reflects, or deflects an optical output beam 510A from an output of the edge emitting laser 502 into a redirected optical output beam 510B. The redirected optical output beam 510B impinges upon an input port of the LW VCSEL. This may be achieved by incorporating a reflecting prism (mirror) at the output port (low reflectance facet) of the edge emitting laser 502 as part of the pump laser 413. Assuming the optical output from the edge emitting laser 502 is in a horizontal direction, the light routing means deflects the optical output power from the edge emitting laser from a direction that is substantially horizontal to one that is substantially vertical in order for the photons or light to impinge upon a surface of the VCSEL at an angle that is between 8 degrees to 10 degrees with respect to the surface normal. That is, the optical output beam 510A is deflected by the light routing means 504 at approximately a ninety degree angle from its original direction.

The deflecting mirror 504 may be monolithically integrated into the pump laser wafer 403 and is included as an integral part of the fabrication sequence of the pump laser 413. The deflecting mirror 504 includes a body portion 512 and a surface portion 514. The body portion 512 is coupled to the substrate layer 500 at an appropriate angle to deflect the output of the edge emitting laser and provides support to the surface portion 514. The body portion 512 of the deflecting mirror 504 may be comprised of an angle-etched semiconductor material such as Gallium-Arsenide (GaAs) etched by a chemically assisted ion beam etching (CAIBE). Alternatively, the body portion 512 may be formed as part of the pump laser by depositing and optically patterning a dielectric material. Alternatively, any other integrable reflecting means or beam steering element, such as those previously described, may be positioned on either the surface of the wafer 402 or the surface of wafer 403.

In a preferred embodiment, the body portion 512 of the deflecting mirror 504 is fabricated by patterning (i.e., masking) a photosensitive polymeric material layer and then exposing it to actinic radiation at an appropriate incidence angle in order to polymerize and cross-link said polymeric material. This renders the polymeric material insoluble during subsequent chemical development and leaves an angled structure with the desired mirror profile.

The deflecting mirror 504 is completed by the formation of the surface portion 514 onto the body portion 512. In one embodiment, a highly reflecting metal film, such as gold (Au), is deposited onto the body portion 512 thereby forming the surface portion 514 of the deflecting mirror 504. The surface portion 514 is applied onto a surface area of at least the one surface of the body portion 512 which is angled to deflect the output of the edge emitting laser. The same material used to form the surface portion 514 may be used to form a back mirror 516 for the edge emitting laser 502. The back mirror 516 covers the active area layers of the edge emitting laser 502 to reflect photons back into the laser cavity so that emission occurs at an opposite end of the laser cavity. Exemplary formation of the deflecting mirror 504 is further described below with reference to FIGS. 6A–6B.

Figure 5B:
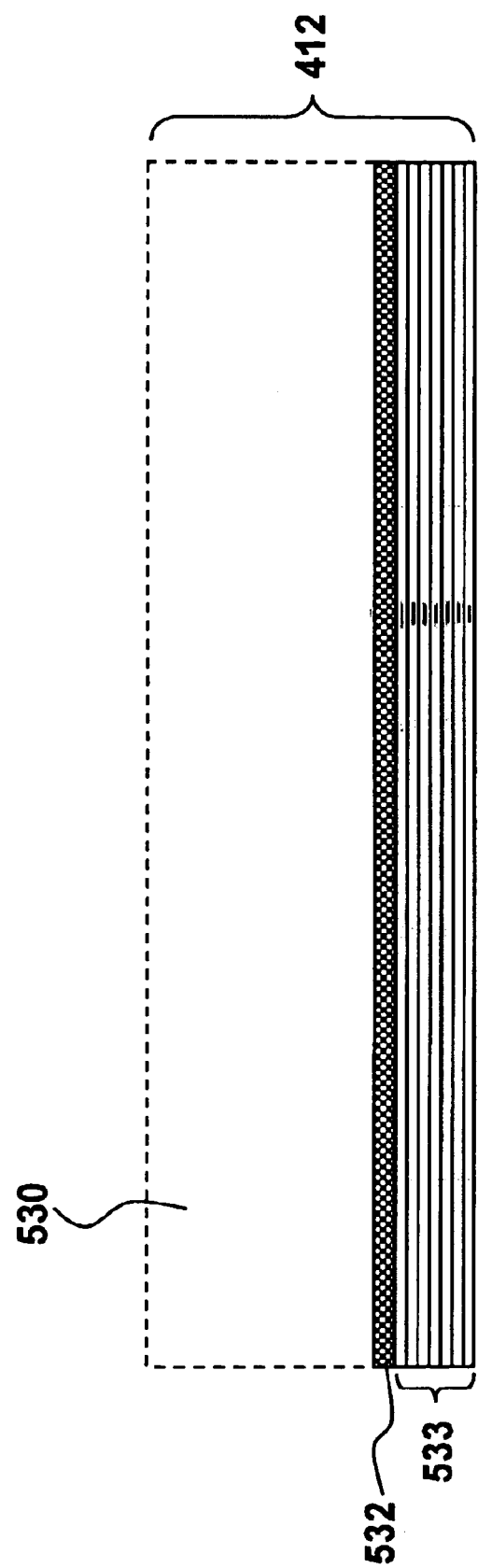

Referring now to FIG. 5B, a partially formed VCSEL 412 of the wafer 402 is illustrated. The partially formed VCSEL 412 includes a substrate layer 530, an active layer or region 532 formed on the substrate layer 530, and a first DBR mirror 533 formed on the active layer 532. The first DBR mirror 533 is also referred to as being a metamorphic DBR mirror, since it consists of a GaAs/AlAs DBR structure grown metamorphically on an InP substrate. In a preferred embodiment, the substrate layer 530 is an Indium-Phosphide (InP) substrate.

The wafer 402 is coupled to the wafer 403 using the interconnect or bonding layer 404 with the first DBR mirror 533 acting as a lower DBR mirror for the VCSEL.

Figure 5C:
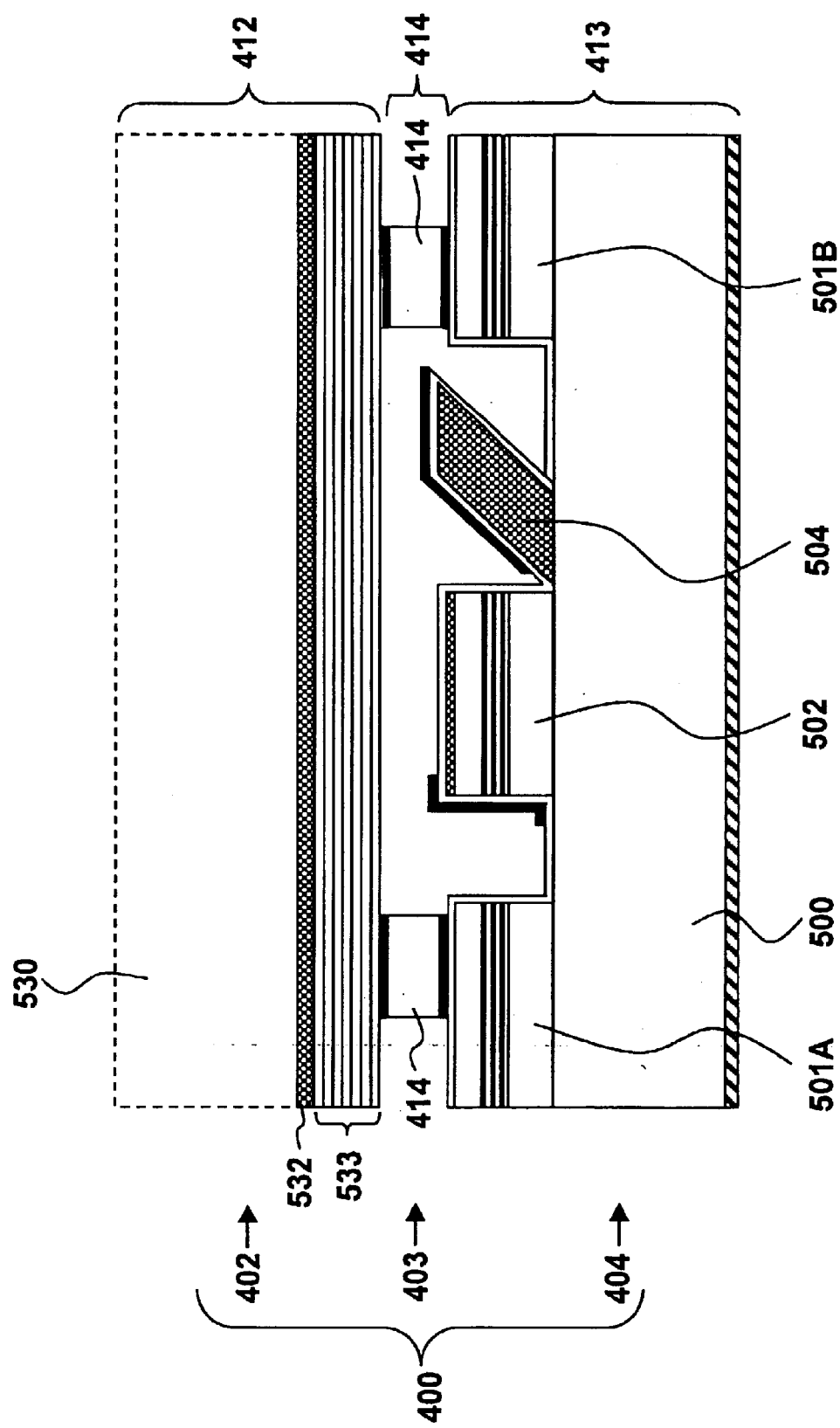

Referring now to FIG. 5C, the partially formed VCSEL 412 of the wafer 402 is integrated with the pump laser 413 of wafer 404 using the bonds 414 of the interconnect layer 404. The bonds 414 are one or more solder bonds that mechanically and electrically couple the pump laser 413 and the VCSEL 412 together. The bonds 414 may completely encircle the edge emitting laser 502 and the light routing means 504 to provide a hermetic seal and keep out dust, dirt, and moisture from affecting the laser output efficiency. The bonds 414 couple to the support structures 501A and 501B at one end and an outer surface of the first DBR mirror 533 at an opposite end. The processing of the partially formed VCSEL 412 may now continue.

Figure 5D:
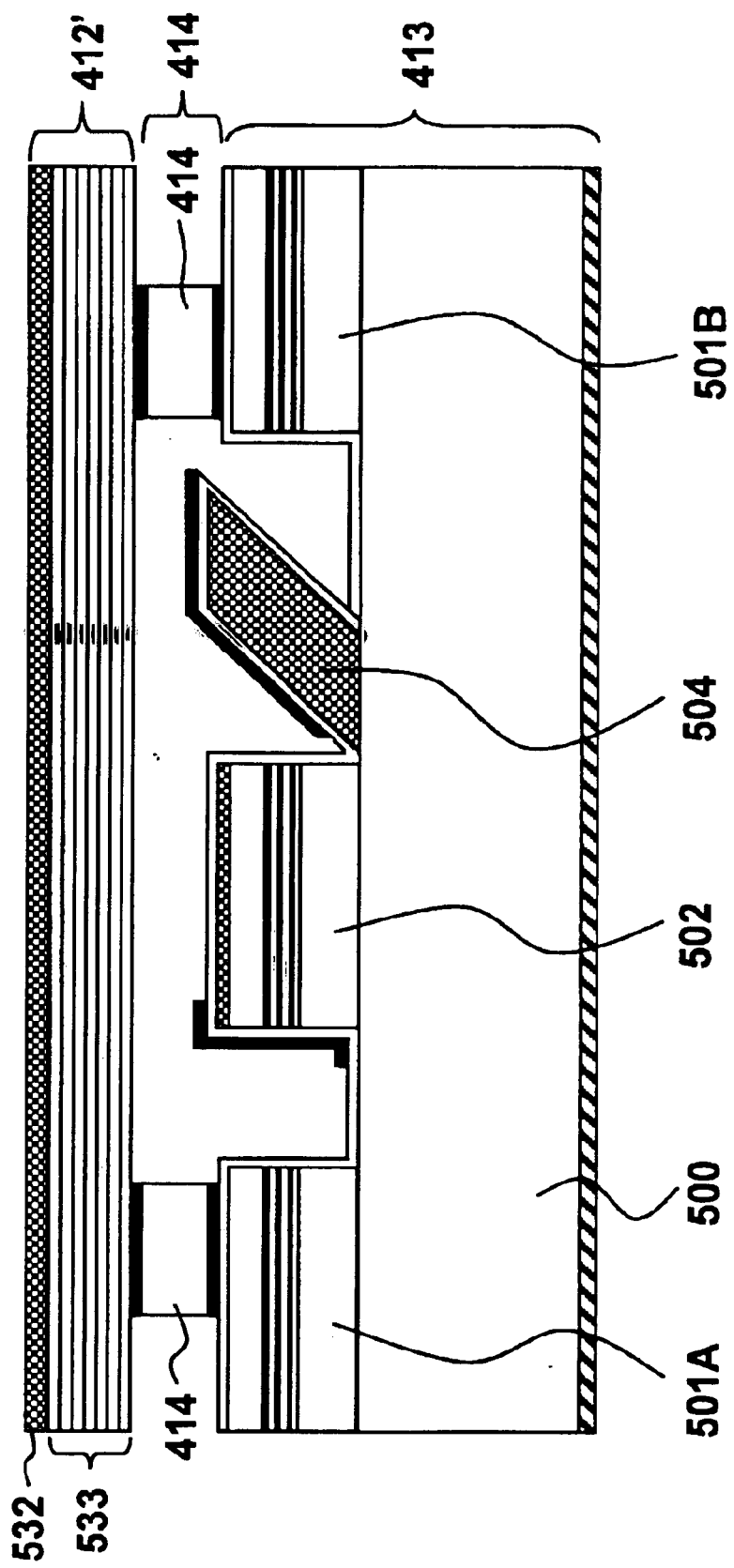

Referring now to FIG. 5D, after the pump laser wafer 404 and the VCSEL wafer 402 are bonded together, the substrate layer 530 is selectively removed in a preferred embodiment. This leaves a thin residual epitaxial layer (i.e., the partially formed VCSEL) 412' of the wafer 402, comprised of the metamorphic DBR mirror 533 and the active layer 532, which remain solder-bonded to the pump laser 413 of the pump laser wafer 404.

Figure 5E:
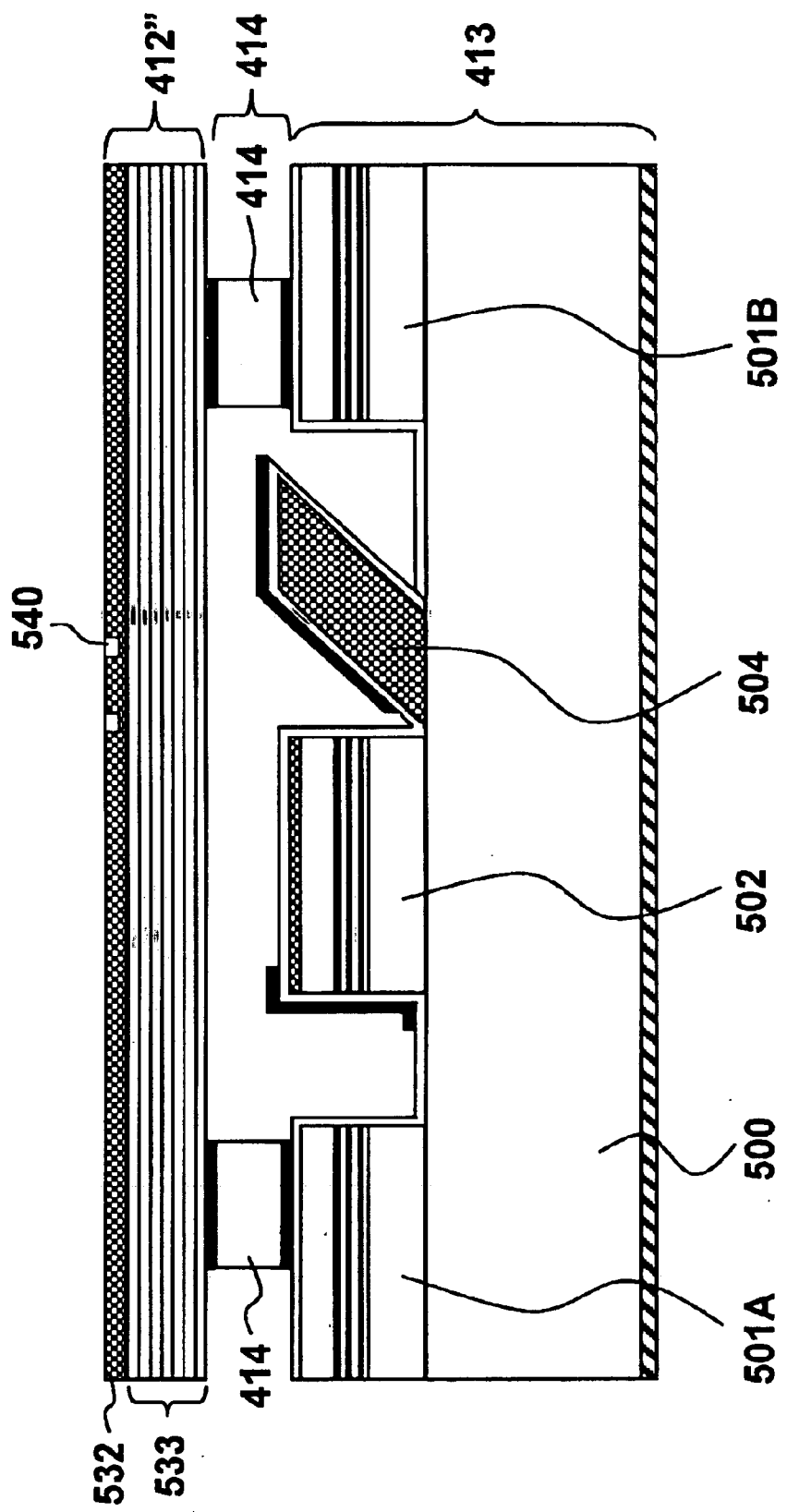

Referring now to FIG. 5E, optional processing is performed in the active layer or region 532 of the partially formed VCSEL 412" to provide mode selection. An optional index guide 540 is formed in the active layer or region 532. The optional index guide 540 in the active layer 532 provides a transverse mode selection mechanism. The optional index guide 540 may be formed in the active layer 532 by etching a trench near its surface.

The mode selection provided by the optional index guide 540 can further enhance the optical output of the LW-VCSEL. The optional index guide 540 can enhance the lateral dimension of the active region, effectively increasing it without sacrificing its single-mode performance. This is achieved by means of mode selection, in which the optical confinement or optical loss of the competing higher order transverse modes of the VCSEL is reduced or increased by design, respectively, thereby suppressing their lasing action and favoring the fundamental mode.

This mode selection mechanism may be equivalently introduced by forming a trench with suitable dimensional scaling in the surface of a second or upper DBR mirror (DBR 544 illustrated in FIG. 5F) as an index guide of the VCSEL instead of using the active layer 532. By allowing the actively pumped area to expand while suppressing the competing modes that emerge through surface relief patterning (loss selection), higher single-mode output power is achieved through a reduced optical power density, which leads to lower self-heating and reduced gain saturation.

Figure 5F:
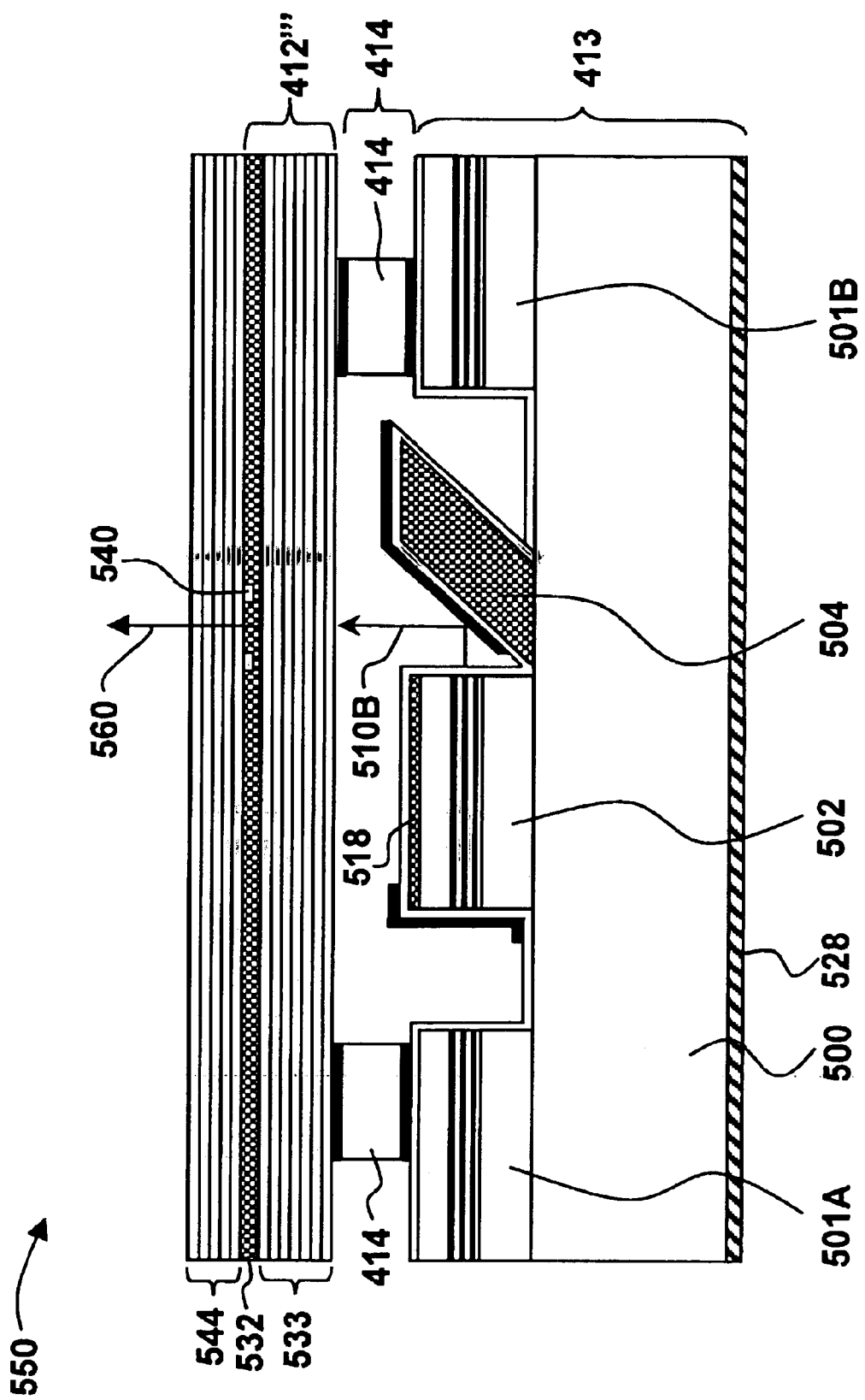

Referring now to FIG. 5F a second DBR mirror 544, also referred to as an upper DBR mirror, is then deposited onto the exposed surface of the active layer 532 opposite the surface coupled to the first DBR mirror 533 to complete the long-wavelength VCSEL 412''' and the monolithic integrated optically pumped long-wavelength VCSEL 550. In a preferred embodiment, the VCSEL 412''' is also referred to as a metamorphic VCSEL structure in which a GaAs/AlAs DBR is grown metamorphically on an InP substrate.

The redirected light or photons 510B emitted from the pump laser 413 is absorbed by the vertical-cavity surface emitting laser 412'''. The input port of the LW VCSEL which receives the photons or light from the pump laser is through is the metamorphic DBR mirror 533.

The VCSEL 412''' is characterized as having an active region 532 that emits light or photons in a relatively long-wavelength such as between 1.3 $\mu$m to 1.6 $\mu$m in wavelength. The active region 532 is sandwiched between two distributed Bragg reflector (DBR) mirrors 533 and 544 (denoted as the upper DBR and lower DBR, respectively). Each of the DBR mirrors include a multiplicity of quarter wavelength thick layers with alternately high and low refractive indices. The DBR mirrors may consist entirely of epitaxially grown semiconductor DBR layers. Alternatively, the DBR mirrors may be formed entirely of deposited dielectric DBR mirror layers, or they may have a combination of these and other DBR materials well known in the art of VCSEL design.

In a preferred embodiment, at least one of the DBR mirrors (preferably the lower DBR mirror 533) will comprise of a multiplicity of alternating GaAs and AlAs layers that are grown "metamorphically" on an InP substrate, upon which the active layer was also epitaxially grown. In this case, the other DBR mirror (upper DBR mirror 544) is comprised of alternating layers of dielectric material with high and low refractive indices. Examples of such DBR mirrors are those containing $SiO_2/TiO_2$ layers or those containing $MgF_2/ZnSe$ layers.

The active layer or region 532 of the VCSEL 412''' is comprised of a comparatively thick active region that contains a multiplicity of quantum well clusters. The center of each of the quantum well clusters is preferably located at an anti-node of the resonant optical field to provide resonant optical gain (RPG). The resonant periodic gain (RPG) allows the gain volume to be expanded in the longitudinal direction in order to achieve a higher net optical gain and thus a higher aggregate optical output in the optically pumped VCSEL.

As previously discussed the pump laser 413 is electrically pumped while the long-wavelength VCSEL is optically pumped. In order to transfer data via modulation of the light output, the overall structure of the monolithic optically-pumped VCSEL 550 provides direct electrical modulation by modulating the pump laser. One electrical contact 518 of two electrical contacts is positioned at the upper surface of the pump laser 413 along the ridge waveguide edge emitting laser 502. A bond wire may couple between a lead or pin at one end and a bonding pad 630 at an opposite end. The bonding pad 630 couples to the electrical contact 518 through the wire trace or interconnection 632. The other electrical contact 528 is positioned at the bottom surface of substrate 500. The edge emitting laser is electrically modulated through these electrical contacts 518 and 528 to generate a light signal in the output laser beam 510A. The output laser beam 510A is redirected into a redirected output laser beam 510B. The output laser beam 510B is modulated with the data which is to be transferred. The output laser beam 510B from the pump laser 413 optically excites the VCSEL 412''' to generate the long-wavelength output laser beam 560. The modulation of data in the output laser beam 510B directly transfers into the long-wavelength output laser beam 560 of the VCSEL 412'''. Neither an external laser source nor an external modulator is needed for the embodiment illustrated in FIG. 5F.

Figure 6A:
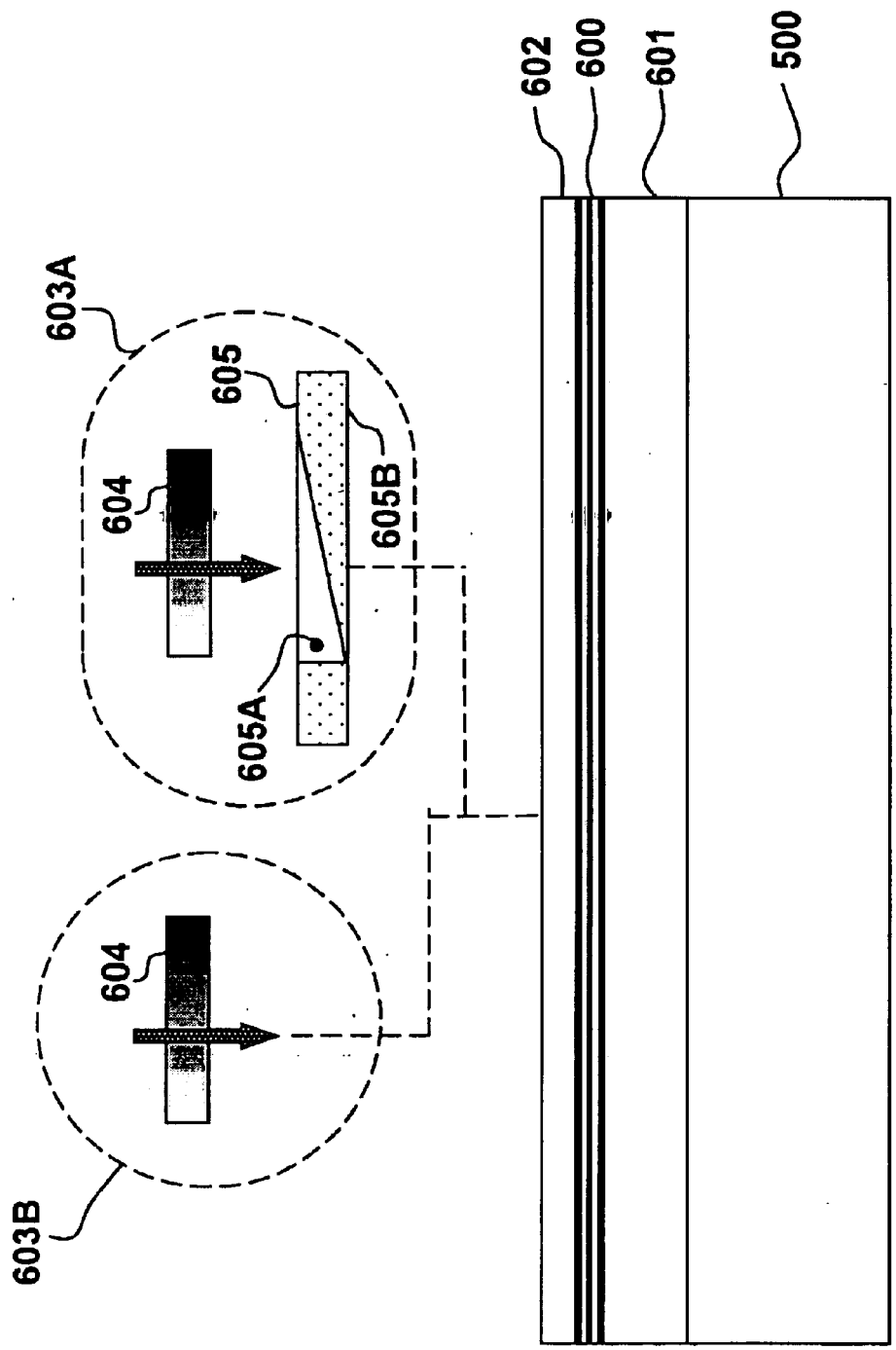
FIGS. 6A–6F are cross sectional views illustrating exemplary manufacture of a pump laser including an edge emitting laser and a light routing means.

Referring now to FIGS. 6A–6F, cross sectional views illustrate exemplary manufacture of a pump laser including the edge emitting laser and the light routing means. In FIG. 6A, processing of the edge emitting laser 240 begins with the substrate 500, a first cladding layer 601, an active area 600, and a second cladding layer 602. As previously discussed, the body portion 512 of the light routing means or deflecting mirror 504 was formed by patterning (i.e., masking) a photosensitive polymeric material layer and then exposing it to actinic radiation at an appropriate incidence angle in order to polymerize and cross-link said polymeric material. In another embodiment of the light routing means 504, the body portion 512 may be formed by using an optical "gradient mask" 604 to provide a desired (linear or parabolic) transmission intensity profile.

There are two ways 603A and 603B illustrated in FIG. 6A in which the optical "gradient mask" 604 may be used over the area to define the body 512 of the deflecting mirror. In a first way 603A, an appropriate photoresist layer 605 is deposited onto the second cladding layer 602. Using the optical "gradient mask" 604 the appropriately chosen photoresist layer is exposed in an exposed resist region 605A leaving an unexposed region 605B. After developing the exposed region 605A, a surface topology of the unexposed region 605B remains that is a scaled replica of the desired physical mirror profile. The unexposed region 605B of the photoresist 605 then functions as a variable etch mask in subsequent dry etching. Optimizing the etching process to achieve a desired etch selection ratio K between the hardened resist and the underlying semiconductor, the topological profile is transferred from the photoresist layer 605 to the underlying semiconductor layers with a magnification factor K to produce the desired profile in the semiconductor. This process depends on the linearity of the exposure with light intensity, and it can be applied to achieve an arbitrary mirror profile of the body portion 512 in the underlying semiconductor layer.

In a second way 603B, the optical "gradient mask" 604 is directly used in a photo-electrochemical process to directly etch the mirror profile into the underlying semiconductor layers. Areas completely masked out by the optical "gradient mask" 604 are not etched. The gradient masking in the optical "gradient mask" 604 provides an etch gradient over an area into the semiconductor layers to form the mirror profile as illustrated in FIG. 6B.

Figure 6B:
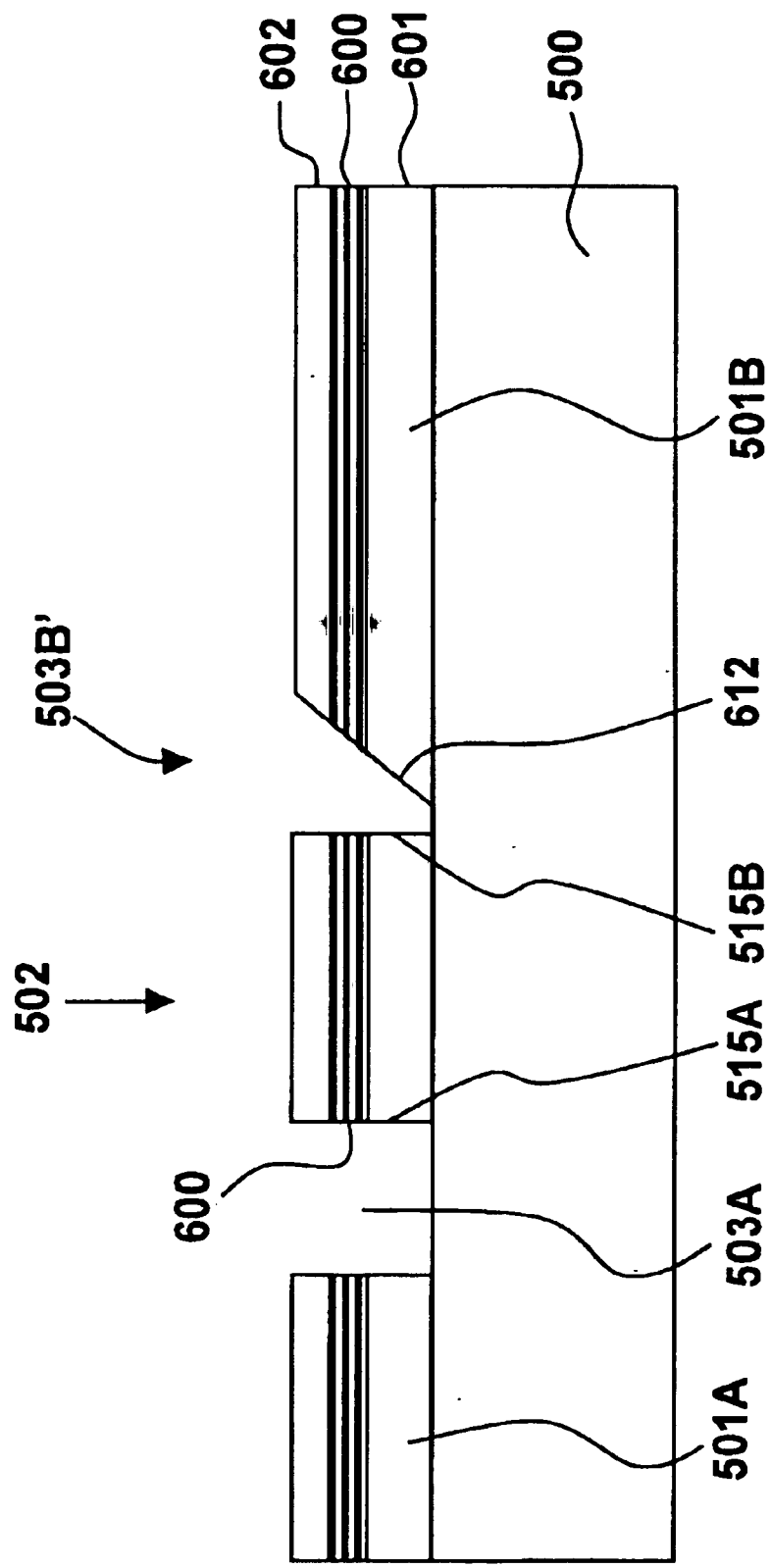

Referring now to FIG. 6B, the mirror profile 612 is etched into the semiconductor layers of the first cladding layer 601, the active area 600, and the second cladding layer 602. In addition to forming the mirror profile 612, the etched facet 515B are formed by the mirror patterning and etching process. Furthermore, the open region 503A may be formed including the etched facet 515A by the same steps as the mirror patterning and etching process without using a gradient in the mask as illustrated.

Figure 6C:
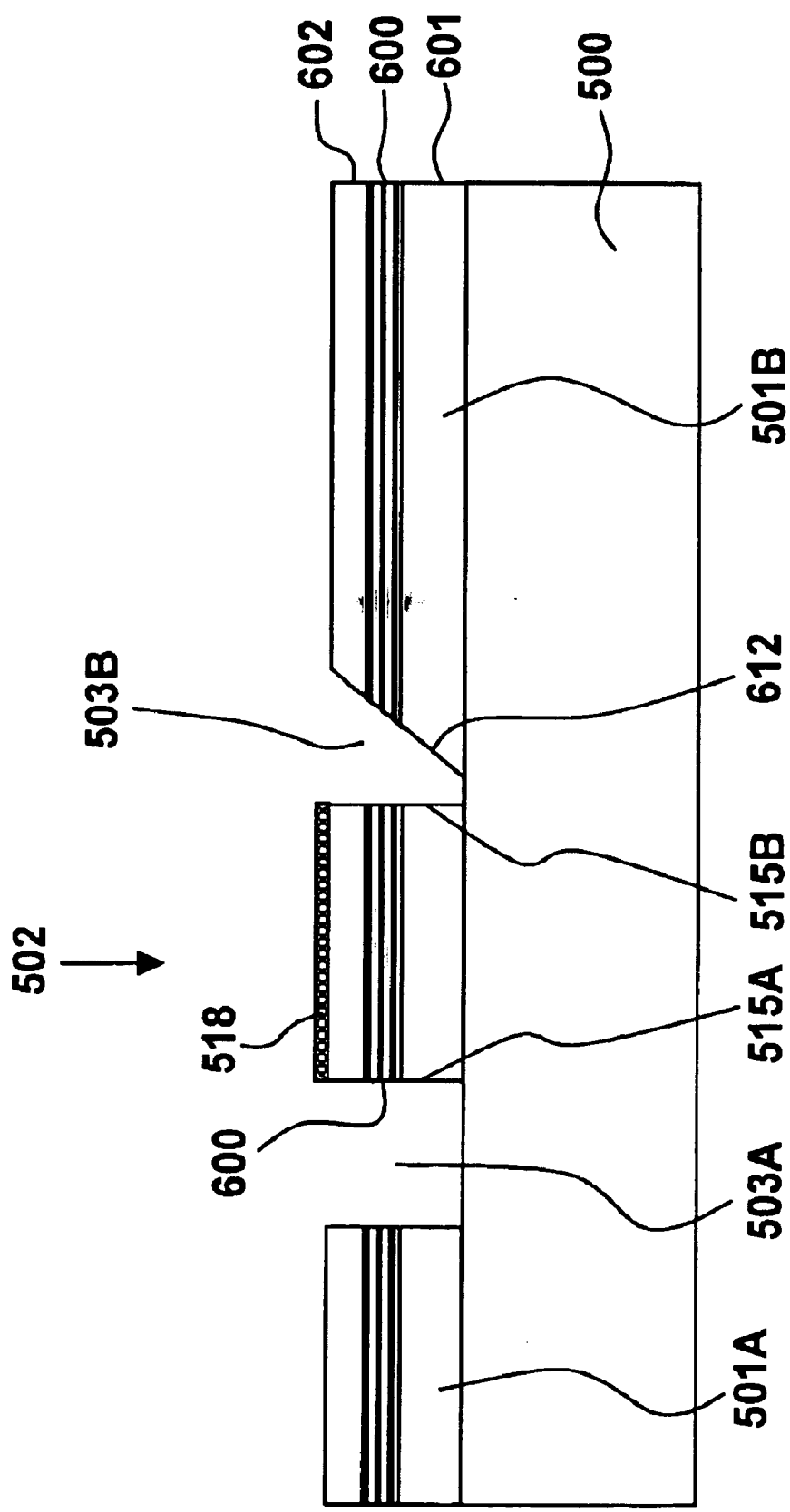

Referring now to FIG. 6C, the contact layer 518 is then formed on top of the second cladding layer in the area of the pump laser 502. The contact 518 provides one of the electrical terminals for modulating the pump laser. The contact layer is formed by depositing a metal conductor in the appropriate area.

Figure 6D:
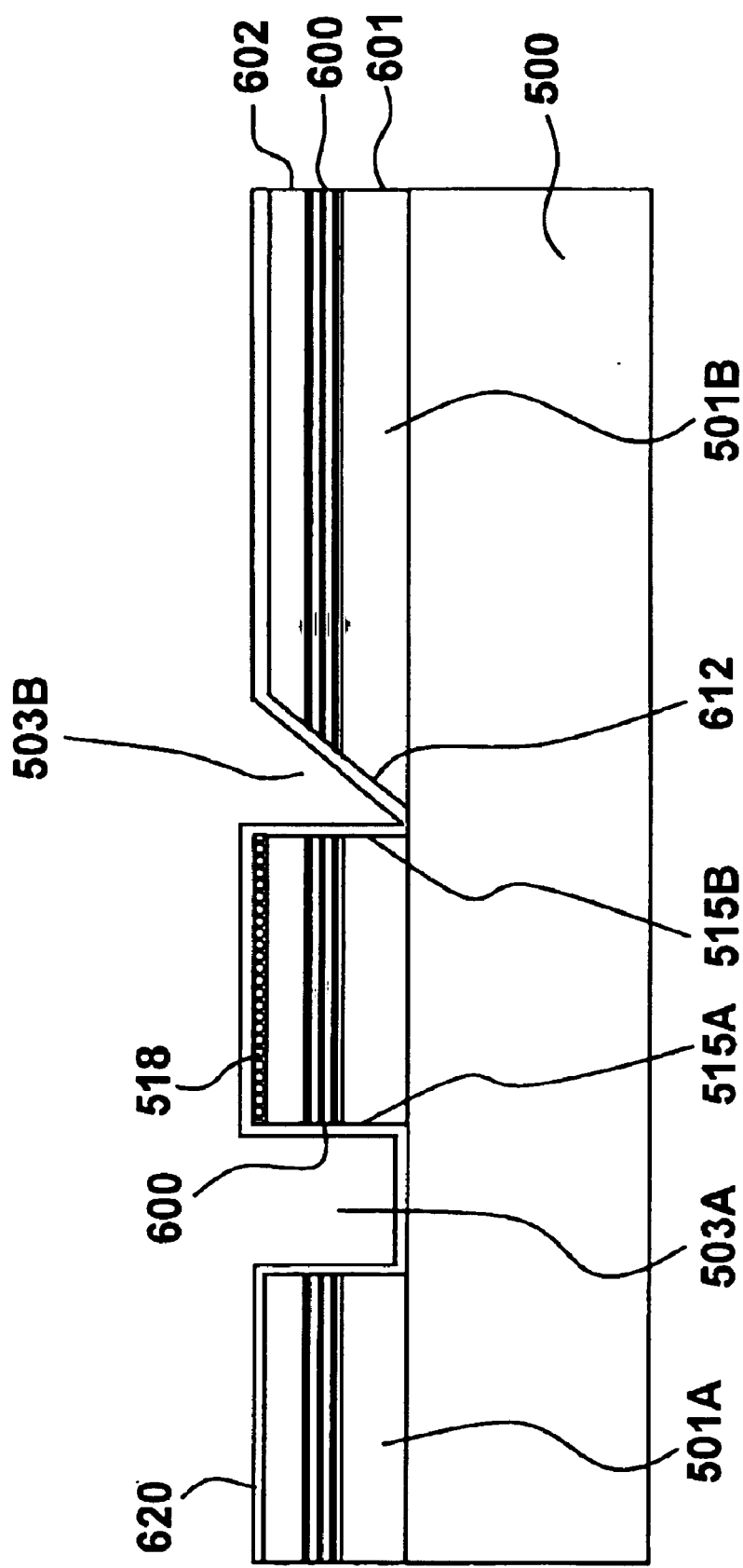

Referring now to FIG. 6D, a dielectric layer 620 is deposited across the wafer to insulate the underlying semiconductor layers and the contact layer 518 from further processing.

Figure 6E:
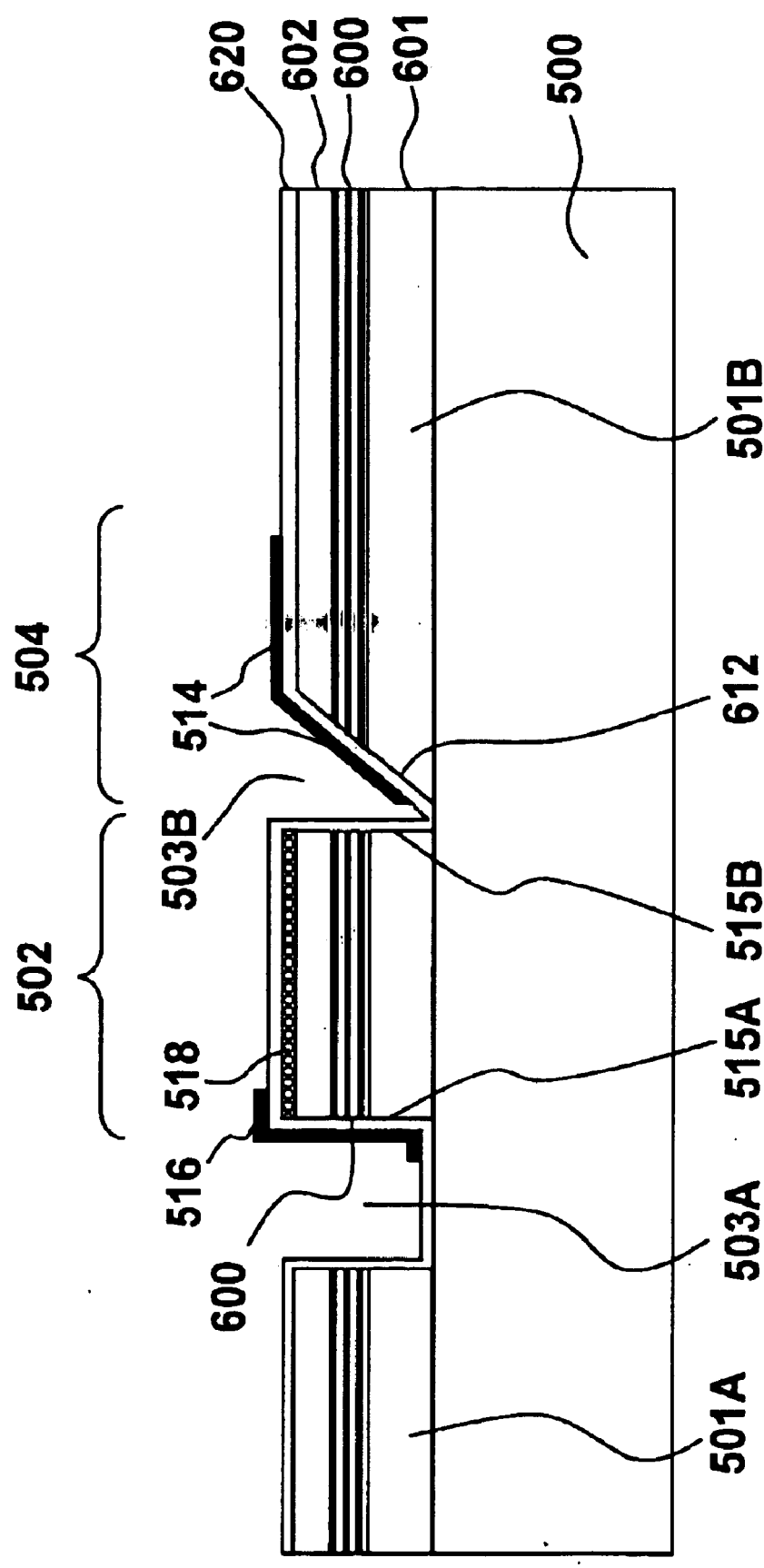

Referring now to FIG. 6E, the deflecting mirror 504 is completed by the formation of the surface portion 514 onto the dielectric layer 620 over the area of the mirror profile 612. In one embodiment, a highly reflecting metal film, such as gold (Au), is deposited over the area of the mirror profile 612 thereby forming the surface portion 514 of the deflecting mirror 504.

The same material used to form the surface portion 514 may be used to form a back mirror 516 for the edge emitting laser 502. The back mirror 516 covers over the active area layers 600 in the region of the back facet 515A. The back mirror 516 of the edge emitting laser 502 reflects photons back into the laser cavity so that emission occurs through the front facet 515B at an opposite end of the laser cavity.

Figure 6F:
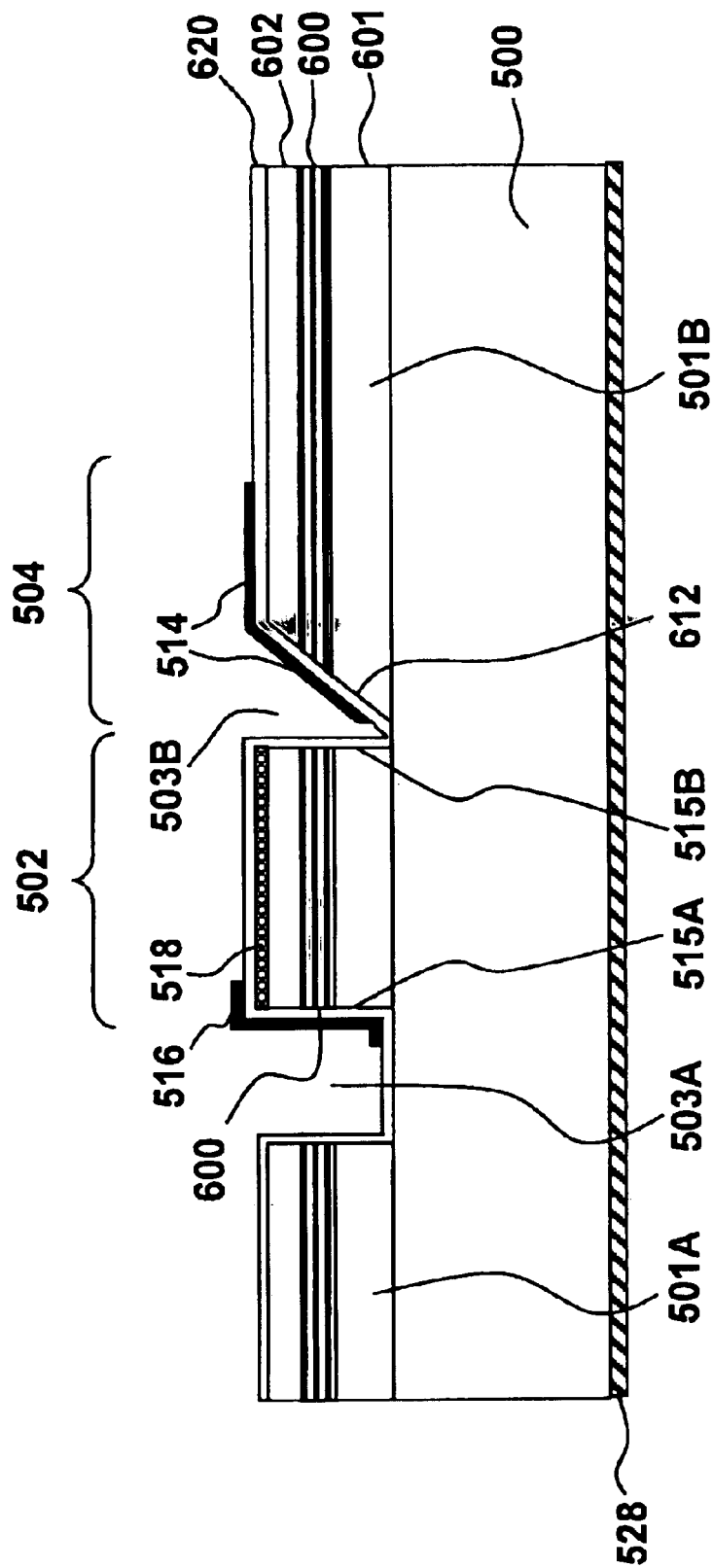

Referring now to FIG. 6F, the second contact layer 528 is applied to a surface of the substrate 500. The contact 528 provides the other one of the electrical terminals for modulating the pump laser. The contact layer 528 is formed by depositing a metal conductor over the area of the substrate across the wafer.

Figure 6G:
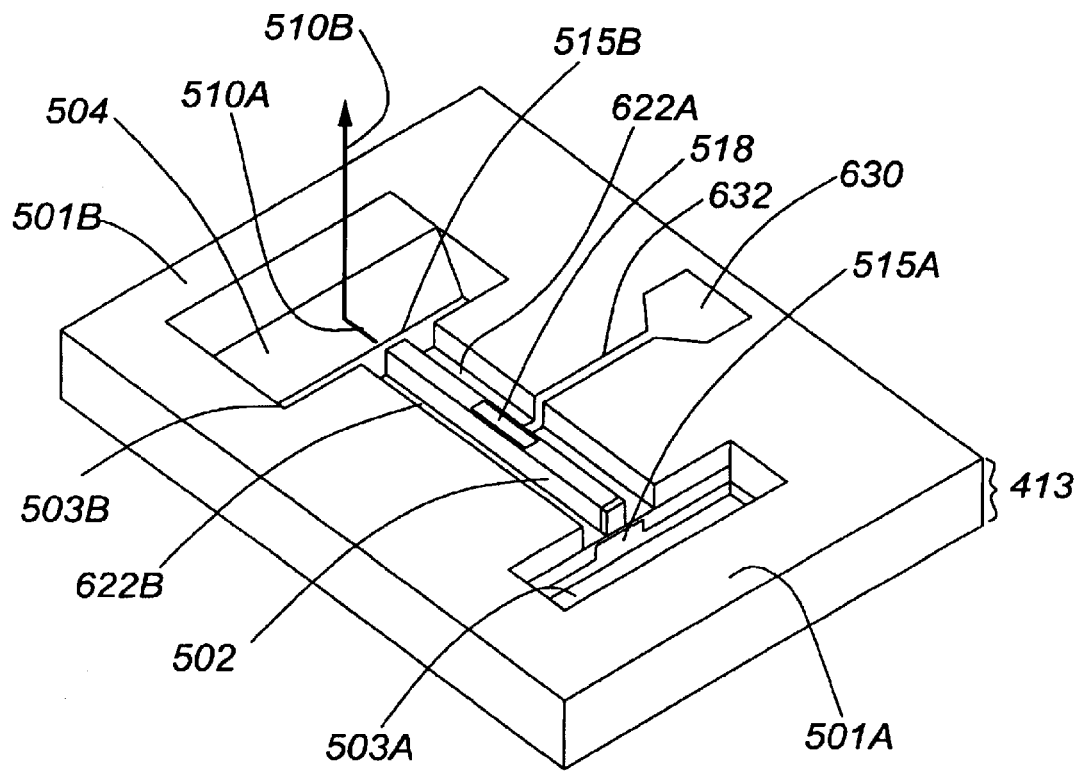
FIG. 6G is a perspective top view of the pump laser including an edge emitting laser and a light routing means.

Referring now to FIG. 6G, a perspective view of the monolithic pump laser 413 is illustrated. As previously discussed, the monolithic pump laser 413 includes the edge-emitting laser 502 and the light routing means 504. The edge emitting laser 502 is formed with the pair of open regions 503A and 503B around it. The open regions 503A and 503B were formed by etching away material and created the pair of etched facets 515A and 515B at opposite ends of the edge emitting laser 502. The light routing means 504 is formed in the open region 503B.

The optical output beam 510A from the output of the edge emitting laser 502 is redirected, reflected, or deflected, by the light routing means 504 into the redirected optical output beam 510B as illustrated.

The pair of support regions 501A and 501B are at either end nd may encircle the pump laser 413 to form a unified support region having the open regions 503A and 503B therein. A pair of side openings 622A and 622B at each side of the edge emitting laser 502 provide a gap from the unified support region, with said openings delineating the active region of the pump laser therebetween. The unified support region may or may not be conductive.

To make one of a pair of electrical connections to the pump laser 413, a bonding pad 630 is placed upon the surface of the unified support structure which is electrically coupled to the edge emitting laser 502 through a trace 632 and a contact layer 518 of the laser 502. A wire bond can be attached to the bonding pad in order to electrically couple the monolithic integrated optically pumped VCSEL.

A number of means of a bonding medium, structure and interface of the interconnect layer 403 may be used to couple the wafers 402 and 404 together to monolithically integrate the pump laser and the optically pumped VCSEL together. The interconnect layer 403 or bonding interface may consist of a bonding medium or material that can be patterned into distinct bonding geometries which delineate the individual laser devices 550 on a wafer. The bonding geometry of the bonding material may also further provide a sealed enclosure that can hermetically isolate individual pump lasers from deleterious environmental influences. In a number of embodiments, the bonding medium locally attaches each pump laser 413 to a corresponding VCSEL device 413''' that is situated on the opposing wafer. In a preferred embodiment, the bonding material consists of a eutectic solder composition, such as Au—Sn, Pb—Sn, In—Sn or elemental In.

Referring now to FIG. 7A, an exploded perspective view of an embodiment of the monolithic integrated optically pumped VCSEL 550 is illustrated. The monolithic integrated optically pumped VCSEL 550 includes the pump laser 413, the bonds 414, and the VCSEL 412'''. In FIG. 7A, a plurality of individual solder bonds 414 are used as the interconnect layer 404 each being located around the edge emitting laser 502. The solder bonds 414 on one end couple to a surface of the support structure of the pump laser 413. At an opposite end, the solder bonds couple to a surface of the DBR mirror 533 of the VCSEL 412'''.

As discussed previously, the VCSEL 412''' includes the lower DBR mirror 533, the active layer or region 532, and the upper DBR mirror 544. In FIG. 7A, an etched trench is illustrated within the upper DBR mirror around the output port of the VCSEL 412''' to form the optional index guide 540, which may be positioned nearer the top surface of active layer 532 or at the upper surface of the DBR mirror 544. The output laser beam 560 exits from the area of the upper DBR mirror 544 surrounded by the index guide 540. The output laser beam 560 may be designed to generate a range of relatively long-wavelengths including 1,310 nanometers.

As discussed previously, the pump laser includes the edge emitting laser 502 and the light routing means 504. In one embodiment, the light routing means redirects the output from the edge emitting laser by approximately ninety degrees.

Referring now to FIG. 7B, an exploded perspective view of another embodiment of the monolithic integrated optically pumped VCSEL 550' is illustrated.

The monolithic integrated optically pumped VCSEL 550' includes the pump laser 413, the bonds 414', and the VCSEL 412'''.

In FIG. 7B, a solder wall 414' is used as the interconnect layer 404 around the edge emitting laser 502. The solder wall 414' couples on one side (bottom side) to a surface of the support structure of the pump laser 413. At an opposite side (top side), the solder wall 414' couples to a surface of the DBR mirror 533 of the VCSEL 412'''.

The solder wall 414' surrounds the pump laser 413 and the light routing means 504 near the edges of the pump laser 413 to provides a sealed enclosure that hermetically isolates the pump laser from deleterious environmental influences. In a preferred embodiment, the solder wall 414' is formed of a eutectic solder composition, such as Au—Sn, Pb—Sn, In—Sn or elemental In.

It is understood that FIG. 7B illustrates an instance of a solder wall 414' of an array of solder walls 414' of the interconnect layer 404 that couples a single instance of the pump laser 413 and the VCSEL 412''' together. It is understood that FIG. 7A illustrates an instance of solder bumps 414 of an array of solder bumps 414 of the interconnect or bonding layer 404 that couples a single instance of the pump laser 413 and the VCSEL 412''' together.

The monolithic optically pumped VCSEL 550 is readily applicable to the implementation of any other wavelength in the infrared, including but not limited to the 1.3 $\mu$m and 1.5 $\mu$m telecommunication bands. Application to any output wavelength can be achieved by simply choosing an appropriate design for the VCSEL 412''' that provides an active region 532 with a suitable gain spectrum, and adjusting the thicknesses of the DBR mirrors 533 and 544. In a preferred embodiment, only one of the DBR mirrors is epitaxially grown, while the second DBR is comprised of deposited dielectric layers. With the second DBR being comprised of deposited dielectric layers, the upper limit on the total DBR mirror thickness that is imposed by epitaxial growth is not a factor. Thus with a dielectric DBR mirror longer wavelengths can be achieved, including into the mid infrared (1R) spectrum (i.e., up to approximately 2.2 $\mu$m in wavelength).

Examples of long wavelength active gain media that can be used with for the long wavelength VCSEL 412''' of the monolithic optically pumped VCSEL 550 include: gallium-indium-arsenide-nitride (GaInAsN) and gallium-indium-arsenide-nitride-antimony (GaInAsNSb) quantum wells for the 1.20 $\mu$m to 1.5 $\mu$m band, indium-gallium-arsenide-phosphide (InGaAsP) and indium-gallium-aluminum-arsenide (InGaAlAs) quantum wells for the 1.3 $\mu$m to 1.6 $\mu$m band, gallium-arsenide-antimony (GaAsSb) quantum wells for the 1.2 µm to 1.3 µm band, and aluminum-gallium-arsenide-antimony (AlGaAsSb) quantum wells for the 1.5 µm band and beyond, and indium-arsenide/indium-gallium-arsenide (InAs/InGaAs) quantum dot and quantum dash layers for the 1.3 µm to 1.6 µm band.

Examples of epitaxially grown DBR mirrors include layer pairs of gallium-arsenide/aluminum-arsenide (GaAs/AlAs) and selectively oxidized gallium-arsenide/aluminum-oxide (GaAs/AlO$_x$) DBR's grown on gallium-arsenide (GaAs) substrates; gallium-arsenide-antimonide/gallium-arsenide-antimonide (GaAsSb/AlAsSb), indium-phosphide/indium-aluminum-gallium-arsenide (InP/InAlGaAs), and metamorphic gallium-arsenide/aluminum-arsenide (GaAs/AlAs) DBR's grown on indium-phosphide (InP) substrates. Examples of deposited dielectric DBR mirrors include pairs of layers silicon-dioxide/titanium-dioxide (SiO$_2$/TiO$_2$) and magnesium-difluoride/zinc-selenium (MgF$_2$/ZnSe) dielectric stacks.

For each combination of choices for the active layer and DBR mirrors of the LW-VCSEL 412''', the only criterion is that the DBR materials must be non-absorbing at the pump laser wavelength (0.8 µm to 1.3 µm). In a preferred embodiment for a 1.3 µm or a 1.5 µm VCSEL 412''', the active layer 532 comprises multiple stacks of indium-aluminum-gallium-arsenide/indium-phosphide (InAlGaAs/InP) quantum wells arranged in a resonant periodic gain geometry, with a metamorphic gallium-arsenide/aluminum-arsenide (GaAs/AlAs) lower DBR mirror 533 and a silicon-dioxide/titanium-dioxide (SiO$_2$/TiO$_2$) dielectric upper DBR mirror 544.

In certain applications, such as wavelength division multiplexing (WDM), an array of semiconductor lasers operating at different center carrier wavelengths is desirable. Each different wavelength of light can be multiplexed into a single fiber to carry multiple channels (i.e., one for each different wavelength) of information thereon. This can increase the bandwidth of information carried over a single optical fiber. The monolithic optically pumped VCSEL 550 is readily adapted to provide an array of VCSELs whose individual lasing elements emit at different wavelengths.

Referring now to FIG. 8A, a multiple wavelength optically pumped VCSEL array 800A is illustrated. The array 800A is suitable for coarse wavelength division multiplexing (CWDM) or dense wavelength division multiplexing (DWDM) applications, in optical communication networks.

The multiple wavelength optically pumped VCSEL array 800A may be formed using the same wafer bonding techniques and similar wafer processing techniques, with a few modifications, as that of the monolithic optically pumped VCSEL 550. For example, the substrate 803 in FIG. 8A is similarly removed as is substrate 530 in FIG. 5D.

The array 800A includes the pump laser 413, the bonds 414 and a VCSEL array 812. The pump laser 413 and the bonds 414 are described previously and not repeated here for reasons of brevity.

The VCSEL array 812 includes a repetitive pattern of VCSELs or lasing elements 812i for each pump laser 413. The VCSEL array 812 includes an upper DBR mirror portion 844, active region portion 832, and the lower DBR mirror 533. Each VCSEL lasing element 812$_i$ includes a portion of the lower DBR mirror 533, an active region element 832i, and an upper DBR mirror element 844i. Each VCSEL lasing element 812$_i$ may further have the optional index guide 540.

The VCSEL array 812 receives the laser beam output 510B of the pump laser 413 and generates a plurality of laser beam outputs each having a different wavelength. In FIG. 8A, the VCSEL array 812 provides two instances 822A and 822B of four laser beam outputs 860A–860D, each having a different wavelength (λ1–λ4) respectively, for the one pump laser 413. It is understood that the number of laser beam outputs with different wavelengths provided by the VCSEL array 812 can be expanded or contracted to have a plurality of N laser beam outputs 860.

The provision of the multiple wavelengths in the array 800A by using the VCSEL array 812 may also be referred to as wavelength grading. In one embodiment, the wavelength grading is achieved by modifying the thickness of an active region 832$_i$ for each lasing element 812i in the array 812. In FIG. 8A, the VCSEL array 812 provides two instances 822A and 822B of four lasing elements 812A–812D. Each of the four lasing elements 812A–812D provide a different wavelength (λ1–λ4) of laser beam output 860A–860D, respectively. In FIG. 8A, the active regions 832A–832D of the four lasing elements 812A–812D vary in thickness over thicknesses 833A–833D in each respectively. The different thicknesses 833A–833D in each changes the phase of the resonant cavity and shifts the respective resonance wavelength from one lasing element to the next to generate the different wavelengths (λ1–λ4) of respective laser beam outputs 860A–860D.

In adapting the monolithic optically pumped VCSEL 550 to the multiple wavelength optically pumped VCSEL array 800A for CWDM applications, the thickness of the active layers or active region 832 can be changed by removing (i.e., by etching away, possibly with etch stop layers) appropriate fixed increments of material from the active region prior to the deposition of the dielectric DBR mirror for each lasing element 812i. This may be achieved by simply using etch masks to define the different areas of the active layers or active region 832 to be etched during successive etching steps in each lasing element 812i. By using N etching steps, and by subdividing each previously etched region into two lateral sections one of which is masked off during the subsequent etch step, the number of etched levels is doubled with each additional etching step. In this manner, N etch steps may be sufficient to produce $2^N$ wavelength bands.

Referring now to FIG. 8B, a multiple wavelength optically pumped VCSEL array 800B is illustrated. The multiple wavelength optically pumped VCSEL array 800B is similar to the multiple wavelength optically pumped VCSEL array 800A but for a different method of forming differing cavity lengths in each VCSEL element.

In adapting the monolithic optically pumped VCSEL 550 to the multiple wavelength optically pumped VCSEL array 800B for DWDM applications, more continuous wavelength grading can be achieved by spatially varying the local growth rate of the epitaxial DBR mirror 533' and of the active layers or active region 832' to vary the resonance wavelength of each VCSEL element 812A'–812D' in the VCSEL array 812'. In this approach, topology-controlled epitaxial growth (TCE) on a patterned substrate surface formed by metal organic chemical vapor deposition (MOCVD) is used to enhance the local epitaxial growth rate of the epitaxial DBR mirror 533' and the active layers or active region 832' across the surface by different amounts. This forms a different thickness 833' in the active region 832' of each element and a different thickness 834' in the lower DBR 533' of each VCSEL element 812A'–812D'. The different thicknesses 833' and 834' in each VCSEL element allows the resonant cavity in each to be different and generate the different wavelengths (λ1'–λ4') of respective laser beam outputs 860A'–860D'. A broadband dielectric upper DBR mirror 844' is then deposited on the active layers or active region 832'. The broadband dielectric upper DBR mirror 844' has the same thickness 835 for each VCSEL element 812A'–821D'. With the varying growth rates, the resonance wavelength of the VCSEL can be shifted by fixed increments across the surface of the wafer in a controllable manner. The pump laser 413 and the bonds 414 described previously which are used with the optically pumped VCSEL array remain unchanged and are not repeated here for reasons of brevity.

In some applications, including WDM, it is desirable to provide a tunable VCSEL. That is, it is desirable that the center carrier wavelength of the laser beam output from the VCSEL be selectively tunable. The monolithic optically pumped VCSEL 550 can also be adapted with a few modifications to provide a continuous wavelength tuning capability.

Referring now to FIG. 9A, a first embodiment of a continuously wavelength tunable monolithically integrated optically pumped VCSEL 900A is illustrated. The continuously wavelength tunable monolithically integrated optically pumped VCSEL 900A includes the pump laser 413, the bonds 414 and a tunable long-wavelength VCSEL 912A. The pump laser 413 and the bonds 414 are described previously and not repeated here for reasons of brevity. In response to electrically pumping the pump laser 413 and applying a wavelength selection voltage/current to the tunable long-wavelength VCSEL 912A, the variable wavelength laser beam output $\lambda_v$ 960A is generated.

The continuously wavelength tunable monolithically integrated optically pumped VCSEL 900A may be formed using the same wafer bonding techniques and similar wafer processing techniques, with a few modifications, as that of the monolithic optically pumped VCSEL 550.

To form the first embodiment of the continuously wavelength tunable monolithically integrated optically pumped VCSEL 900A, the upper dielectric DBR mirror 544 of the fixed wavelength VCSEL of FIG. 5F is replaced by an adjustable air gap 924A bounded above by an electromechanically deformable upper dielectric DBR mirror 944A. In order to form the air gap 924A and a support structure 946A for the dielectric DBR 944A, portions of a sacrificial layer are selectively undercut to form the air gap 924A. The remaining portions of the sacrificial layer support the suspended dielectric DBR mirror 944A as the support structure 946A. The sacrificial layer and the support structure 946A may be comprised of selectively removable semiconductor material such as gallium-arsenide (GaAs). Alternatively, the sacrificial layer and the support structure 946A may consist of a patternable and selectively removable polymeric material.

The portion of the upper DBR mirror 944A over the air gap 924A is deformable. The upper DBR mirror 944A may be comprised of deposited dielectric material paired layers such as silicon-dioxide/titanium-dioxide ($SiO_2/TiO_2$) or magnesium-difluoride/zinc-selenide ($MgF_2/ZnSe$) quarter-wavelength layers. The resonant cavity of the continuously wavelength tunable long wavelength VCSEL 900A is comprised of the active layer 532 and the adjustable air gap 924A. The resonant cavity is bounded by the dielectric DBR mirror 944A above and the metamorphic DBR 533 below. The dielectric DBR 944A functions as an adjustable convex mirror. The resonant cavity between the DBR mirrors is adjusted by using an electromagnetic or electrostatic field to deform the upper DBR mirror 944A. Deformation of the upper DBR mirror 944A adjusts the distance "d" in the air gap 924A between the upper DBR mirror 944A and the active region 532.

To form the electromagnetic or electrostatic field to adjust the air gap 924A and the DBR mirror 944A, electrical contacts or electrodes 926 and 927A are provided. The electrical contact 927A is coupled to a surface on top of the dielectric DBR mirror 944A, except for an open area 925A of the exit port of the VCSEL. The electrical contact 926 is coupled to a portion of the active layer 532 within the air gap 924A. The wavelength selection voltage/current is applied to the electrodes 926–927A to generate an electromagnetic or electrostatic field there-between which electromechanically deforms the flexible dielectric DBR layers of the DBR mirror 944A, changing the thickness or distance "d" of the air gap 924A and the length of the resonant cavity. Although not necessary as the VCSEL 912B is optically pumped, an insulating layer such as a dielectric may be positioned between the active layer 532 and the contact layer 926.

The change in distance "d" alters the resonant cavity and shifts the resonance wavelength. The variation in the distance "d" and the resonant cavity of the VCSEL 912A is proportional to the voltage applied to the contacts or electrodes 926–927A. By linearly adjusting the voltage, the distance "d" is continuously adjustable over a range.

The tunable long-wavelength VCSEL 912A includes the lower DBR 533, the active layer 532 with/without optional index guide 540, support structure 946A, air gap 924A, contacts 926–927A, and the upper DBR 944A coupled together as show in FIG. 9A. Because the optically-pumped VCSEL 900A provides direct electrical modulation via the pump laser 413, whose modulation is directly transferable to the VCSEL output 960A, neither an external laser source nor an external modulator is needed in this first embodiment of the tunable VCSEL.

Referring now to FIGS. 9D–9F, top views of alternate embodiments of the wavelength tunable monolithic optically pumped long wavelength VCSEL of FIG. 9A are illustrated. FIG. 9D is a top view of the wavelength tunable monolithic optically pumped long wavelength VCSEL 900A. FIG. 9E is a top view of the wavelength tunable monolithic optically pumped long wavelength VCSEL 900A'. FIG. 9F is a top view of the wavelength tunable monolithic optically pumped long wavelength VCSEL 900A".

FIGS. 9D–9F contrast different types of support structures 946A, 946A', and 946A" for the wavelength tunable VCSEL and the corresponding modifications of the layers above and below. FIG. 9D illustrates a rectangular air gap 924A with a pair of support structures 946A at opposite ends thereof. FIG. 9E illustrates a cylindrical air gap 924A' with a cylindrical support structure 946A' surrounding it. The cylindrical air gap 924A' may be a number of cylindrical shapes including rectangular or square, hexagonal, or circular as illustrated in FIG. 9E. FIG. 9F illustrates an air gap 924A" which has a shape of a geometric shape of a plus sign between the supports 946A".

In FIG. 9D to correspond with the rectangular air gap 924A, the DBR mirror 944A is formed as a solid rectangular shape supported at each end 924A by the pair of support structures 946A. The DBR mirror 944A extends into and covers the air gap 924B from the pair of support structures 946A. Pairs of rectangular contacts 926 and 927A are provided with the pair of contacts 926 substantially overlapped by the pair of contacts 927A. The pair of rectangular contacts 926 and 927A have a space or opening 925A respectively between them within the air gap 924C around the output port. The optional index guide 504 is a cylindrical ring shape in the active region around the output port.

In FIG. 9E to correspond with the cylindrical air gap 924A', the support structure 946A' is rectangularly shaped with a centered cylindrical opening 925A' near its center forming the air gap 924A'. The DBR mirror 944A' is rectangularly shaped extending into and covering over the air gap 924A' from the support structure 946A'. The outer perimeter or outside part of the DBR mirror 944A' is coupled or joined to the support structure 946B' for support. The contact 926' on the active region is a cylindrical ring shape with the center opening 925A' centered on the output port of the VCSEL. The contact 927A' may have a similar shape to the contact 926' or may be shaped somewhat similar to the support structure but with a smaller center cylindrical opening 925A'. In one embodiment, the contact 927A' is cylindrical ring shaped (not shown) and substantially overlaps the contact 926'. In another embodiment, the contact 927A' is rectangularly shaped with the cylindrical opening 925A' near its center and substantially overlaps the contact 926' as illustrated in FIG. 9E. The cylindrical openings 925A' in each layer may be a number of cylindrical shapes including rectangular or square, hexagonal, or circular as illustrated in FIG. 9E. The VCSEL 900A' may include the optional index guide 504 which is a cylindrical ring shape in the active region around the output port.

The contacts 926 and 927A in FIG. 9D and the contacts 926' and 927A' in FIG. 9E are overlapping. However the VCSEL may be formed such that the contacts are non-overlapping.

In FIG. 9F, the contacts 926" and 927A" are non-overlapping. An electrostatic or electric field may still be applied to cause the upper DBR mirror 944A" to flex so as to adjust the distance d and the length of the resonant cavity. With the length of the resonant cavity changing, the wavelength of light generated by the VCSEL changes as well.

To correspond with the air gap 924A" in the shape of a plus sign, the support structures 946A" are rectangularly shaped as a pedestal at each end of the plus sign. The support structures 946A" support the upper DBR mirror 944A and the contact 927A" at each end over the air gap 924A". The upper DBR mirror 944A also has a pair of cross beams in the shape of a plus sign which extend over the air gap 924A" through the output port. The contact 927A" also has a pair of cross beams in the shape of a plus sign with an opening 925A" at a cross point in the middle. The opening 925A" at the cross point in the middle is located over the output port to allow the laser beam to be emitted. The VCSEL 912A" may include the optional index guide 504 which is a cylindrical ring shape in the active region around the output port.

The electromechanical flexion of the DBR mirror 944A in the first embodiment of the continuously wavelength tunable monolithically integrated optically pumped VCSEL 900A illustrated in FIG. 9A, may have a divergence in the reflected light back into the laser cavity and thus create excessive loss in the optical feedback of the resonant cavity. The excessive loss in optical feedback may be reduced.

Referring now to FIG. 9B, a second embodiment of a continuously wavelength tunable monolithically integrated optically pumped VCSEL 900B is illustrated. The continuously wavelength tunable monolithically integrated optically pumped VCSEL 900B includes the pump laser 413, the bonds 414 and a tunable long-wavelength VCSEL 912B. The pump laser 413 and the bonds 414 are described previously and not repeated here for reasons of brevity. In response to electrically pumping the pump laser 413 and applying a wavelength selection voltage to the tunable long-wavelength VCSEL 912B, the variable wavelength laser beam output $\lambda_v$ 960B is generated.

The tunable long-wavelength VCSEL 912B includes the lower DBR 533, the active layer 532 with/without optional index guide 540, support structure 946B, air gap 924B, contacts 926–927A, and an upper DBR 944B coupled together as show in FIG. 9B.

The continuously wavelength tunable monolithically integrated optically pumped VCSEL 900B may be formed using the same wafer bonding techniques and similar wafer processing techniques, with a few modifications, as that of the monolithic optically pumped VCSEL 550.

The upper DBR 944B is formed from two parts, an upper portion 944BU and a lower portion 944BL, using differing material layers. The lower portion 944BL is a material layer, such as silicon-nitride (SiN) for example, which is sufficiently strong mechanically and whose coefficient of thermal expansion is similar to that of the underlying semiconductor layers of the VCSEL 912B.

The upper portion 944BU is a dielectric DBR stack with a lower coefficient of thermal expansion, such as pair layers of silicon-dioxide/titanium-dioxide ($SiO_2/TiO_2$). The upper portion 944BU of the upper DBR 944B is formed to extend over an opening 925B in the lower DBR 944BL and the contact 927B in the output port of the VCSEL 900B. This allows the output laser beam 960B to avoid the lower DBR 944BL in the output port region as well as the contact 927B. The upper portion 944BU of the upper DBR 944B may be spatially in an area of the output pump laser beam and need not extend across the entire surface area of the pump laser 413 as illustrated in FIG. 9B.

The dielectric DBR 944B, including the layers of the upper portion 944BU and the lower portion 944BL, are deposited at relatively high temperatures. Upon cooling of the different material layers, a differential contraction occurs between the layers of the upper portion 944BU and the lower portion 944BL of the dielectric DBR 944B. This differential contraction results in a bending of the dielectric portion (i.e., the upper portion 944BU) to form a concave mirror surface with respect to the laser beam 960B, as is illustrated in FIG. 9B.

Optical reflection of the concave mirror surface formed in the upper portion 944BU of the dielectric DBR 944B increases the optical feedback efficiency of the VCSEL 912B and preferentially favors the dominant $TEM_{00}$ mode of the laser 900B over all other modes.

Other elements of the VCSEL 912B are similar to those of the VCSEL 912A. The active region 532, the lower DBR mirror 533 of the VCSEL 912B remain essentially the same as in the first embodiment of the VCSEL 912A and are not repeated here for brevity. The support structure 946B is similar to the support structure 946A but for the differing elements to which they couple to. The contact 927B is similar to the contact 927A but for the differing elements to which they couple to. The air gap 924B is similar to the air gap 924A but for the different elements surrounding the air gap and the differences in the variable distances "x" and "d" of the resonant cavity.

A change in the distance "x" alters the resonant cavity and shifts the resonance wavelength for the laser beam 960B. The variation in the distance "x" and the resonant cavity of the VCSEL 912B is proportional to the voltage/current applied to the contacts or electrodes 926–927B. By linearly adjusting the voltage/current applied to the contacts or electrodes, the distance "x" is continuously adjustable over a range.

To form an electromagnetic or electrostatic field to adjust the air gap 924B, distance "x", and the DBR mirror 944B, electrical contacts or electrodes 926 and 927B are provided. The electrical contact 927B has one surface coupled to a surface on top of the support structure 946B and extends into a portion of area of the air gap 924B but for the exit port of the VCSEL 912B. A portion of the opposite surface of the electrical contact 927B couples to at outside portion of a surface of the dielectric DBR 944B. The electrical contact 926 is coupled to a portion of the active layer 532 within the air gap 924B. The wavelength selection voltage/current is applied to the electrodes 926 and 927B. This generates an electromagnetic or electrostatic field between the electrodes 926 and 927B which electromechanically deforms a portion of the flexible dielectric DBR layers of the DBR mirror 944B. The deformation in the flexible dielectric DBR layers of the DBR mirror 944B changes the thickness or distance "x" of the air gap 924B.

Figure 9I:
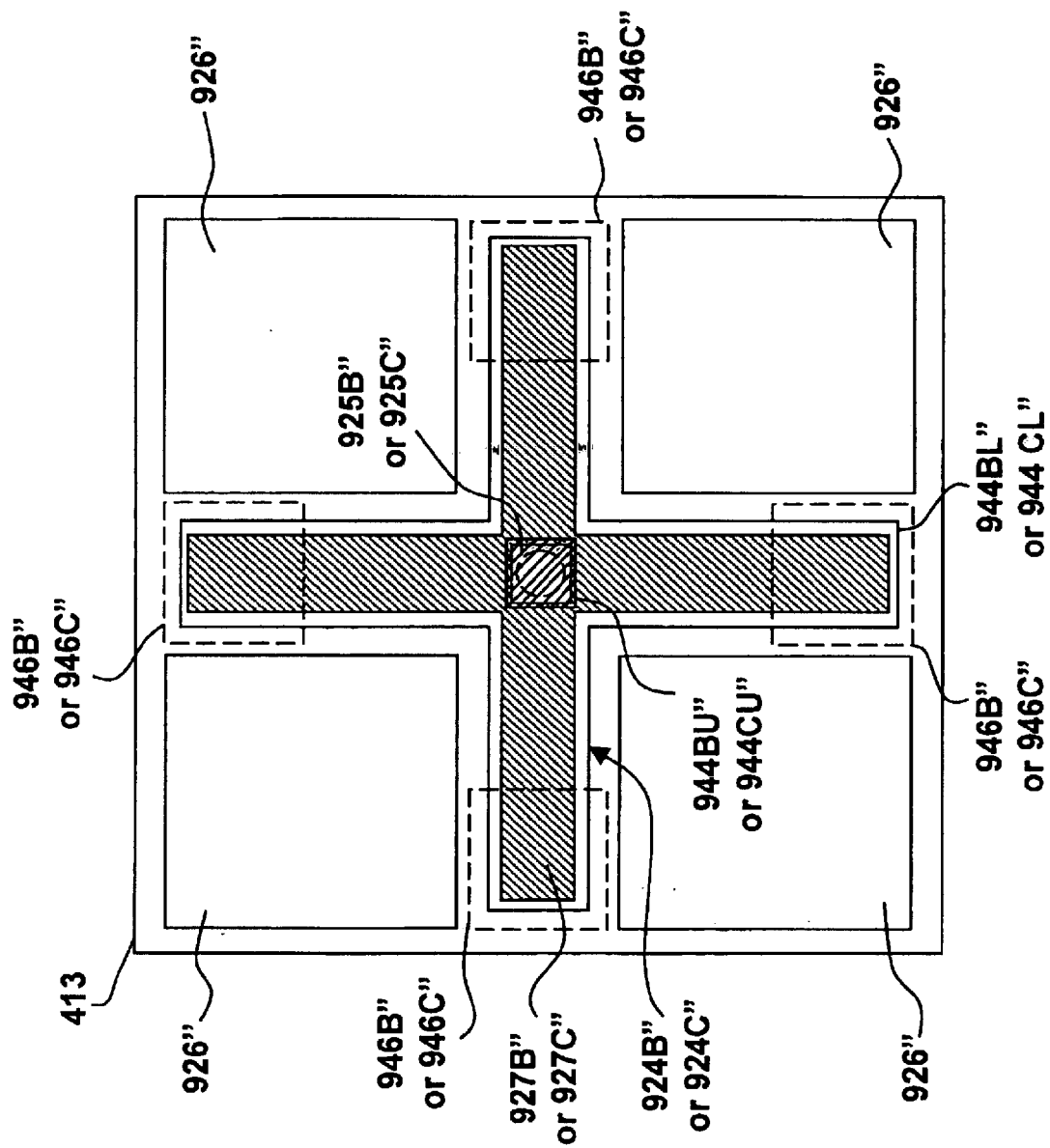

Referring now to FIGS. 9G–9I, top views of alternate embodiments of the wavelength tunable monolithic optically pumped long wavelength VCSELs of FIG. 9B are illustrated. FIG. 9G is a top view of the wavelength tunable monolithic optically pumped long wavelength VCSEL 900B. FIG. 9H is a top view of the wavelength tunable monolithic optically pumped long wavelength VCSEL 900B'. FIG. 9I illustrates an air gap 924B" which has a shape of a plus sign between the supports 946B".

FIGS. 9G–9I contrast different types of support structures 946B, 946B', and 946B" and the corresponding modifications of the layers above and below. FIG. 9G illustrates a rectangular air gap 924B with a pair of support structures 946B at opposite ends thereof. FIG. 9H illustrates a cylindrical air gap 924B' with a cylindrical support structure 946B' surrounding it. The cylindrical air gap 924B' may be a number of cylindrical shapes including rectangular or square, hexagonal, or circular as illustrated in FIG. 9H. FIG. 9I illustrates an air gap 924A" which has a shape of a plus sign between the supports 946A".

In FIG. 9G to correspond with the rectangular air gap 924B, the lower portion 944BL of the DBR mirror 944B is formed as a pair of solid rectangular shapes supported at each end 924B by the pair of support structures 946B. Each of the pair of solid rectangular shapes of the lower portion 944BL extends into the air gap 924B from the pair of support structures 946B leaving a gap between them. Pairs of rectangular contacts 926 and 927B are provided with the pair of contacts 926 substantially overlapped by the pair of contacts 927B. The pair of rectangular contacts 926 and 927B also have the gap between them respectively within the air gap 924C. The upper portion 944BU of the DBR mirror 944B is formed as a solid rectangular shape supported at each end over the air gap 924B on the ends of the pair of solid rectangular shapes of the lower portion 944BL.

In FIG. 9H to correspond with the cylindrical air gap 924B', the lower portion 944BL' of the DBR mirror 944B' is formed as a rectangular shape with a centered cylindrical opening near its center over the output port. The inside part of the lower portion 944BL' extends into the air gap 924B' from the support structure 946B'. The outer perimeter or outside part of the lower portion 944BL' is coupled or joined to the support structure 946B' for support. The contact 926' on the active region is a cylindrical ring shape with a center opening centered on the output port of the VCSEL. The contact 927B' may have a similar shape to the lower portion 944BL or the contact 926'. In one embodiment, the contact 927B' is cylindrical ring shaped (not shown) and substantially overlaps the contact 926'. In another embodiment, the contact 927B' rectangularly shaped with a cylindrical opening near its center and substantially overlaps the contact 926' as illustrated in FIG. 9H. The cylindrical openings in each layer may be a number of cylindrical shapes including rectangular or square, hexagonal, or circular as illustrated in FIG. 9H.

The upper portion 944BU' of the DBR mirror 944B' is formed as a solid cylindrical shape and covers over the air gap 924B' in the output port. The upper portion 944BU' is supported at its outer part over the air gap 924B' by the lower portion 944BL'. The outer part of the upper portion 944BU' may overlap on top of the contact 927B' as illustrated in FIG. 9H.

The contacts 926 and 927B in FIG. 9G and the contacts 926' and 927B' in FIG. 9H are overlapping. However the VCSEL may be formed such that the contacts are non-overlapping.

In FIG. 9I, the contacts 926" and 927B" are non-overlapping. An electrostatic or electric field may still be applied to cause the lower portion 944BL" of the upper DBR mirror 944B" to flex so as to adjust the distance x between the active region 532 and the upper portion 944BU" thereby adjusting the length of the resonant cavity. With the length of the resonant cavity changing, the wavelength of light generated by the VCSEL changes as well.

To correspond with the air gap 924B" in the shape of a plus sign, the support structures 946B" are rectangularly shaped as a pedestal at each end of the plus sign. The support structures 946B" support the lower portion 944BL" of the upper DBR mirror 944B" and the contact 927B" at each end over the air gap 924B". The upper portion 944BU" of the upper DBR mirror 944B" couples to an edge of the contact 927B" around the opening 925B". The upper portion 944BU" is cylindrically shaped to cover over the cylindrically shaped opening 925B". But for the opening 925B", the lower portion 944BL" of the upper DBR mirror 944B" extends over the air gap 924B" as a pair of cross beams in the shape of a plus sign. The contact 927B" also has a pair of cross beams in the shape of a plus sign with the opening 925B" at the cross point in the middle. The opening 925B" at the cross point in the middle is located over the output port to allow photons in the cavity to couple into the upper portion 944BU" of the upper DBR mirror 944B" and to allow emission of the laser beam 960B. The VCSEL 912B" may include the optional index guide 504 which is a cylindrical ring shape in the active region around the output port.

Referring now to FIG. 9C, a third embodiment of a continuously wavelength tunable monolithically integrated optically pumped VCSEL 900C is illustrated. The continuously wavelength tunable monolithically integrated optically pumped long wavelength VCSEL 900C includes the pump laser 413, the bonds 414 and a tunable long-wavelength VCSEL 912C. The pump laser 413 and the bonds 414 are described previously and not repeated here for reasons of brevity. In response to electrically pumping the pump laser 413 and applying a wavelength selection voltage to the tunable long-wavelength VCSEL 912C, the variable wavelength laser beam output $\lambda_v$ 960C is generated.

The tunable long-wavelength VCSEL 912C includes the lower DBR 533, the active layer 532 with/without optional index guide 540, support structure 946C, air gap 924C, contacts 926 and 927C, and the upper DBR mirror 944C coupled together as show in FIG. 9C. The upper DBR mirror 944C is flexible in that it can be deformed to adjust the air gap 924C and a thickness thereof or a cavity distance "y".

The continuously wavelength tunable monolithically integrated optically pumped long wavelength VCSEL 900C may be formed using the same wafer bonding techniques and similar wafer processing techniques, with a few modifications, as that of the monolithic integrated optically pumped long-wavelength VCSEL 550.

In the tunable long-wavelength VCSEL 912C, a lower portion 944CL of the upper DBR mirror 944C may comprise a few periods of alternating indexed paired layers of an epitaxially grown DBR mirror, such as indium-phosphide/indium-aluminum-gallium-arsenide (InP/InAlGaAs). The upper portion 944CU of the upper DBR mirror 944C is the same as the upper portion 944BU previously described above with reference to FIG. 9B. The upper portion 944CU of the upper DBR 944C is formed to extend over an opening 925C in the lower DBR 944CL and the contact 927C in the output port of the VCSEL 900C. This allows the output laser beam 960C to avoid the lower DBR 944CL in the output port region as well as the contact 927C. The upper portion 944CU of the upper DBR 944C may be spatially in an area of the output pump laser beam and need not extend across the entire surface area of the pump laser 413 as illustrated in FIG. 9C. The upper DBR 944CU and lower DBR 944CL are comprised of materials with different coefficients of thermal expansion. Following the high temperature deposition of the upper portion 944CU, a differential contraction occurs between the layers of the upper portion 944CU and the lower portion 944CL of the DBR 944C. This differential contraction results in a bending of the dielectric portion (i.e., the upper portion 944CU) to form a concave mirror surface with respect to the laser beam 960C, as is illustrated in FIG. 9C.

The support structure 946C is similarly formed out of a sacrificial layer or layers (e.g., InP bounded on both sides by a quaternary InGaAsP layer). The sacrificial layer and the layers of the lower portion 944CL of the upper DBR mirror 944C are grown at the same time as the active layer 532 and the lower DBR mirror 533. The air gap 924C and the support structure 946C are formed by etching through the sacrificial layer and under the lower portion 944CL of the upper DBR mirror 944C. That is the sacrificial layer is undercut beneath the lower portion 944CL of the upper DBR mirror 944C. The contacts 926 may then deposited within the air gap 624C onto the surface of the active layer 532. Although not necessary as the VCSELs 912B and 912C are optically pumped, an insulating layer such as a dielectric may be positioned between the active layer 532 and the contact layer 926.

Other elements of the VCSEL 912C are similar to those of the VCSEL 912A and 912B. The active region 532, the lower DBR mirror 533 of the VCSEL 912C remain essentially the same as in the first embodiment of the VCSEL 912A and are not repeated here for brevity. The support structure 946C is similar to the support structure 946B. The contact 927C is similar to the contact 927A but for the differing elements to which they couple to. The air gap 924C is similar to the air gap 924B but for the different elements surrounding the air gap and the differences in the variable distances "x", "y", and "d" of the resonant cavity.

A change in the distance "y" alters the resonant cavity and shifts the resonance wavelength for the laser beam 960C. The variation in the distance "y" and the resonant cavity of the VCSEL 912C is proportional to the voltage/current applied to the contacts or electrodes 926 and 927C. By linearly adjusting the voltage/current applied to the contacts or electrodes, the distance "y" is continuously adjustable over a range.

To form an electromagnetic or electrostatic field to adjust the air gap 924C, distance "y", and the DBR mirror 944B, electrical contacts or electrodes 926 and 927C are provided. The electrical contact 927C has one surface coupled to a surface on top of the support structure 946C and extends into a portion of area of the air gap 924C but for the exit port of the VCSEL 912C. A portion of the opposite surface of the electrical contact 927C couples to at outside portion of a surface of the dielectric DBR 944B. The electrical contact 926 is coupled to a portion of the active layer 532 within the air gap 924C.

The wavelength selection voltage/current is applied to the electrodes 926 and 927C. This generates an electromagnetic or electrostatic field between the electrodes 926 and 927C which electromechanically deforms a portion of the flexible DBR layers of lower portion 944CL of the DBR mirror 944C. The deformation in the flexible DBR layers of lower portion 944CL of the DBR mirror 944C changes the thickness or distance "y" of the air gap 924C. As the lower portion 944CL of the DBR mirror 944C is deformed, the upper portion 944CU of the DBR mirror 944C is also flexed and continues to provide a concave mirror surface for optical reflection within the cavity. The optical reflection from the concave mirror surface of the upper portion 944CU of the dielectric DBR 944B increases the optical feedback efficiency of the VCSEL 912C and preferentially favors the dominant $TEM_{00}$ mode of the laser 900C over all other modes.

Because there are similar features, FIGS. 9F and 9G are also top views of alternate embodiments of the wavelength tunable monolithic optically pumped long wavelength VCSEL of FIG. 9C. FIG. 9G is a top view of the wavelength tunable monolithic optically pumped long wavelength VCSEL 900C. FIG. 9H is a top view of the wavelength tunable monolithic optically pumped long wavelength VCSEL 900C'.

FIGS. 9F–9I contrast different types of support structures 946C, 946C', and 946C" and the corresponding modifications of the layers above and below. FIG. 9G illustrates a rectangular air gap 924C with a pair of support structures 946C at opposite ends thereof. FIG. 9H illustrates a cylindrical air gap 924C' with a cylindrical support structure 946C' surrounding it. The cylindrical air gap 924C' may be a number of cylindrical shapes including rectangular or square, hexagonal, or circular as illustrated in FIG. 9H. FIG. 9I illustrates an air gap 924C" which has a shape of a plus sign between the supports 946C".

In FIG. 9G to correspond with the rectangular air gap 924C, the lower portion 944CL of the DBR mirror 944C is formed as a pair of solid rectangular shapes supported at each end 924C by the pair of support structures 946C. Each of the pair of solid rectangular shapes of the lower portion 944CL extends into the air gap 924C from the pair of support structures 946C leaving a gap between them. Pairs of rectangular contacts 926 and 927C are provided with the pair of contacts 926 substantially overlapped by the pair of contacts 927C. The pair of rectangular contacts 926 and 927C also have the gap between them respectively within the air gap 924C. The upper portion 944CU of the DBR mirror 944C is formed as a solid rectangular shape supported at each end over the air gap 924C on the ends of the pair of solid rectangular shapes of the lower portion 944CL.

In FIG. 9H to correspond with the cylindrical air gap 924C', the lower portion 944CL' of the DBR mirror 944C' is formed as a rectangular shape with a centered cylindrical opening near its center over the output port. The inside part of the lower portion 944CL' extends into the air gap 924C' from the support structure 946C'. The outer perimeter or outside part of the lower portion 944CL' is coupled or joined to the support structure 946C' for support. The contact 926' on the active region is a cylindrical ring shape with a center opening centered on the output port of the VCSEL. The contact 927C' may have a similar shape to the lower portion 944CL or the contact 926'. In one embodiment, the contact 927C' is cylindrical ring shaped (not shown) and substantially overlaps the contact 926'. In another embodiment, the contact 927C' rectangularly shaped with a cylindrical opening near its center and substantially overlaps the contact 926' as illustrated in FIG. 9H. The cylindrical openings in each layer may be a number of cylindrical shapes including rectangular or square, hexagonal, or circular as illustrated in FIG. 9H.

The upper portion 944CU' of the DBR mirror 944C' is formed as a solid cylindrical shape and covers over the air gap 924C' in the output port. The upper portion 944CU' is supported at its outer part over the air gap 924C' by the lower portion 944CL'. The outer part of the upper portion 944CU' may overlap on top of the contact 927C' as illustrated in FIG. 9H.

The contacts 926 and 927C in FIG. 9G and the contacts 926' and 927C' in FIG. 9H are overlapping. However the VCSEL may be formed such that the contacts are non-overlapping.

In FIG. 9I, the contacts 926" and 927C" are non-overlapping. An electrostatic or electric field may still be applied to cause the lower portion 944CL" of the upper DBR mirror 944C" to flex so as to adjust the distance x between the active region 532 and the upper portion 944CU" thereby adjusting the length of the resonant cavity. With the length of the resonant cavity changing, the wavelength of light generated by the VCSEL changes as well.

To correspond with the air gap 924C" in the shape of a plus sign, the support structures 946C" are rectangularly shaped as a pedestal at each end of the plus sign. The support structures 946C" support the lower portion 944CL" of the upper DBR mirror 944C" and the contact 927C" at each end over the air gap 924C". The upper portion 944CU" of the upper DBR mirror 944C" couples to an edge of the contact 927C' around the opening 925C". The upper portion 944CU" is cylindrically shaped to cover over the cylindrically shaped opening 925C". But for the opening 925C", the lower portion 944CL" of the upper DBR mirror 944C" extends over the air gap 924C" as a pair of cross beams in the shape of a plus sign. The contact 927C" also has a pair of cross beams in the shape of a plus sign with the opening 925C" at the cross point in the middle. The opening 925C" at the cross point in the middle is located over the output port to allow photons in the cavity to couple into the upper portion 944CU" of the upper DBR mirror 944C" and to allow emission of the laser beam 960C. The VCSEL 912C" may include the optional index guide 504 which is a cylindrical ring shape in the active region around the output port.

All of the monolithically integrated optically pumped long-wavelength VCSELs described herein can be packaged so that they are protected, such as from dirt and dust, and so that electrical and mechanical connections can be made to them. Furthermore, the optically pumped VCSELs described herein may also be packaged with other devices and optics to provide further functionality. Once packaged, the optically pumped VCSELs can be further incorporated into higher order subassemblies and higher order assemblies.

Referring now to FIG. 10, a substrate 1000 including an integrated optically pumped VCSELs (i.e. a laser diode) 1001 and a photo diode 1002 are illustrated. The photo diode 1002 is used to monitor the power output of the integrated optically pumped VCSEL 1001. Thus, a portion of the laser output from the laser diode is coupled into the photo diode 1002. Embodiments of the laser diode 1001 are the integrated optically pumped VCSELs described and illustrated herein. Exemplary embodiments of the photo diode 1002 are a PN photo diode and a PIN photo diode.

Referring now to FIG. 11A, a packaged laser diode transmitter 1100 is illustrated. The packaged laser diode transmitter 1100 includes a package having a can 1101 with a window 1102, a header 1103, and one or more pins or leads or an electrical connector 1116. The packaged laser diode transmitter 1100 includes one of the integrated optically pumped VCSELs described and illustrated herein as the laser diode 1001 mounted inside the package. The packaged laser diode transmitter 1100 may also include a photo diode, such as photo diode 1002, to monitor the power output of the laser diode 1001.

The can 1101 couples to and around the header 1103 to form a sealed compartment to keep dirt, moisture and other contaminants from interfering with the operation and monitoring of the laser diode 1001. The window 1102 allows the photons or light generated by integrated optically pumped VCSEL to be emitted from the sealed chamber and the package. The window 1102 can also provide for a partial reflection or deflection of the photons or light output from the laser diode 1001 within the sealed chamber down to a photo diode, such as photo diode 1002, for output power measurement and control as further discussed below. The packaged transmitter 1100 and laser driving circuitry 1180 may be assembled together as part of a fiber optic transceiver module.

Referring now to FIG. 11B, a magnified cut away side view of the packaged transmitter 1100 coupled to a block diagram of laser driving circuitry 1180 is illustrated. FIG. 11B also illustrates the function of a slanted window can or cap 1101. The slanted window can, lid, or cap 1101 supports the window 1102 above and aligned with the semiconductor laser 1001 to receive a laser beam output 1160. The slanted window 1102 being on an angle functions as a beam splitter to proportionally split the incident laser beam 1160 it receives from the semiconductor laser 1001. The laser beam 1160 is split into a deflected portion 1162 and a transmitted or non-deflected portion 1164. The non-deflected portion 1164 exits the packaged transmitter 1100 through an opening 1105 in the slanted window can 1101.

The deflected portion 1162 of the incident laser beam 1160 is deflected or reflected by the window 1102 to the photodiode 1002. The non-deflected portion 1164 of the incident laser beam 1160 is transmitted through the window 1102 outside of the packaged laser transmitter 1100. The deflected portion 1162 is used to monitor the output power in the non-deflected portion 1164 as they are proportional to each other. The laser driver circuitry 1180 in response to monitoring the power in the deflected portion 1162, adjusts the drive current 1186 provided to the semiconductor laser 1001 and the power of the laser beam 1160.

The photodiode 1002 may be directly attached to the header flange 1134 using a die attach epoxy 1150. The VCSEL 1001 may attach to a submount 1104 using a die attach epoxy 1150 as well. The submount 1104 is in turn die attached to the header flange 1134 using an epoxy such as the die attach epoxy 1150. The die attach epoxy 1150 is a conductor allowing an electrical contact to be made between surfaces. A bottom surface of the VCSEL 1001 and a contact pad of the submount 1104 may be electrically coupled together as a result. Similarly the die attach epoxy 1050 allows an electrical contact to be made between the photodiode 1002 and the header flange 1134.

The slanted window can 1101 is coupled to the header 1103 by a weld seal 1052. The glass window 1102 is attached to a back surface of the slant lid 1101 by the hermetic seal 1107.

The three leads 1116 are separately labeled 1116A, 1116B, and 1116C in FIG. 11B to describe the electrical connections between the packaged transmitter 1100 and the laser driving circuitry 1180. Lead 1116A couples to ground at one end and the header flange 1134 at an opposite end. A bond wire couples between the contact pad of the submount 1104 and the header flange 1134. In this manner, one of two terminals of the VCSEL 1001 electrically couples to the header flange 1134. Lead 1116B couples to a terminal of the photodiode 1002 at one end and a monitoring input of the laser driving circuitry 1180 at another end. A photo current 1184 of the photodiode 1002 couples to the laser driving circuitry 1180 through lead 1116B. The output of the laser driving circuitry 1180 couples to lead 1116C at one end and a second terminal of the VCSEL 1001 at an opposite end. The laser is driving circuitry 1180 provides a laser drive current 1186 to the VCSEL 1001 to turn it on and off through lead 1116C. The laser driving circuitry 1180 receives a data input 1182 in order to modulate data into the laser beam output of the packaged transmitter 1100. The pump laser 413 of the semiconductor laser 1001 is electrically modulated by the data input 1182.

When an external power source is provided to the packaged transmitter 1100 and the laser driving circuitry 1180, the VCSEL 1001 and photodiode 1002 can be powered up and be actively operating. In this case, the VCSEL 1001 generates a laser beam 1160 which is coupled into the glass window 1102. The glass window 1102 acts as a beam splitter and reflects a portion of the power of the laser beam 1160 towards the photodiode 1002 as indicated by the reflected beam 1162. The remaining power of the laser beam 1160 propagates through the glass window 1102 becoming the output laser beam 1164 of the packaged transmitter 1100. The optical power in the output laser beam 1164 is reduced from the power of the laser beam 1160 generated by the VCSEL 1001 by the amount of power in the reflected beam 1162.

The laser driving circuitry 1180 monitors the photo current 1184 of the photodiode 1002 in order to generate an appropriate laser drive current 1186 to automatically maintain a relatively constant power output in the output beam 1164 when the VCSEL 1001 is in an on state.

FIG. 11C illustrates a magnified cross-sectional view of a portion of an embodiment of the window 1102. The window includes a substrate material 1170, such as glass, quartz, or plastic. The substrate material 1170 may have a first material layer 1172 and/or a second material layer 1174 on either side or both sides of the substrate material 1170. That is, the window 1102 illustrated in FIG. 11C may include the substrate 1170 and the material layer 1172, the substrate 1170 and the material layer 1174, or the substrate 1170 and the materials layers 1172 and 1174. Each of the material layers 1172 and/or 1174 may be formed of a thickness proportional to the wavelengths of the light that desire reflecting and/or transmission. The material layers 1172 and/or 1174 may be standard dielectric coating materials to allow transmission and deflection of light in one direction while reflecting light in another direction. That is, material layer 1172 in conjunction with the substrate layer 1170 and the material layer 1174 may provide beam splitting to light exiting from the laser beam. The material layer 1174 may have an antireflection coating to keep light outside the package from entering into the package.

In beam splitting, the material layer 1172 and/or the material layer 1174 deflects a portion of the light beam 1160 from the laser 1001 into the monitoring light beam 1162 and allows transmission through the window 1102 of the remaining portion as the output light beam 1164. The monitoring light beam 1162 is directed towards the photo diode 1002. To avoid incoming light interfering with the light beam 1160 and/or the monitoring light beam 1162, the material layer 1174 may be an antireflective coating. In this case, the material layer 1174 provides reflection for an incoming light beam 1166 into the reflected light beam 1166'.

FIG. 11D illustrates a magnified cross-sectional view of a portion of another embodiment of the window, window 1102'. The window 1102' includes the substrate material 1170, such as glass, plastic quartz or other optical material. The window 1102' further includes a plurality of layers on one or both sides of the substrate 1170. A first plurality of layers may be alternating pairs of material layers 1172a-1172n on an outer side of the substrate 1170. A second plurality of layers may be alternating pairs of material layers 1174a-1174n on an inner side the substrate material 1170. The first plurality and the second plurality need not be alternating pairs of material layers but multiple layers. That is, the window 1102' illustrated in FIG. 11D may include the substrate 1170 and the first plurality of pairs of alternating material layers 1172a-1172n, the substrate 1170 and the plurality of alternating pairs of material layers 1174a-1174n, or the substrate 1170 and the plurality of alternating pairs of material layers 1172a-1172n and 1174a-1174n on each respective side of the substrate.

Each of the plurality of material layers 1172a-1172n and/or 1174a-1174n may be formed of a thickness proportional to the wavelengths of the light that desire beam splitting. The alternating pairs of material layers 1172a-1172n and/or 1174a–1174n may be standard dielectric coating materials to allow beam splitting.

The plurality of material layers 1172a-1172n and/or the plurality of material layers 1174a-1174n provide reflection for an incoming light beam 1166 into the reflected light beam 1166'. The plurality of alternating pairs of material layers 1172a-1172n and or the plurality of alternating pairs of material layers 1174a–1174n allow the light beam 1160 from the semiconductor laser to be power split into a transmission portion 1164' and a deflection portion 1162' as illustrated.

Referring now to FIG. 12, an optoelectronic transmitter module 1200 is illustrated. The optoelectronic transmitter module 1200 includes one or more laser diode transmitters 1202A and 1202B. The optoelectronic transmitter module 1200 couples to one or more optical fibers 1204. The one or more optical fibers 1204 may be single mode or multi mode optical fibers. The one or more laser diode transmitters 1202A and 1202B, include the optical subassembly having an integrated optically pumped VCSEL such as those described and illustrated herein. The laser diode transmitters 1202A and 1202B may be a packaged laser diode transmitter such as the packaged laser diode transmitter 1100 illustrated in FIG. 11.

Referring now to FIG. 13, an optoelectronic transceiver module 1300 is illustrated. The optoelectronic transceiver module 1300 includes one or more laser diode transmitters 1202 and one or more photodetectors 1302. The optoelectronic transceiver module 1300 couples to one or more optical fibers 1304. The one or more optical fibers 1304 may be single mode or multi mode optical fibers. The one or more laser diode transmitters 1202, include the optical subassembly having an integrated optically pumped VCSEL such as those described and illustrated herein. The laser diode transmitter 1202 may be a packaged laser diode transmitter such as the packaged laser diode transmitter 1100 illustrated in FIG. 11.

An optoelectronic module can also referred to as a fiber channel module, an FDDI module, a fiber optic module, a fiber optic modem, or a physical layer device. Additionally, an optoelectronic module can couple to a host printed circuit board in a number of ways. The optoelectronic module can be fixed or replaceable. A fixed optoelectronic module has pins which are typically soldered to the host printed circuit board. The replaceable optoelectronic module typically has a connector with pins or traces which couple to a connector or socket of the host printed circuit board.

Referring now to FIG. 14, an optoelectronic system 1400 is illustrated. The optoelectronic system 1400 can be utilized in an optical communication system, optical networking system, or other system where transfer of information is desirable over optical fibers by means of light or photons. The optoelectronic system 1400 includes one or more optoelectronic modules 1200 or 1300 or a combination thereof. The optoelectronic system 1400 couples to one or more optical fibers. The one or more optical fibers may be single mode or multi mode optical fibers.

Referring now to FIG. 15A, a typical optical data link of an optoelectronic system is illustrated. An optical data link includes an optical transceiver 1500A, an optical transceiver 1500B, and one or more fiber optic cables 1502. The one or more fiber optic cables 1502 may be single mode or multi mode optical fibers. Each of the optical transceivers 1500A and 1500B interfaces to the one or more fiber optic cables 1502. Each of the fiber optic cables 1502 includes a first plug 1504A and a second plug 1504B. Each of the first plug and the second plug may be a simplex plug or a duplex plug of SC, LC, MTRJ, or other know fiber optic plug standard.

The typical block functional elements of the optical transceivers 1500A includes a nose or fiber optic receptacle 1510, an optical block 1512, opto-electronics 1514, transmit and receive electronics 1516, and pins, terminals, pads, or connectors 1518. The nose or fiber optic receptacle 1510 receives the fiber optic plug 1504A. The optical transceiver 1500A may couple to a host system 1506. In order to do so the host system 1506 may include holes, terminals, pads, or connectors 1520 to couple to the pins, terminals, pads, or connectors 1518 respectfully of the optical transceivers 1500A. The optical block 1512 is for coupling light between the opto-electronics 1514 and the one or more optical fibers 1502. The fiber optical receptacle 1510 holds the plug 1504A in alignment with the optical block. The optoelectronics 1514 transduces between electrical signals (e.g., voltage or current) and optical signals (e.g., light or photons). The transmit and receive electronics 1516 appropriately controls the opto-electronics 1514 to generate lights signals or receive light signals as well as transceive electrical signals through the pins, terminals, pads, or connectors 1518. The pins, terminals, pads, or connectors 1518 of the optical transceiver are for coupling to the host system 1506.

Referring now to FIG. 15B, a fiber to the home (FTTH) system is illustrated. The optical fiber 1502 couples to the optical transceiver 1500A within the house 1530. The optical transceiver 1500B at the other end of the optical fiber 1502 is part of the optical network of the optical service provider (OSP).

Referring now to FIG. 15C, a fiber to the curb (FTTC) system is illustrated. The optical fiber 1502 couples to the optical transceiver 1500A at the curb 1531. From the optical transceiver 1500A at the curb 1531, an electrical connection 1532 is made into the house 1530.

For access network deployment, such as the fiber to the home (FTTH) system or fiber to the curb (FTTC) system, it is desirable to have a single mode optical transceiver coupling to a single mode optical fiber to achieve greater distances.

The preferred embodiments of the invention are thus described. While the invention has been described in particular embodiments, the invention should not be construed as limited by such embodiments, but rather construed according to the claims that follow below.

What is claimed is:

1. A monolithic integrated optically pumped vertical cavity surface emitting laser comprising:
 an electrically pumped pump laser including
  an edge emitting laser having a horizontal laser cavity with a mirror end and an output end opposite the mirror end, the edge emitting laser to emit a pump laser beam having a relatively short wavelength from the output end, and
  a light redirecting means integrated with the edge emitting laser, the light redirecting means to deflect the pump laser beam into a redirected pump laser beam;
 a bond having a first end joined to a surface of the electrically pumped pump laser; and
 an optically pumped vertical cavity surface emitting laser having a surface joined to a second end of the bond, the optically pumped vertical cavity surface emitting laser to receive the redirected pump laser beam having the relatively short wavelength and to generate an output laser beam having a relatively long wavelength in response to the redirected pump laser beam.

2. The monolithic integrated optically pumped vertical cavity surface emitting laser of claim 1 wherein, the electrically pumped pump laser is electrically modulated to modulate a signal over the redirected pump laser beam, and in response the electrical modulation of the pump laser, the optically pumped vertical cavity surface emitting laser being optically modulated to modulate the signal over the output laser beam.

3. The monolithic integrated optically pumped vertical cavity surface emitting laser of claim 1 wherein, the output laser beam having a wavelength over a wavelength range of 600 nanometers to 1150 nanometers.

4. The monolithic integrated optically pumped vertical cavity surface emitting laser of claim 1 wherein, the output laser beam having a wavelength over a wavelength range of 1200 nanometers to 1750 nanometers.

5. The monolithic integrated optically pumped vertical cavity surface emitting laser of claim 1 wherein,
 the edge emitting laser includes,
  an active region having one or more quantum well structures, and,
  a mirror at the mirror end to reflect photons back into the active region.

6. The monolithic integrated optically pumped vertical cavity surface emitting laser of claim 1 wherein, the light redirecting means is a facet substantially aligned at a forty-five degree angle to deflect the pump laser beam into the redirected pump laser beam.

7. A wavelength tunable integrated optically pumped vertical cavity surface emitting laser comprising:
an electrically pumped pump laser including
an edge emitting laser to be electrically pumped to emit a pump laser beam having a relatively short wavelength, and
an angled mirror integrated with the edge emitting laser, the angled mirror to deflect the pump laser beam into a redirected pump laser beam; and
a tunable optically pumped vertical cavity surface emitting laser joined to the electrically pumped pump laser, the tunable optically pumped vertical cavity surface emitting laser having a tunable resonant cavity responsive to a wavelength tuning signal, the tunable optically pumped vertical cavity surface emitting laser to receive the redirected pump laser beam having the relatively short wavelength and to generate an output laser beam having a wavelength responsive to the redirected pump laser beam and the wavelength tuning signal.

8. The wavelength tunable integrated optically pumped vertical cavity surface emitting laser of claim 7 further comprising:
a bond to join the tunable optically pumped vertical cavity surface emitting laser and the electrically pumped pump laser together.

9. The wavelength tunable integrated optically pumped vertical cavity surface emitting laser of claim 8 wherein, the bond further to hermetically seal the electrically pumped pump laser.

10. The wavelength tunable integrated optically pumped vertical cavity surface emitting laser of claim 9 wherein, the bond is a solder wall to join the tunable optically pumped vertical cavity surface emitting laser and the electrically pumped pump laser together.

11. The wavelength tunable integrated optically pumped vertical cavity surface emitting laser of claim 8 wherein, the bond is a plurality of solder pumps to join the tunable optically pumped vertical cavity surface emitting laser and the electrically pumped pump laser together.

12. A multiple wavelength optically pumped vertical cavity surface emitting laser array comprising:
an electrically pumped pump laser including
an edge emitting laser to be electrically pumped to emit a pump laser beam having a relatively short wavelength, and
an angled mirror aligned with the edge emitting laser to receive the pump laser beam, the angled mirror to deflect the pump laser beam into a redirected pump laser beam; and
an optically pumped vertical cavity surface emitting laser array joined to the electrically pumped pump laser, the optically pumped vertical cavity surface emitting laser array having a plurality of optically pumped vertical cavity surface emitting laser elements to generate a plurality of output laser beams, the optically pumped vertical cavity surface emitting laser array to receive the redirected pump laser beam having the relatively short wavelength to generate the plurality of output laser beams, each of the plurality of optically pumped vertical cavity surface emitting laser elements to generate one of the plurality of output laser beams having a different wavelength from the next in response to the redirected pump laser beam.

13. The multiple wavelength optically pumped vertical cavity surface emitting laser array of claim 12 further comprising:
a bond to join the optically pumped vertical cavity surface emitting laser array and the electrically pumped pump laser together.

14. The multiple wavelength optically pumped vertical cavity surface emitting laser array of claim 13, wherein, the bond further to hermetically seal the electrically pumped pump laser.

15. The multiple wavelength optically pumped vertical cavity surface emitting laser array of claim 14 wherein, the bond is a solder wall to join the tunable optically pumped vertical cavity surface emitting laser and the electrically pumped pump laser together.

16. The multiple wavelength optically pumped vertical cavity surface emitting laser array of claim 13 wherein, the bond is a plurality of solder pumps to join the tunable optically pumped vertical cavity surface emitting laser and the electrically pumped pump laser together.

17. The multiple wavelength optically pumped vertical cavity surface emitting laser array of claim 12 wherein, the optically pumped vertical cavity surface emitting laser array includes
a lower DBR mirror,
an active region portion including a plurality of active region elements each having a different thickness to generate the plurality of output laser beams each having the different wavelength from the next in response to the redirected pump laser beam, and
an upper DBR mirror portion including a plurality of upper DBR mirror elements.

18. The multiple wavelength optically pumped vertical cavity surface emitting laser array of claim 12 wherein, each of the plurality of optically pumped vertical cavity surface emitting laser elements includes
a lower DBR mirror element,
an active region element coupled to a portion of the lower DBR mirror, the active region element having a thickness differing from the next active region element to generate the different wavelength of the output laser beam from the next in response to the redirected pump laser beam, and
an upper DBR mirror element coupled to the active region element.

19. The multiple wavelength optically pumped vertical cavity surface emitting laser array of claim 18 wherein, the lower DBR mirror element also has a thickness differing from the next lower DBR mirror element to generate the different wavelength of the output laser beam from the next in response to the redirected pump laser beam.

20. The multiple wavelength optically pumped vertical cavity surface emitting laser array of claim 18 wherein, each of the plurality of optically pumped vertical cavity surface emitting laser elements further includes an index guide in the active region element around the output port.

21. The multiple wavelength optically pumped vertical cavity surface emitting laser array of claim 12 wherein, each of the plurality of optically pumped vertical cavity surface emitting laser elements includes
a portion of a lower DBR mirror,
an active region element coupled to the portion of the lower DBR mirror, the active region element having a thickness differing from the next active region element to generate the different wavelength of the output laser beam from the next in response to the redirected pump laser beam, and
an upper DBR mirror element coupled to the active region element.

22. The multiple wavelength optically pumped vertical cavity surface emitting laser array of claim 21 wherein, each of the plurality of optically pumped vertical cavity surface emitting laser elements further includes an index guide in the active region element around the output port.

23. An integrated optically pumped vertical cavity surface emitting laser comprising:

a surface emitting pump laser with a bottom surface, the surface emitting pump laser having an edge emitting laser integrated with a beam steering element, the edge emitting laser to be electrically pumped to generate a pump laser beam having a first wavelength, the pump laser beam emitted from an end of the edge emitting laser substantially parallel with the bottom surface, the beam steering element aligned at an angle with the edge emitting laser to redirect the pump laser beam into a redirected pump laser beam, the redirected pump laser beam having the first wavelength and emitted from the surface emitting pump laser substantially perpendicular with a top surface thereof, a bond coupled to the top surface of the surface emitting pump laser, and a long wavelength vertical cavity surface emitting laser coupled to the bond in alignment with the surface emitting pump laser to receive the redirected pump laser beam, the long wavelength vertical cavity surface emitting laser optically pumped by the redirected pump laser beam to generate a laser beam output, the laser beam output of the long wavelength vertical cavity surface emitting laser having a second wavelength longer than the first wavelength of the redirected pump laser beam of the surface emitting pump laser.

24. The integrated optically pumped vertical cavity surface emitting laser of claim 23, wherein the bond is a plurality of solder bonds or a solder wall.

25. The integrated optically pumped vertical cavity surface emitting laser of claim 23, wherein the angle of alignment between the edge emitting laser and the beam steering element is substantially forty five degrees.

26. The integrated optically pumped vertical cavity surface emitting laser of claim 23 wherein, the beam steering element is a mirror having a reflecting surface.

27. An integrated optically pumped vertical cavity surface emitting laser comprising:

a surface emitting pump laser having an edge emitting laser integrated with a mirror, the edge emitting laser to be electrically pumped to generate a pump laser beam having a first wavelength from an end, the mirror aligned at an angle with the edge emitting laser to deflect the pump laser beam into a redirected pump laser beam, the redirected pump laser beam having the first wavelength, a long wavelength vertical cavity surface emitting laser optically pumped by the redirected pump laser beam to generate a laser beam output, the laser beam output of the long wavelength vertical cavity surface emitting laser having a second wavelength longer than the first wavelength of the redirected pump laser beam of the surface emitting pump laser, and a solder wall coupled in alignment, between and to a surface of the surface emitting pump laser and a surface of the long wavelength vertical cavity surface emitting laser to integrate them together, the solder wall having an opening to allow the redirected pump laser beam to pass through from the surface emitting pump laser into the long wavelength vertical cavity surface emitting laser.

28. The integrated optically pumped vertical cavity surface emitting laser of claim 22, wherein the opening in the solder wall is a rectangular opening and the perimeter of the solder wall forms a rectangle around the surface emitting pump laser.

29. The integrated optically pumped vertical cavity surface emitting laser of claim 27 wherein, the solder wall hermetically seals around the surface emitting pump laser.

30. The integrated optically pumped vertical cavity surface emitting laser of claim 27 wherein, the laser beam output of the long wavelength vertical cavity surface emitting laser having the second wavelength is a single mode laser beam output.

* * * * *

UNITED STATES PATENT AND TRADEMARK OFFICE
CERTIFICATE OF CORRECTION

PATENT NO.   : 6,940,885 B1
DATED        : September 6, 2005
INVENTOR(S)  : Cheng et al.

It is certified that error appears in the above-identified patent and that said Letters Patent is hereby corrected as shown below:

<u>Column 1,</u>
Line 33, "preferred for" should read -- preferred component for --.

Signed and Sealed this

Thirty-first Day of January, 2006

JON W. DUDAS
*Director of the United States Patent and Trademark Office*